US008015389B2

(12) United States Patent
Sato et al.

(10) Patent No.: US 8,015,389 B2
(45) Date of Patent: Sep. 6, 2011

(54) MEMORY DEVICE, MEMORY CONTROLLER AND MEMORY SYSTEM

(75) Inventors: Takahiko Sato, Kawasaki (JP); Toshiya Uchida, Kawasaki (JP); Tatsuya Kanda, Kawasaki (JP); Tetsuo Miyamoto, Kawasaki (JP); Satoru Shirakawa, Kawasaki (JP); Yoshinobu Yamamoto, Kawasaki (JP); Tatsushi Otsuka, Kawasaki (JP); Hidenaga Takahashi, Kawasaki (JP); Masanori Kurita, Kawasaki (JP); Shinnosuke Kamata, Kawasaki (JP); Ayako Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 84 days.

(21) Appl. No.: 12/000,953

(22) Filed: Dec. 19, 2007

(65) Prior Publication Data
US 2009/0027988 A1 Jan. 29, 2009

Related U.S. Application Data

(62) Division of application No. 11/698,286, filed on Jan. 26, 2007, now Pat. No. 7,814,294.

(30) Foreign Application Priority Data

Dec. 22, 2006 (JP) .................................. 2006-345415

(51) Int. Cl.
G06F 12/06 (2006.01)
(52) U.S. Cl. .......................... 711/220; 711/206; 711/217
(58) Field of Classification Search .................. None
See application file for complete search history.

(56) References Cited

U.S. PATENT DOCUMENTS

| 5,687,132 | A  | * | 11/1997 | Rao ........................ 365/230.03 |
| 6,005,592 | A  |   | 12/1999 | Koizumi et al. |
| 6,314,048 | B1 |   | 11/2001 | Ishikawa |
| 6,611,260 | B1 |   | 8/2003  | Greenberg et al. |
| 6,941,443 | B2 | * | 9/2005  | Isomura et al. ............... 711/209 |
| 7,080,216 | B2 | * | 7/2006  | Barlow et al. ................. 711/154 |
| 7,729,200 | B2 | * | 6/2010  | Ikeda et al. ................ 365/238.5 |

FOREIGN PATENT DOCUMENTS

| JP | 08-180675   |   | 7/1996  |
| JP | 11-167518   | A | 6/1999  |
| JP | 2001-312885 |   | 11/2001 |

* cited by examiner

Primary Examiner — Gary J Portka
(74) Attorney, Agent, or Firm — Arent Fox LLP

(57) ABSTRACT

An image memory, image memory system, and memory controller that are capable of efficiently accessing a rectangular area of two-dimensionally arrayed data are provided. The memory device has: a memory cell array that has a plurality of memory unit areas, each of which is selected by addresses; a plurality of input/output terminals; and an input/output unit provided between the memory cell array and the plurality of input/output terminals. Each of the memory unit areas stores therein data of a plurality of bytes or bits corresponding to the plurality of input/output terminals respectively, and the memory cell array and the input/output unit access a plurality of bytes or bits stored in a first memory unit area corresponding to the input address and in a second memory unit area adjacent to the first memory unit on the basis of the input address and combination information of the bytes or bits in response to a first operation code, and then, from the plurality of bytes or bits within the accessed first and second memory unit areas, associate a combination of the plurality of bytes or bits based on the combination information, with the plurality of input/output terminals.

4 Claims, 65 Drawing Sheets

FIG.1 Memory Mapping

FIG.2
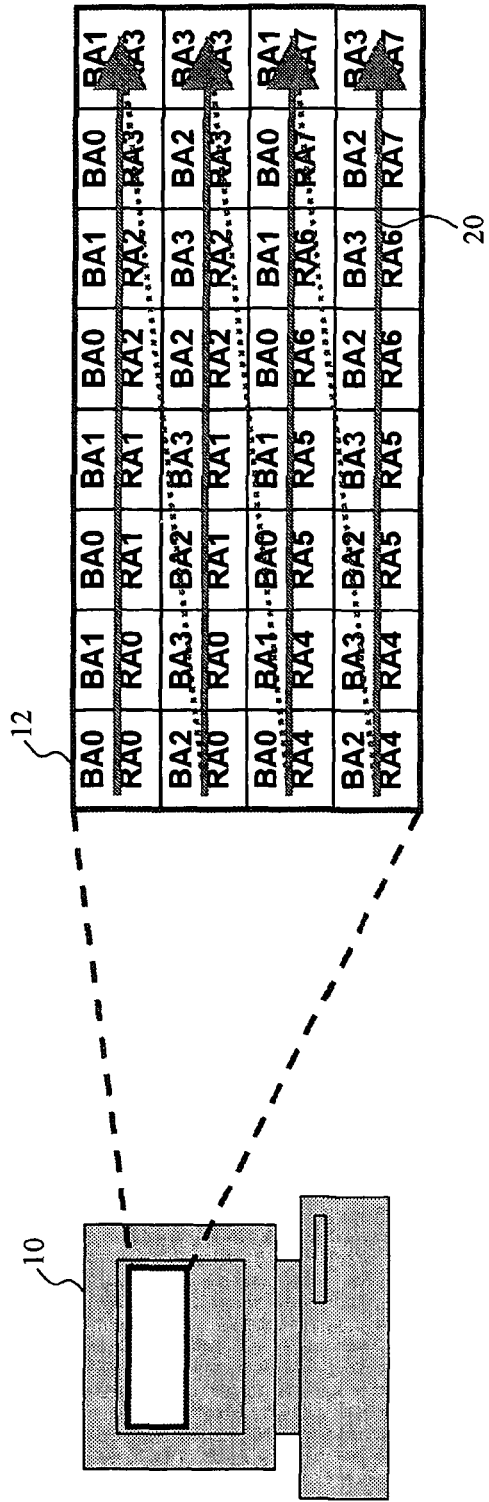
(A) HORIZONTAL ACCESS
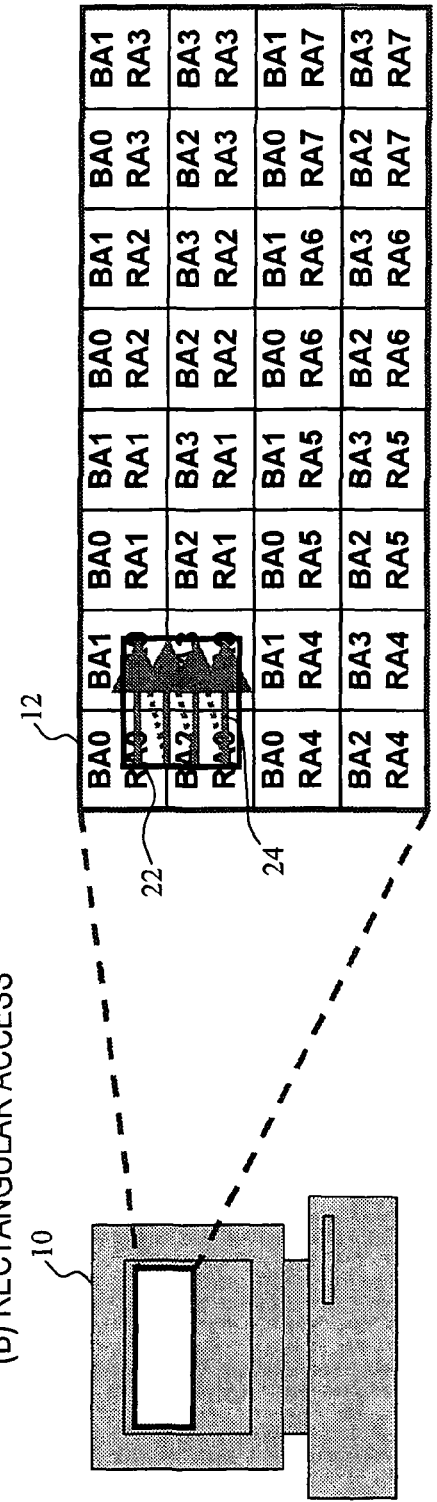
(B) RECTANGULAR ACCESS

FIG.4

(A) HORIZONTAL ACCESS (B) RECTANGULAR ACCESS

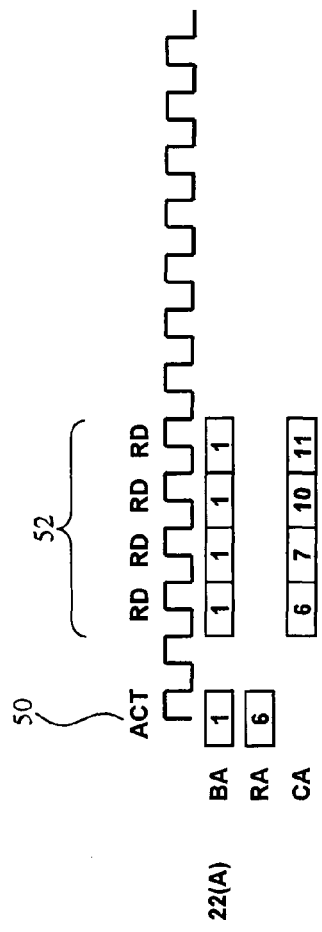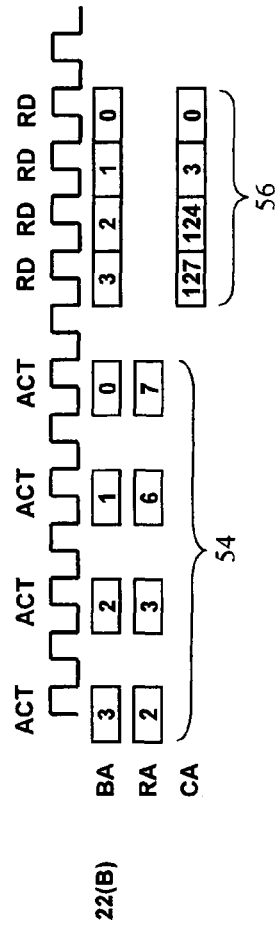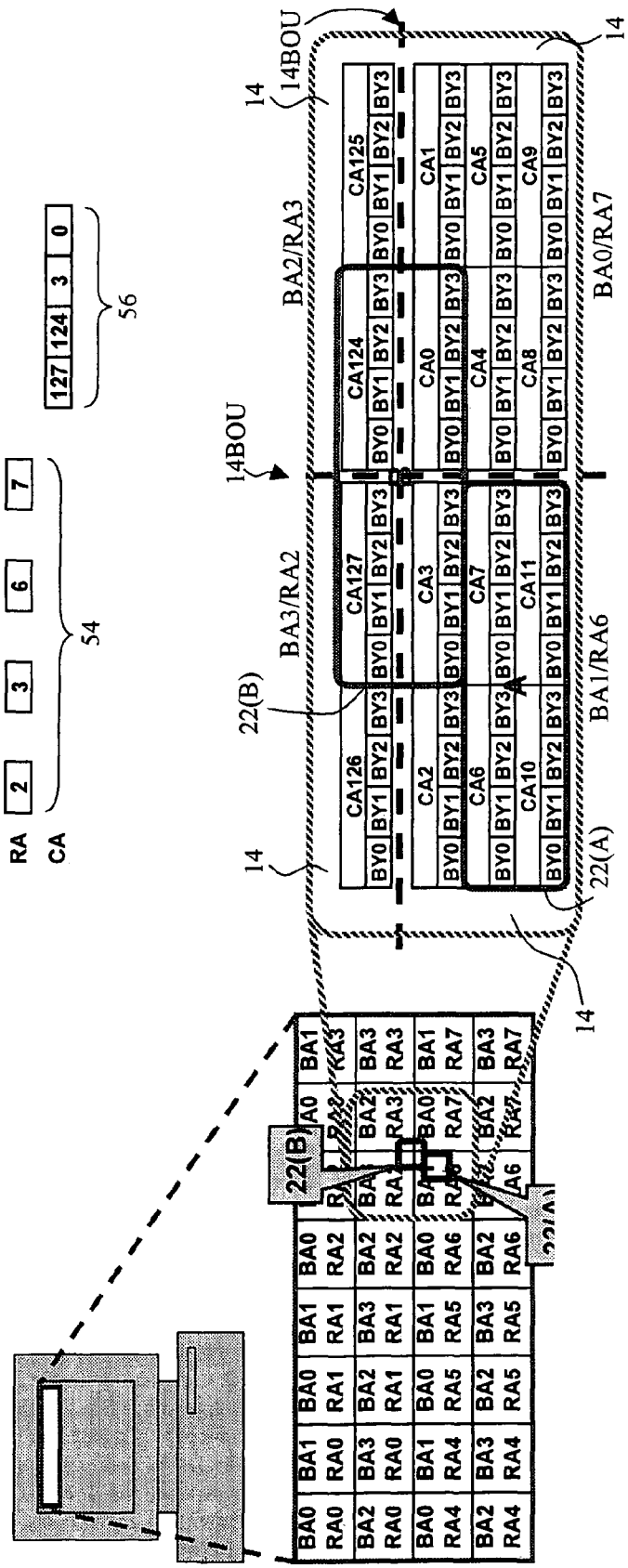
FIG.5

FIG.10
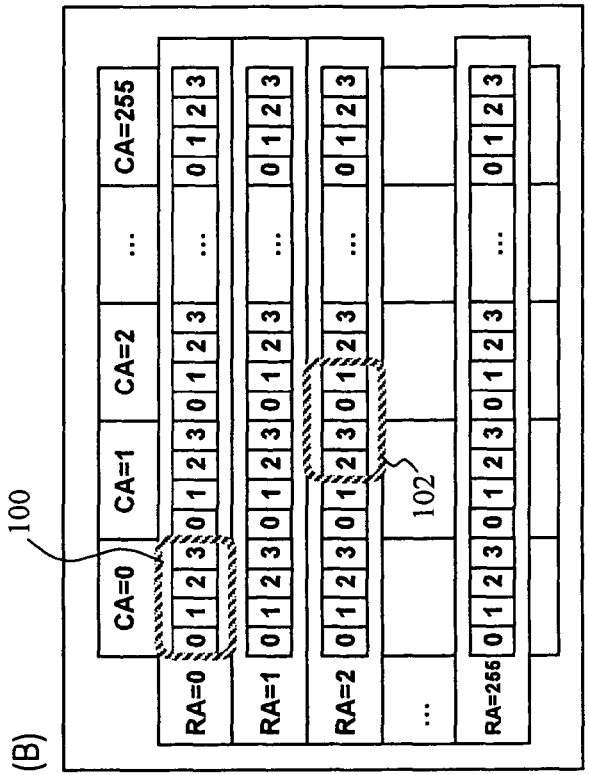
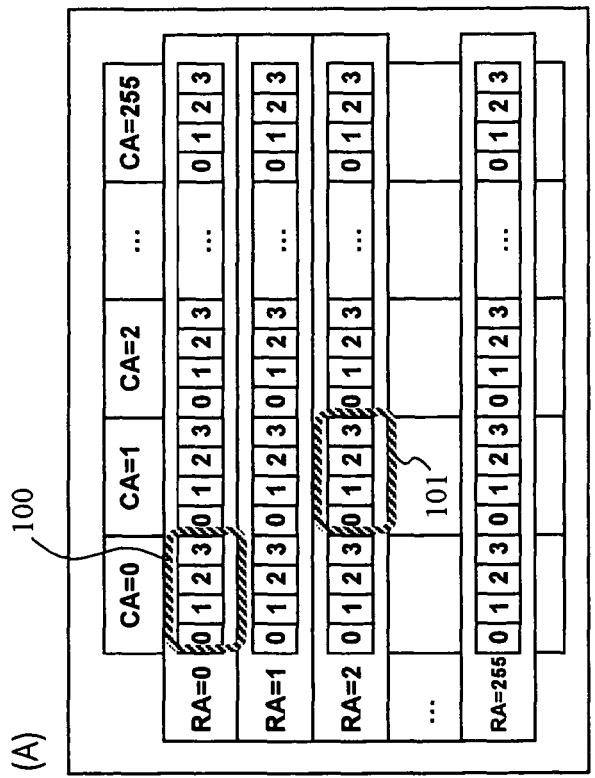

FIG.15
(A) ACCESS LUMINANCE (EVEN-NUMBERED DQ) ONLY
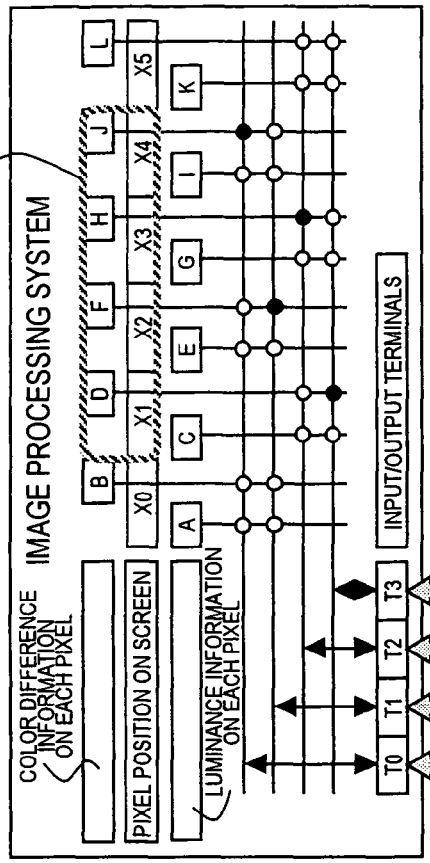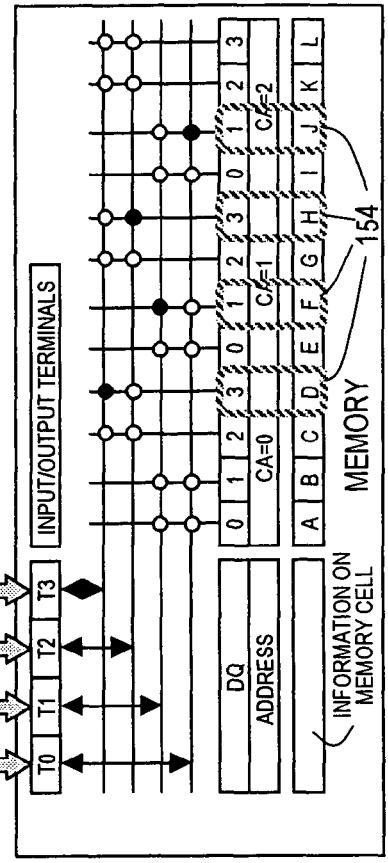
(B) ACCESS COLOR DIFFERENCE (ODD-NUMBERED DQ) ONLY
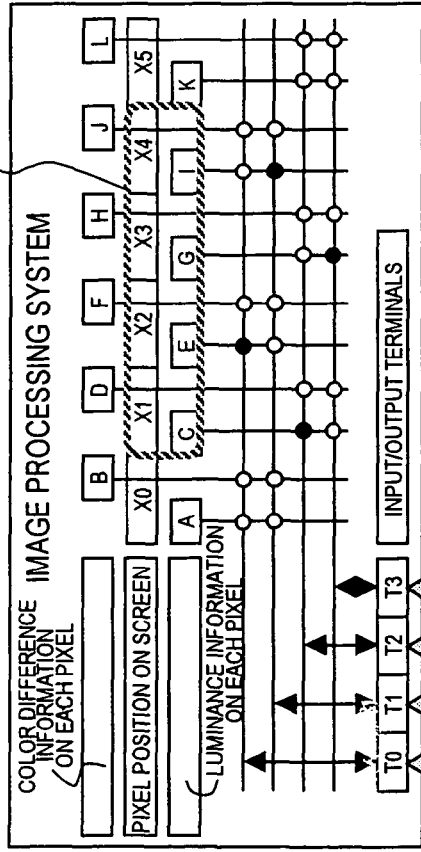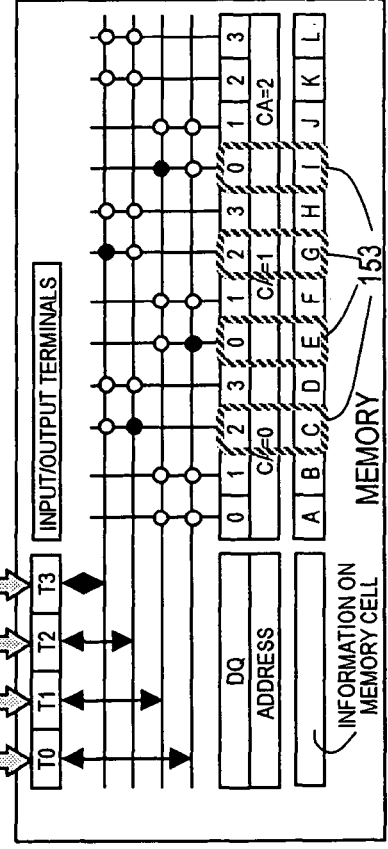

FIG. 23
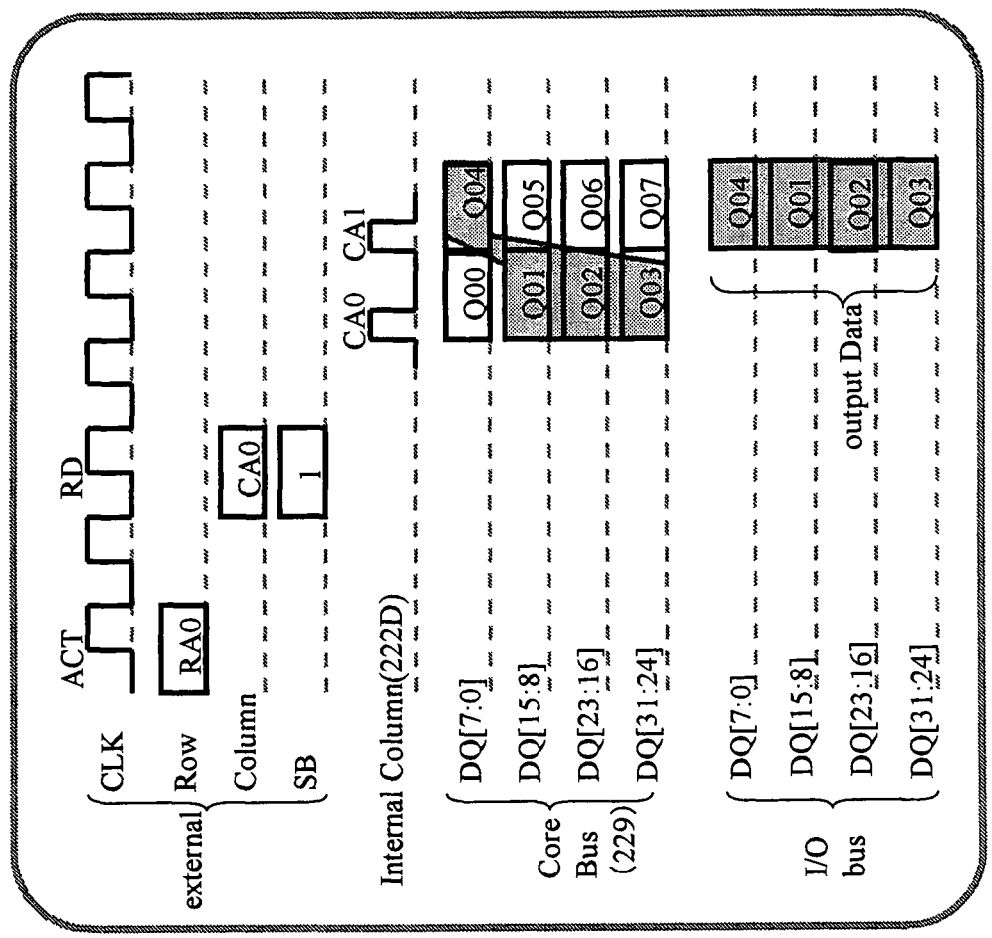
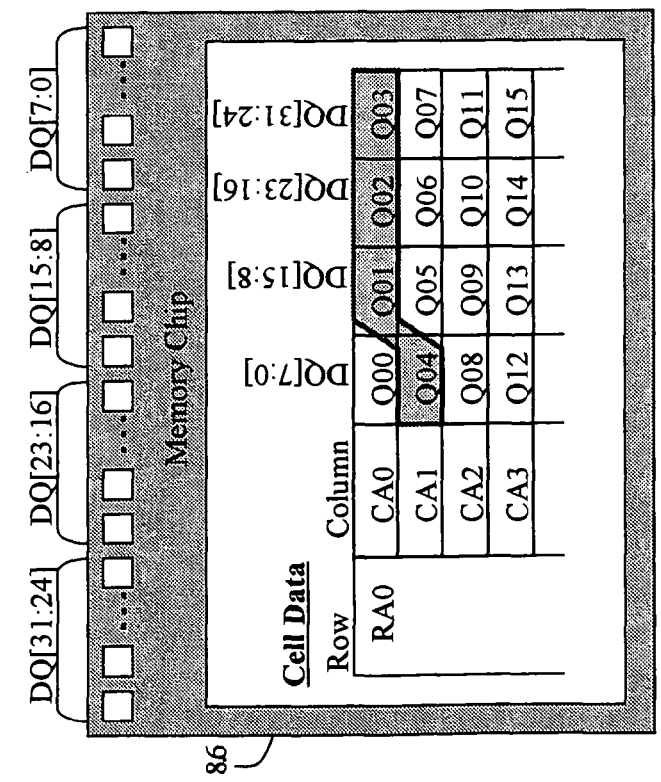

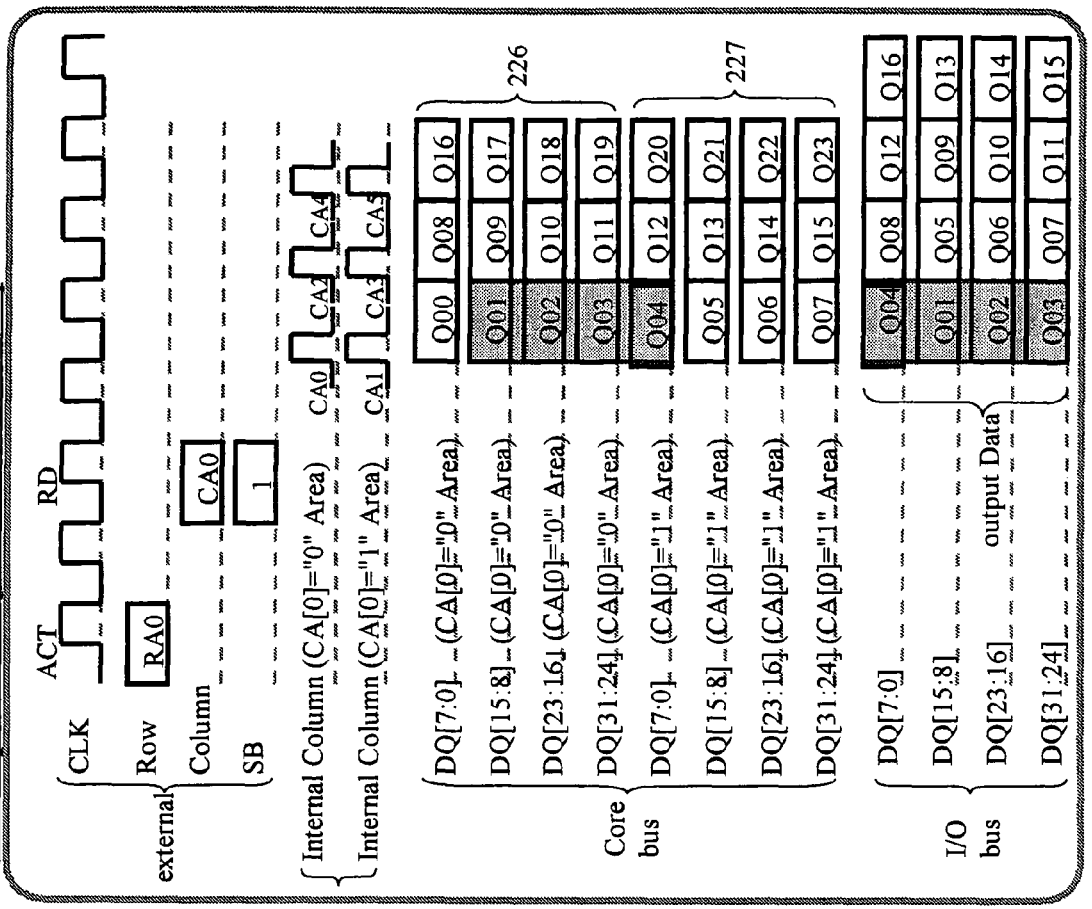
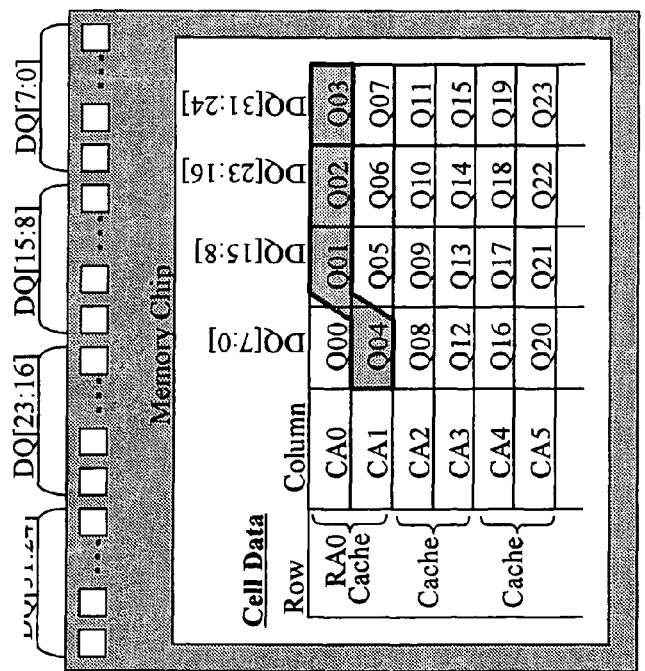
FIG.25

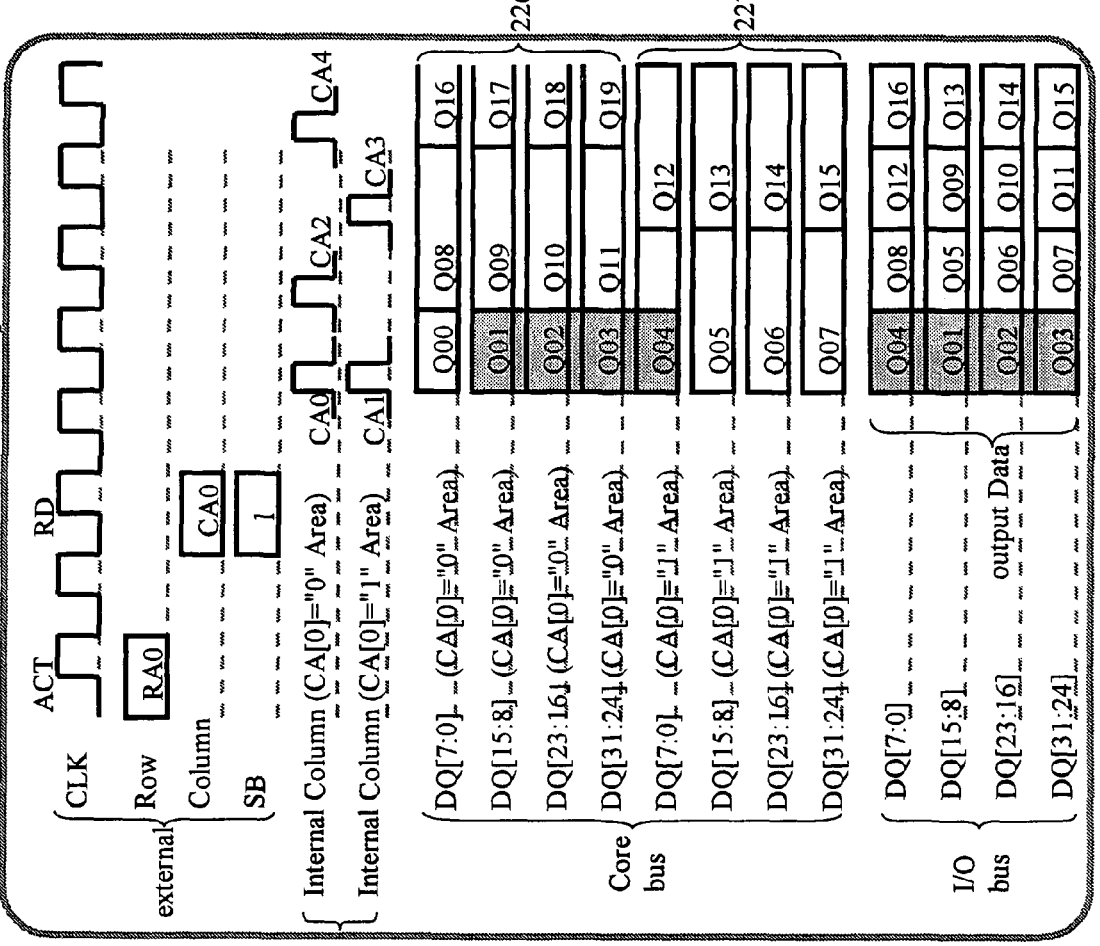
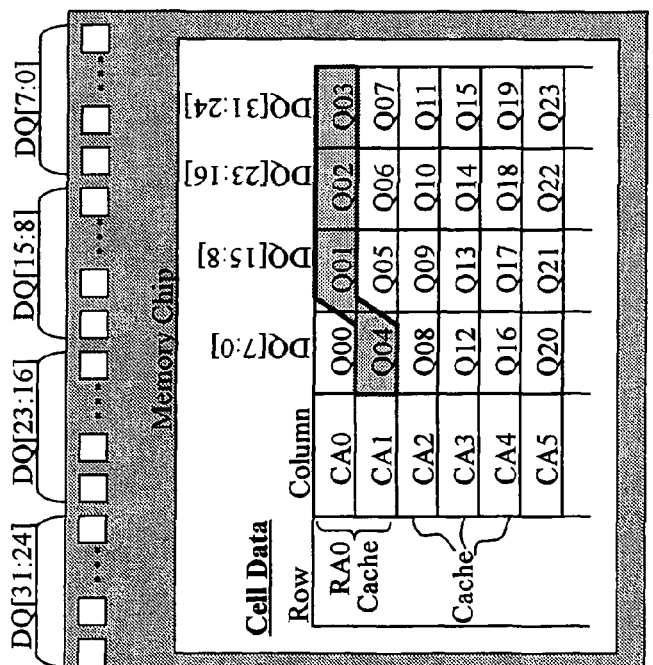
FIG.26

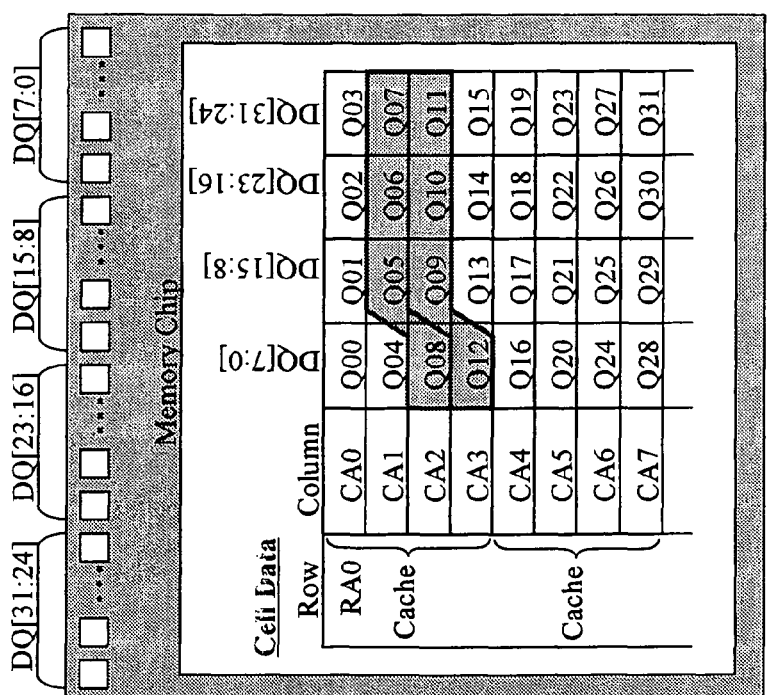
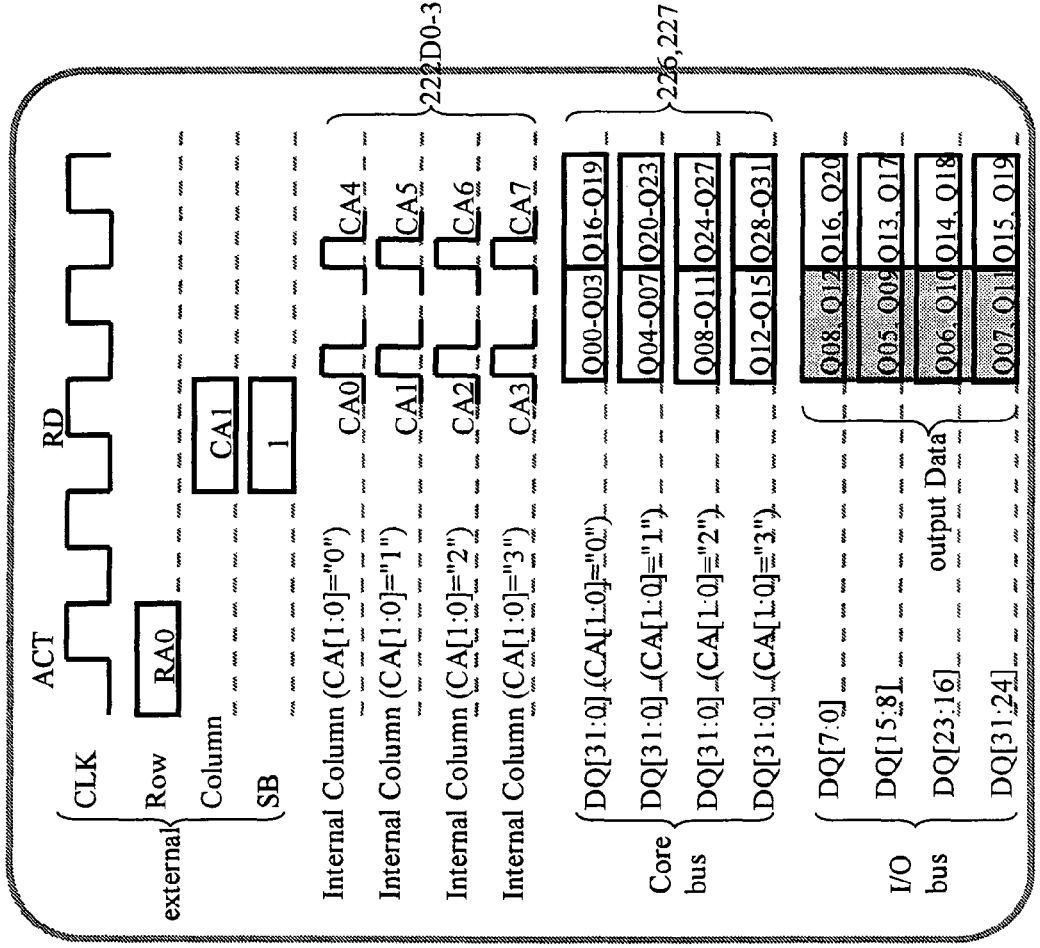
FIG.27

FIG.28
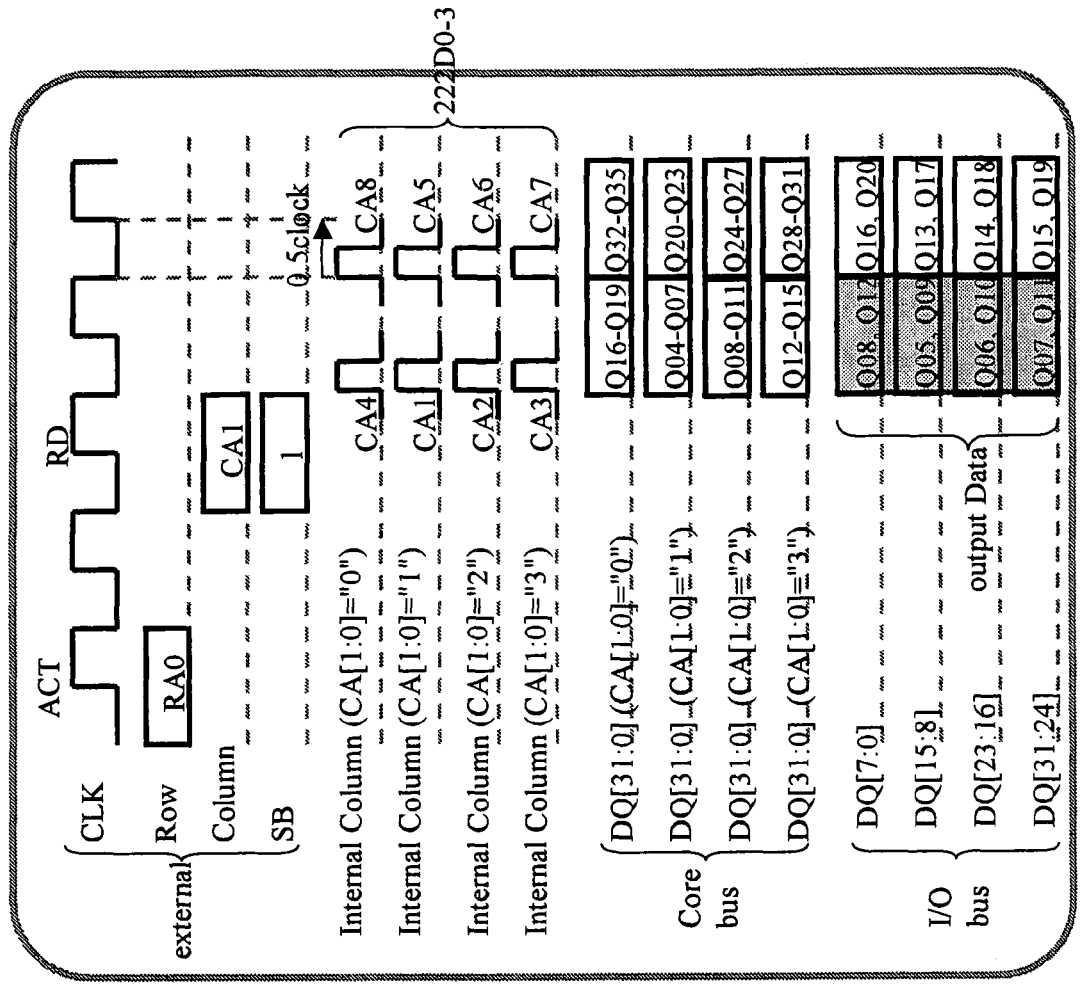
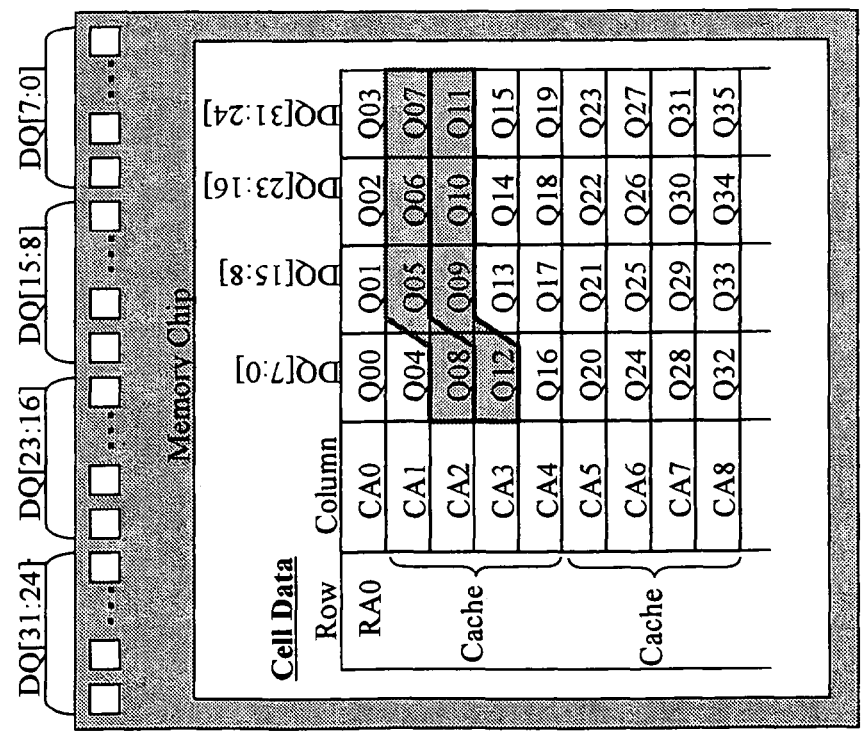

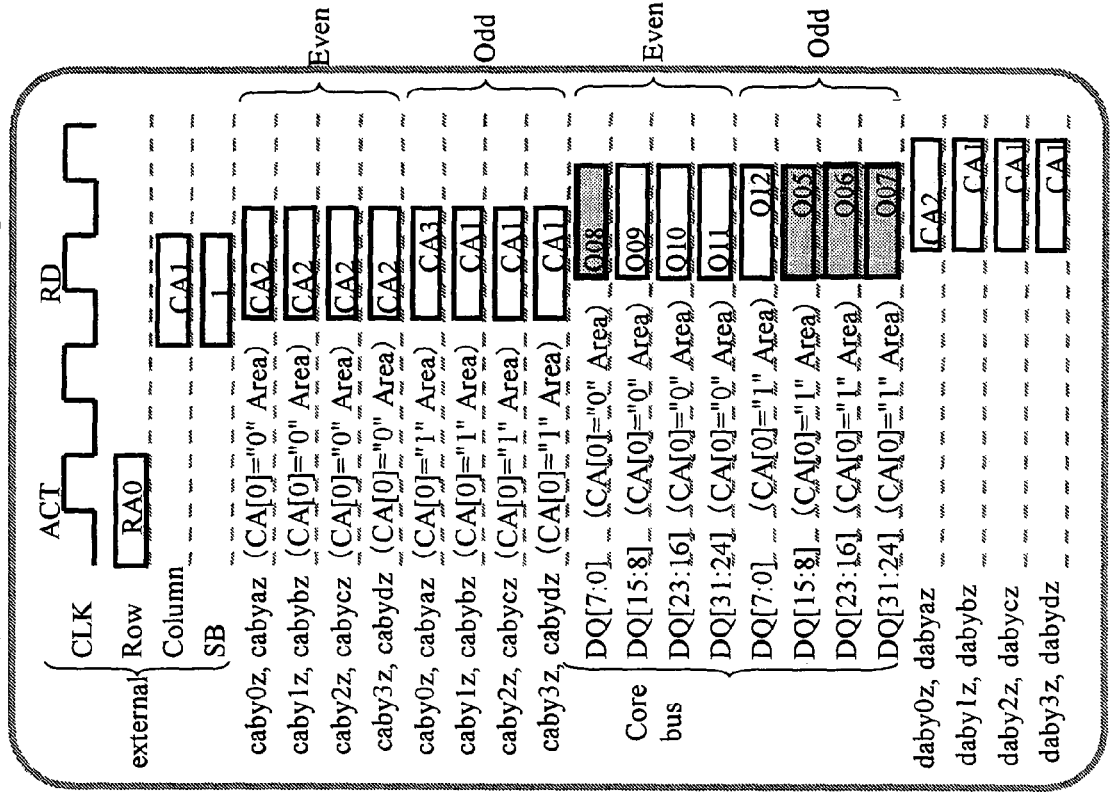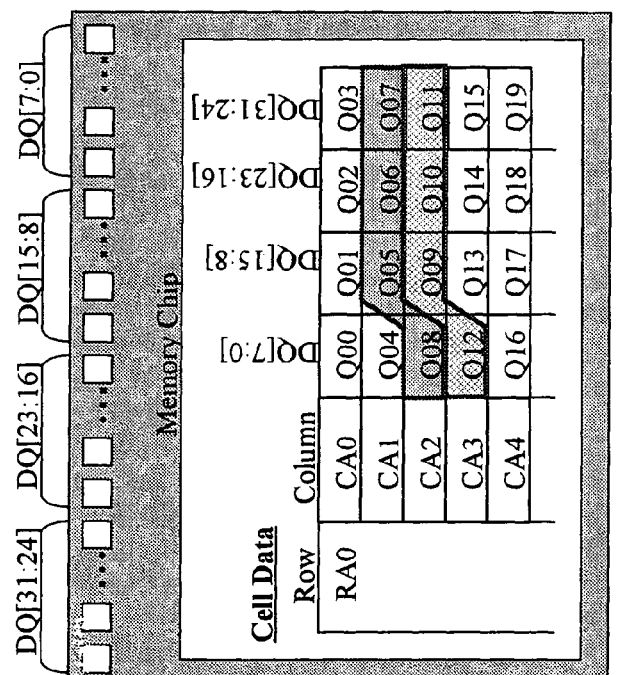
FIG.38

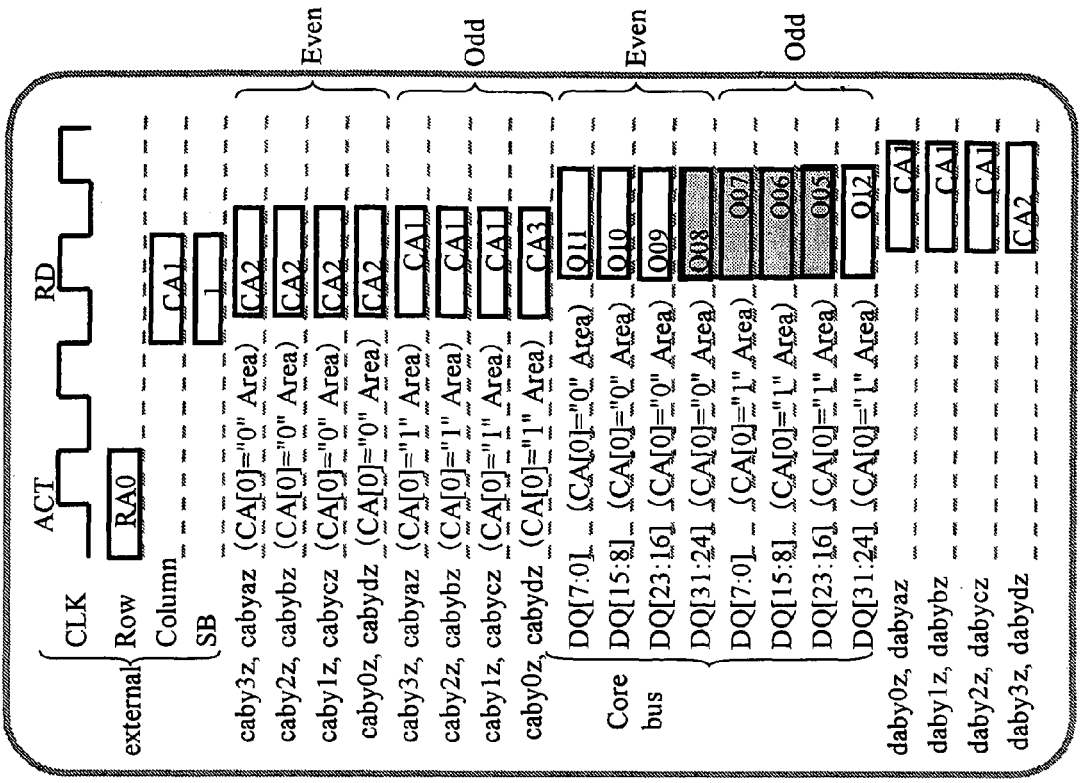
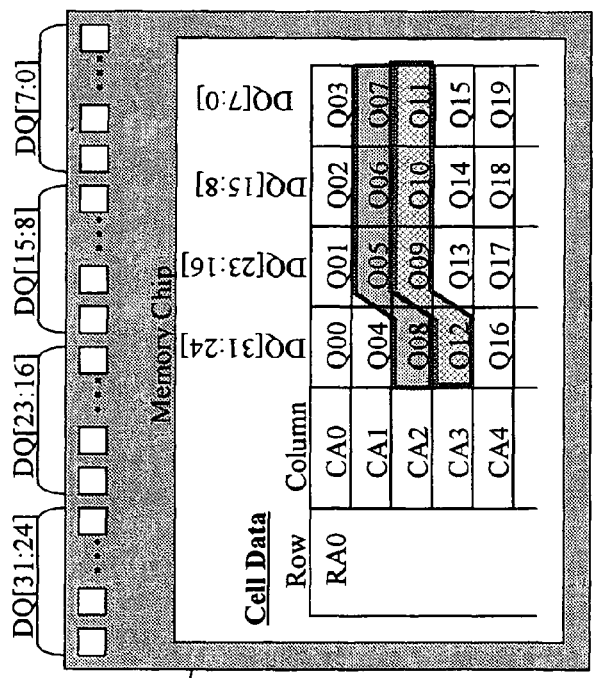
FIG.39

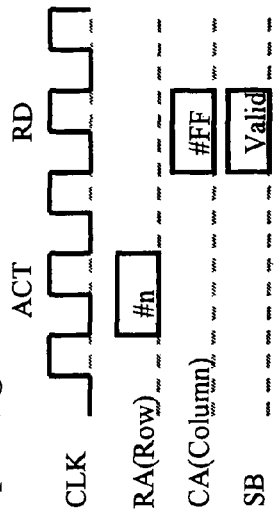
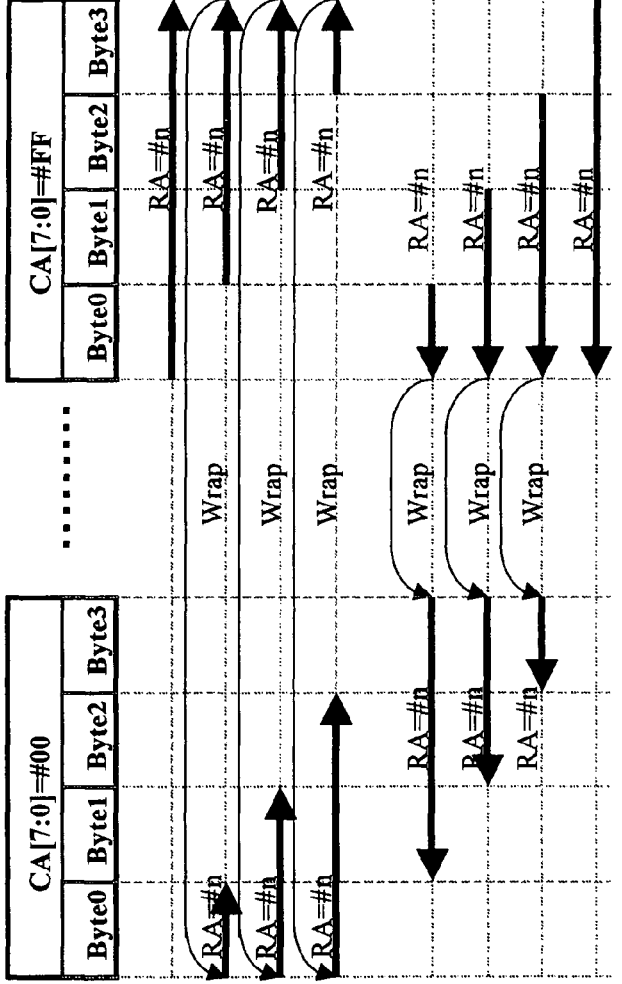
FIG.45

FIG.46
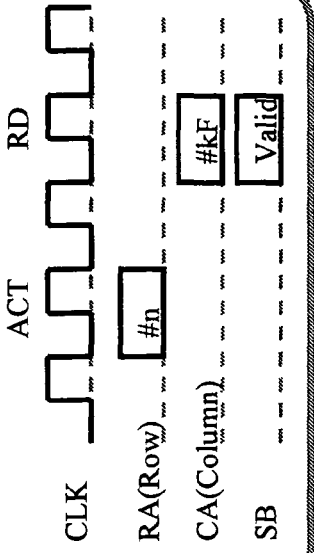
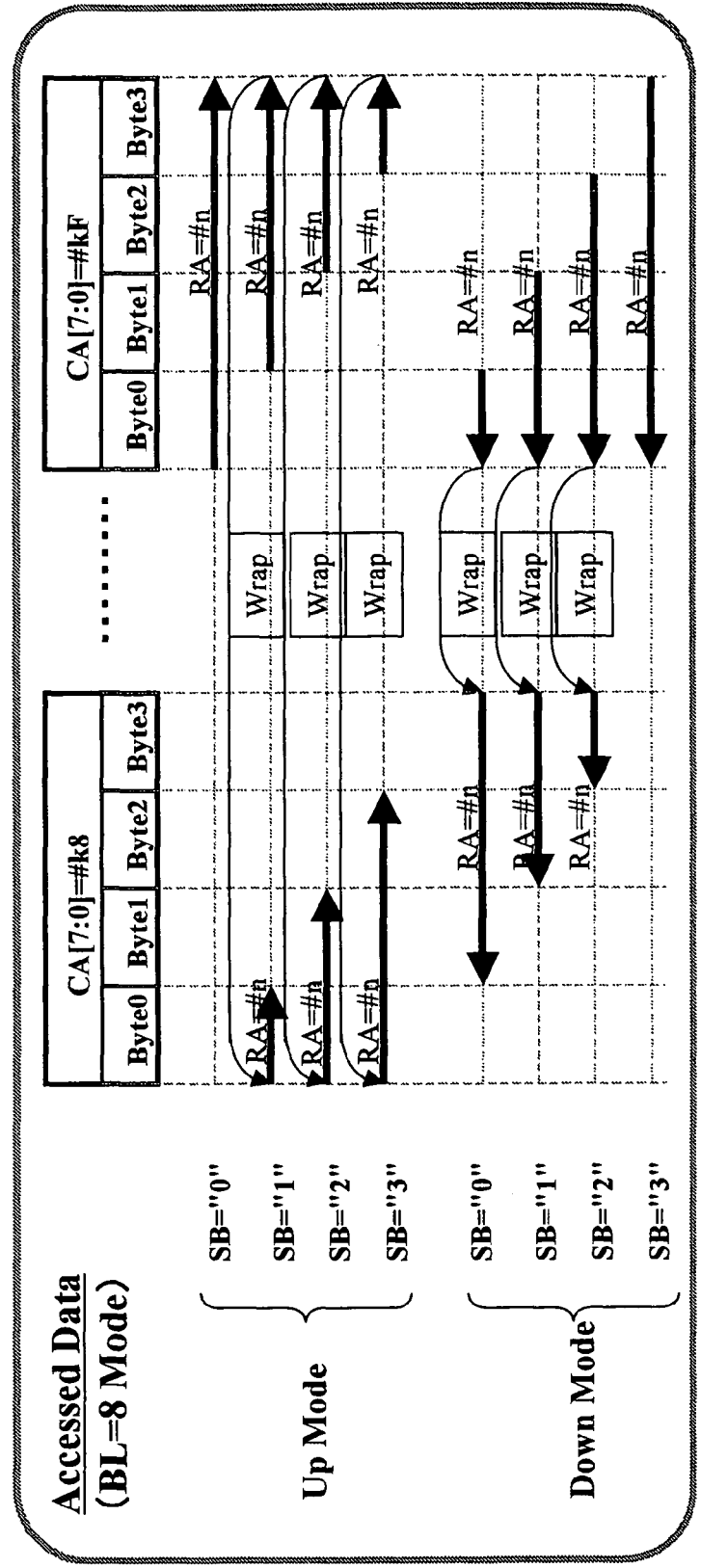

FIG.48
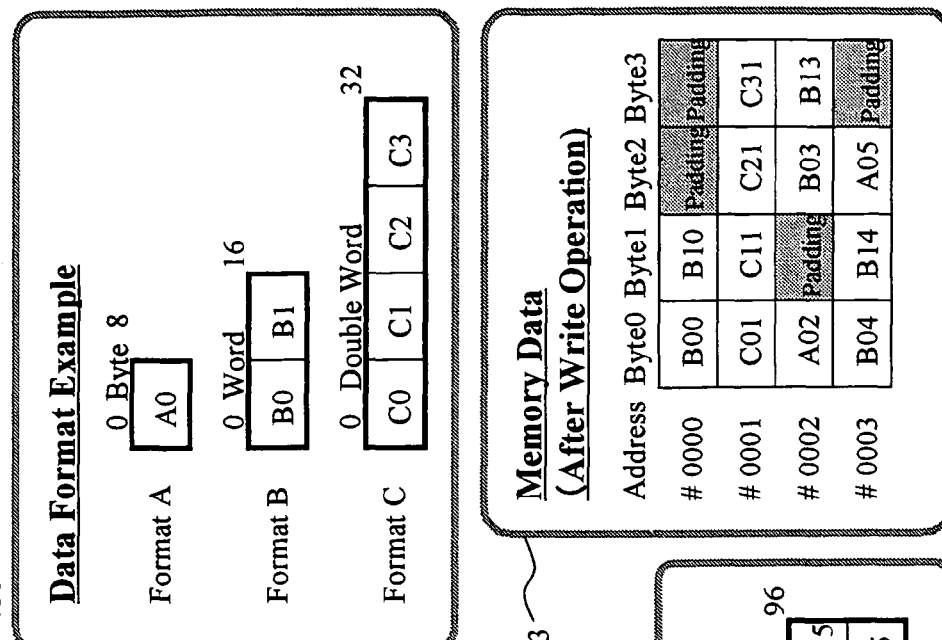
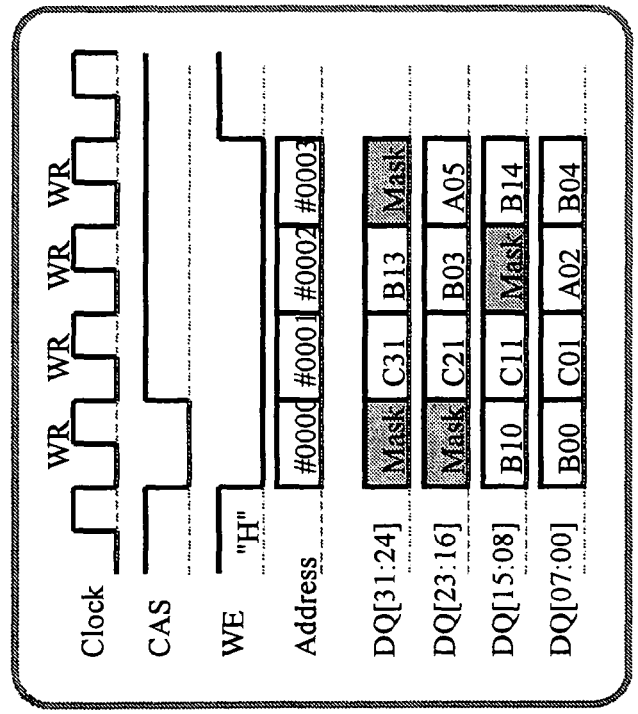

FIG.50
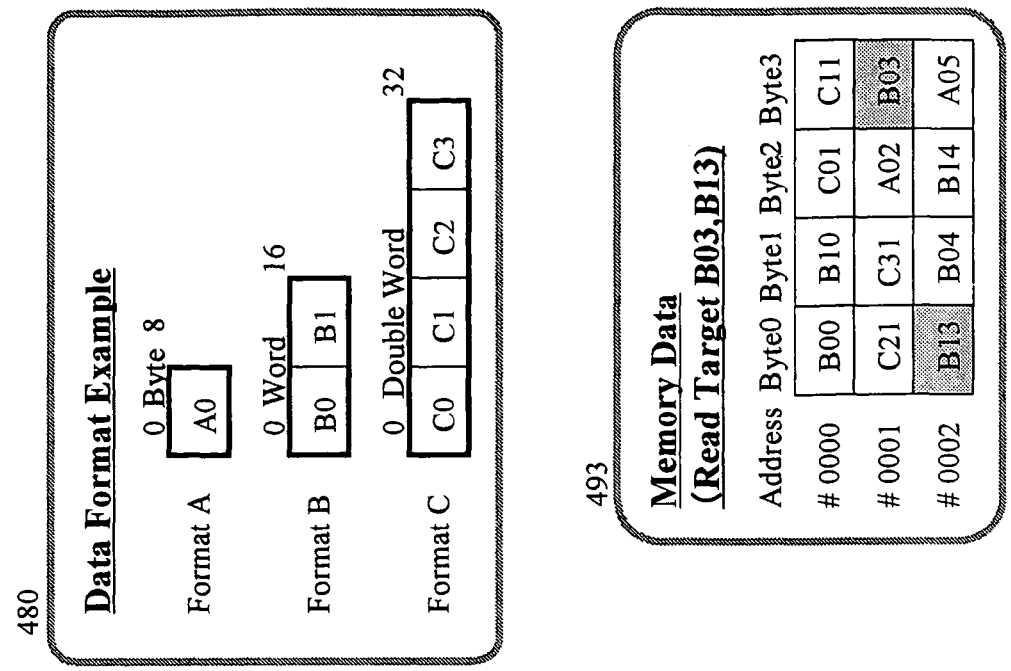
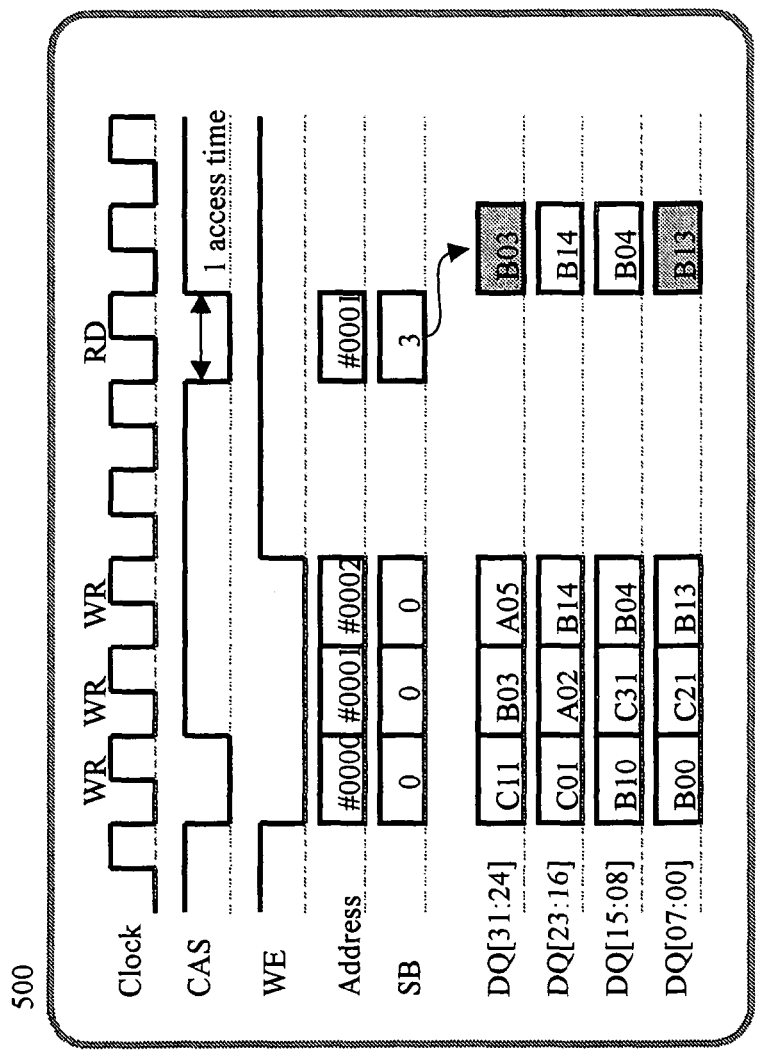

FIG.58

MEMORY DEVICE, MEMORY CONTROLLER AND MEMORY SYSTEM

CROSS-REFERENCE TO RELATED APPLICATIONS

This Application is a Divisional Application, which claims the benefit of U.S. patent application Ser. No. 11/698,286 filed, Jan. 26, 2007, now U.S. Pat. No. 7,814,294 which also claims the benefit of priority from the prior Japanese Patent Application No. 2006-345415, filed on Dec. 22, 2006, the entire contents of which are incorporated herein by reference.

BACKGROUND OF THE INVENTION

1. Technical Field

The present invention relates to a memory device for recording two-dimensionally arrayed data including digital image data, a memory controller of the memory device, and a memory system. Particularly, the present invention relates to a memory device, memory controller and memory system for increasing an effective bandwidth indicating the number of data items that can be processed per unit time.

2. Prior Art

The market size of the memory devices for recording two-dimensionally arrayed data, like digital image data, has been gradually increasing along with the popularization of video distribution through digital broadcasting or the Internet. Digital image data is a group of data obtained by constituting gradation information of pixels using a plurality of bits (e.g., 256 gradation levels of 8 bits). For example, one frame of image data for high-definition broadcasting is constituted by 1920×1040 pixels. Each frame of this image data is arranged in an address space within image memory in accordance with a predetermined mapping method.

Such memory mapping is defined so that the most efficient access can be made, on the basis of the configuration and operation of synchronous DRAM (SDRAM) that is presently popular. For example, SDRAM has a plurality of banks, and each bank has a plurality of word lines and bit lines, a plurality of memory cells that are at the intersections of the word lines and bit lines, and sense amplifiers corresponding to the bit lines. The plurality of banks can independently execute active operation. The active operation performed in the SDRAM is a series of operations for selecting a word line and activating the corresponding sense amplifier on the basis of a row address. Further, read operation performed in the SDRAM is a series of operations for outputting a bit-line potential as read data to an input/output terminal on the basis of a column address, the bit-line potential being amplified by the sense amplifier, while write operation is a series of operations for inputting selected write data, which is inputted from the input/output memory, to a bit line that is selected based on the column address.

An address space within a memory of the SDRAM is constituted by a plurality of page areas each of which can be selected by a bank address and a row address, and each of the page areas has a group of bits or a group of bytes that can be selected by a column address. The group of bytes (or the group of bits) that are selected by the column address are inputted/outputted via a plurality of input/output terminals.

According to a generally known mapping method, a pixel of digital image data is associated with each byte (or bits) of the group of bytes (or the group of bits) that can be selected by the column address within a page area. Moreover, according to this mapping method, each of the banks of the SDRAM can independently execute the active operation and the read or write operation, thus the plurality of page areas associated with an arrangement of pixels of the digital image data are arranged so that page areas that are vertically and horizontally adjacent to each other on the image correspond to different bank addresses respectively. For example, if the SDRAM is constituted by four banks, the page areas corresponding to bank addresses BA=0, 1 are alternately arranged in the odd-numbered rows, while the page areas corresponding to bank addresses BA=2, 3 are alternately arranged in the even-numbered rows. By arranging the page areas in this manner, when reading or writing one frame of image data, different banks can execute the active operation and the read or write operation alternately and temporally overlapped, and a bandwidth, which is the number of processable pixels per a unit time, can be increased remarkably.

Patent Documents 1 and 2 describe that the access efficiency is improved by allowing simultaneous access to a plurality of rows in a semiconductor memory for storing image data.

[Patent Document 1] Japanese Unexamined Patent Publication No. 2001-312885

[Patent Document 2] Japanese Unexamined Patent Publication No. H08-180675

DISCLOSURE OF THE INVENTION

Problems to be Solved by the Invention

A memory device for storing digital image data and the like requires: a horizontal access in which writing and reading image data are performed in order of arrangement of a matrix of pixels; and a rectangular access in which writing and reading image data are performed on a partial rectangular area of the matrix of pixels. The horizontal access corresponds to a raster scanning operation for writing or reading one frame of image data by repeatedly performing horizontal scanning of the image data. Further, the rectangular access corresponds to an operation for reading a small rectangular block of image data to obtain a motion vector when performing an operation of encoding, for example, an MPEG file, or corresponds to an operation for reading and writing a block of image data when reproducing an image by means of a decoding operation.

However, since the image data of a pixel is stored in an address space of a memory by means of the abovementioned mapping method, the problem is that an effective bandwidth is decreased when the rectangular access is made. First of all, a group of bytes, i.e., a plurality of bytes (or a plurality of bits) is accessed simultaneously by column addresses in the page area selected by the bank addresses and row addresses. However, in the case where a rectangular area to be accessed using the rectangular access does not match with the plurality of bytes (or the plurality of bits) that are selected by the column addresses, unnecessary input/output data is generated when access is made by one column address. Secondly, in the case where the rectangular image area to be accessed using the rectangular access does not match with the page area within the address space, access needs to be made to a plurality of page areas exceeding the boundary of page areas, requiring complicated memory control accordingly.

The abovementioned first and second problems bring further complicated memory control and decrease of an effective bandwidth if the rectangular image area as a target of access does not match with the page areas as well as a plurality of bytes (or a plurality of bits) selected by the column addresses.

An object of the present invention, therefore, is to provide a memory device that solves the above problems caused in the rectangular access of the memory device, a memory controller of the memory device, and a memory system.

Means for Solving the Problems

In order to achieve the above object, a first aspect of the present invention is a memory device that has:
- a memory cell array that has a plurality of memory unit areas, each of which is selected by addresses;
- a plurality of input/output terminals; and
- an input/output unit that is provided between the memory cell array and the plurality of input/output terminals,
- wherein each of the memory unit areas stores therein a plurality of byte orbit data items corresponding to the plurality of input/output terminals respectively,
- and, on the basis of an input address and combination information of the bytes or bits, the memory cell array and the input/output unit in response to a first operation code access a plurality of bytes or bits stored in a first memory unit area corresponding to the input address and in a second memory unit area adjacent to the first memory unit, and then, from the plurality of bytes or bits within the accessed first and second memory unit areas, associate a combination of the plurality of bytes orbits, based on the combination information, with the plurality of input/output terminals.

According to the first aspect described above, the memory device can simultaneously input/output data of any combinations of a plurality of bytes (or a plurality of bits), on the basis of the input address and the combination information in response to the first operation code that is provided along with the input address, thus the memory device can prevent the decrease of an effective bandwidth in the rectangular access that exceeds the boundary of memory unit areas.

In order to achieve the above object, according to a second aspect of the present invention, the memory system has: the memory device of the first aspect; and a memory controller that supplies the first operation code, the address, and the combination information on the combination of bytes or bits, and accesses the plurality of bytes or bits within first and second memory unit areas of the memory device.

In order to achieve the above object, according to a third aspect of the present invention, the memory controller for controlling the memory device of the first aspect, supplies the first operation code, the address, and the combination information on the combination of bytes or bits to the memory device, so as to access the plurality of bytes or bits within the first and second memory unit areas of the memory device.

EFFECT OF THE INVENTION

Even if the access target area to be accessed to the memory device is not aligned to the memory unit area selected by the input address, any combinations of a plurality of bytes or bits within the two adjacent memory unit areas can be accessed using the combination information on the combination of the bytes or bits.

BRIEF DESCRIPTION OF THE DRAWINGS

FIG. 2 is a figure showing two accesses in the image memory.
FIG. 4 is a figure showing a first problem of a rectangular access.
FIG. 5 is a figure showing a second problem of a rectangular access.
FIG. 10 is a figure for explaining byte boundary functions.
FIG. 15 is a figure for explaining the special memory mapping shown in FIG. 14.
FIG. 23 is a figure for explaining the operation shown in FIG. 22.
FIG. 25 is a figure for explaining the operation shown in FIG. 24.
FIG. 26 is a figure showing an operation of a modified example (1) of the second example of the image memory having the byte boundary functions.
FIG. 27 is a figure showing an operation of a modified example (2) of the second example of the image memory having the byte boundary functions.
FIG. 28 is a figure showing an operation of a modified example (3) of the second example of the image memory having the byte boundary functions.

FIG. 38 is an operation timing chart of the up mode of a DDR memory shown in FIG. 37.

FIG. 39 is an operation timing chart of the down mode of the DDR memory shown in FIG. 37.

FIG. 45 is a figure showing an example of memory operation performed when an access made by the byte boundary functions reaches the end of a page area.

FIG. 46 is a figure showing another example of the memory operation performed when an access made by the byte boundary functions reaches the end of a page area.

FIG. 48 is a figure for explaining other application of the byte boundary functions.

FIG. 50 is a figure for explaining other application of the byte boundary functions.

FIG. 58 is a figure showing a configuration of the page area 14 in the memory mapping 12.

BEST MODE FOR CARRYING OUT THE INVENTION

Embodiments of the present invention are described with reference to the drawings. However, the technical field of the present invention is not limited to these embodiments, and thus covers the matters described in the patent claims and equivalents thereof.

[Memory Mapping of Image Memory, and Problems Involved in the Mapping Memory]

Figure 1:
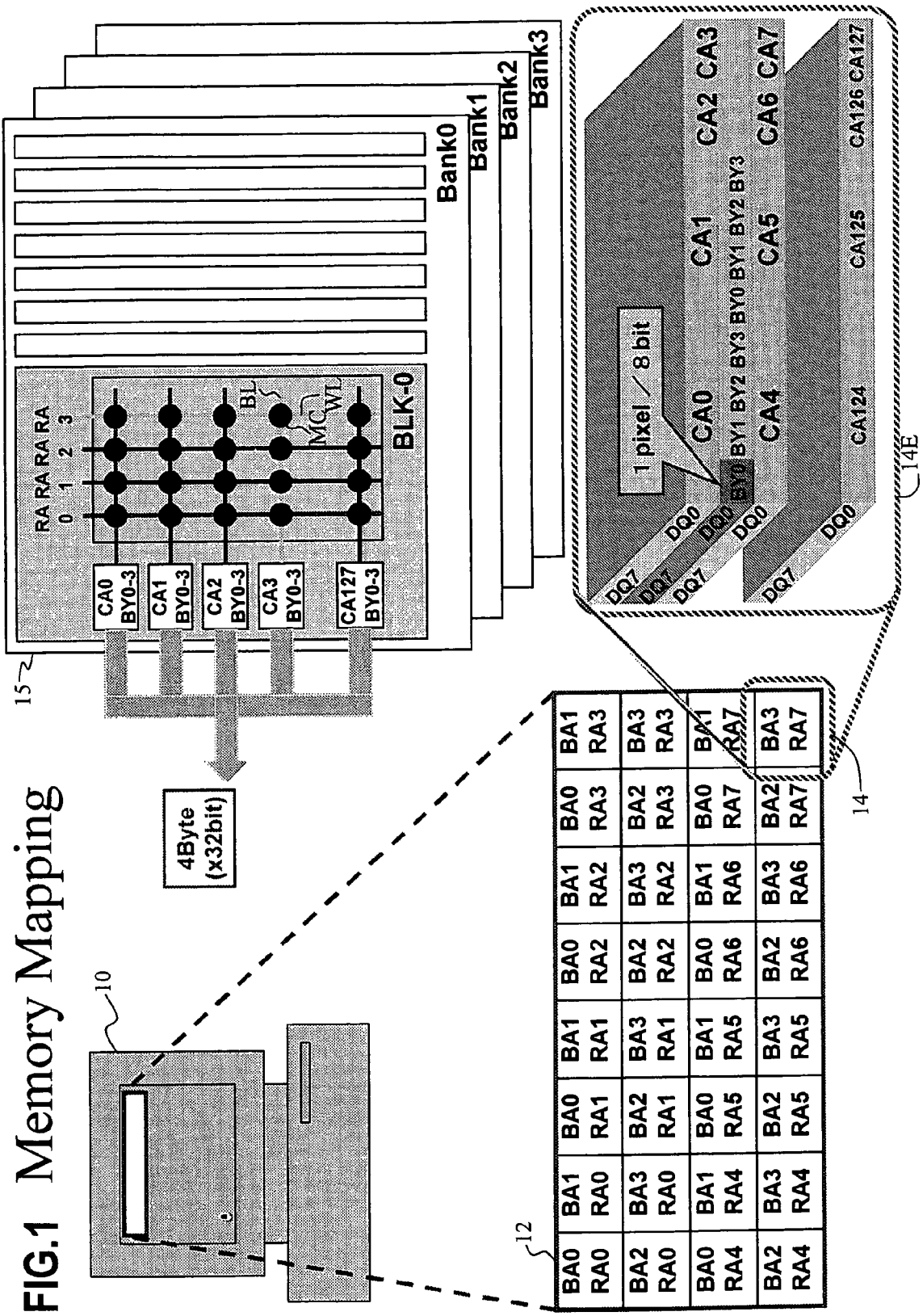
FIG. 1 is a figure showing memory mapping of an image memory according to the present embodiment.

FIG. 1 shows memory mapping of an image memory according to the present embodiment. In FIG. 1, display image data in an image processing system having a display device 10 is stored in image memory 15. The display image data is constituted by data on a luminance signal Y and color-difference signals Ca and Cb of each pixel and RGB gradation signals of each pixel, wherein each signal is constituted by data of, for example, 8 bits (1 byte).

Meanwhile, the image memory 15 is generally constituted by a high-capacity and high-speed semiconductor memory device in which an integrated circuit is formed on a semiconductor substrate such as SDRAM. Such image memory is constituted by a plurality of banks Bank 0 through 3 (four banks as shown in FIG. 1), wherein each Bank 0-3 has a plurality of blocks BLK-0, and each of the blocks has a plurality of word lines WL, bit lines BL, and memory cells MC which are at the intersections of the word lines and bit lines. Each memory cell is constituted by an unshown MOS transistor of which gate is connected to a word line, and a capacitor that is connected to the transistor. In the example shown in FIG. 1, the four banks are associated with bank addresses BA 0 through 3 respectively, the word lines are associated with row addresses RA 0 through 7, and the bit lines are associated with column addresses CA 0 through 127. A word line within a bank is selected by a combination of a bank address BA and a row address RA, and a bit line is selected by a column address CA. 4 bytes of data items, BY 0 through 3, are accessed by the bank address BA, row address RA and column address CA. Since 1 byte consists of 8 bits, 4 bytes of data items, i.e., 4×8=32 bits of data, are associated with an input/output terminals of the memory at one access, and then reading or writing is performed. Generally, the abovementioned 1 byte of data (8 bits of data) corresponds to a signal of a pixel. By inputting/outputting 4 bytes of data items at one access, a bandwidth, which indicates the number of pixels that can be processed per unit time with respect to the image data, can be increased.

According to the memory mapping 12 for the display image data, page areas 14, each of which is specified by the bank address BA and row address RA, are placed in rows and columns. As shown in an enlarged area 14E, one page area 14 has 128 memory unit areas that are specified by the column addresses CA0 through 127, and each of the memory unit areas stores the 4 bytes of data items, BY 0 through 3. The 4 bytes of data items, BY 0 through 3, are inputted/outputted via a total of 32 input/output terminals of a memory, i.e., via input/output terminals DQ 0 through 7, DQ 8 through 15, DQ 16 through 23, and DQ 24 through 31. 8-bit data of each byte corresponds to signal data of a pixel.

The memory map 12 is suitable for operating, at high speed, the image memory 15 such as the SDRAM constituted by a plurality of banks. In response to an active command provided along with both the bank address BA and the row address RA, the SDRAM performs the active operation that drives the selected word line within the selected bank, reads the data stored in a memory cell into the bit line, activates the sense amplifier associated with the bit line to amplify the bit line potential, and thereafter, in response to a read command provided along with the column address CA, performs the read operation for reading the data from the selected bit line. Alternatively, after performing the active operation the SDRAM responds to a write command provided along with the column address CA and write data, to perform the write operation for writing the write data into the selected bit line. Precharge operation using a precharge command is performed after the read operation or the write operation, and then the active operation and the read or write operation are performed again. In this manner, in the SDRAM each bank can independently perform the active operation, read operation and write operation.

According to the memory map 12 shown in FIG. 1, different bank addresses BA 0 through 3 are assigned to the page areas 14 that are vertically and horizontally adjacent to each other. Specifically, bank addresses BA 0 and 1 are alternately arranged in the odd-numbered rows in the memory map 12, while bank addresses BA 2 and 3 are alternately arranged in the even-numbered rows. Moreover, the row addresses RA 0 through 7 are repeatedly incremented by two in the raster direction (row direction) of the memory map 12, and each of the rows in the memory map 12 is wrapped after every four row addresses RA 0 through 3 and RA 4 through 7.

By adopting the memory mapping for allocating the page areas on an image without causing the page areas having the same bank to be adjacent to each other in the row direction or the column direction, the horizontal access that is a representative access made to the image memory, i.e., the access in which the page areas 14 are moved in the row direction and one page area is selected, can be made to the image memory, while the active operation and the read/write operation are executed simultaneously by using two banks, whereby the access efficiency can be improved. The same is true for the case where the image memory is accessed in a vertical direction.

FIG. 2 shows two accesses in the image memory. The horizontal access shown in FIG. 2(A) is an access that occurs mostly when inputting/outputting a video frame image, and corresponds to raster scanning for accessing the image in a horizontal direction 20 from the upper left to the lower right. On the other hand, the rectangular access shown in FIG. 2(B) is an access that occurs mostly when compressing or expanding an MPEG image or the like, and corresponds to an operation for accessing the image from the upper left to the lower right in a direction of an arrow 24 within a rectangle 22 with an arbitrary aspect ratio. The rectangular area 22 corresponds to a block or the like that is a target for extracting a motion vector of the MPEG image.

Generally, in an image system using an image memory, the transfer rate of transferring the image memory, which is a frame memory, is set faster than the speed of image display operation, so that, while the image data read by horizontally accessing the image memory is displayed on a screen, new frame data is created by means of the rectangular access, and that frame data is continuously created and outputted. Therefore, both horizontal access and rectangular access are made in an actual image system.

In the horizontal access, scanning is performed in the horizontal direction 20, thus memory access can be made efficiently, while activating adjacent banks simultaneously. In the rectangular access, on the other hand, the position of the rectangular area 22 to be accessed is not caused to go beyond a single bank and a page area within the bank, whereby the data within the rectangular area 22 can be accessed by performing single active operation for specifying the bank address BA and the row address RA, thus efficient memory access can be performed, as with the horizontal access.

Figure 3:
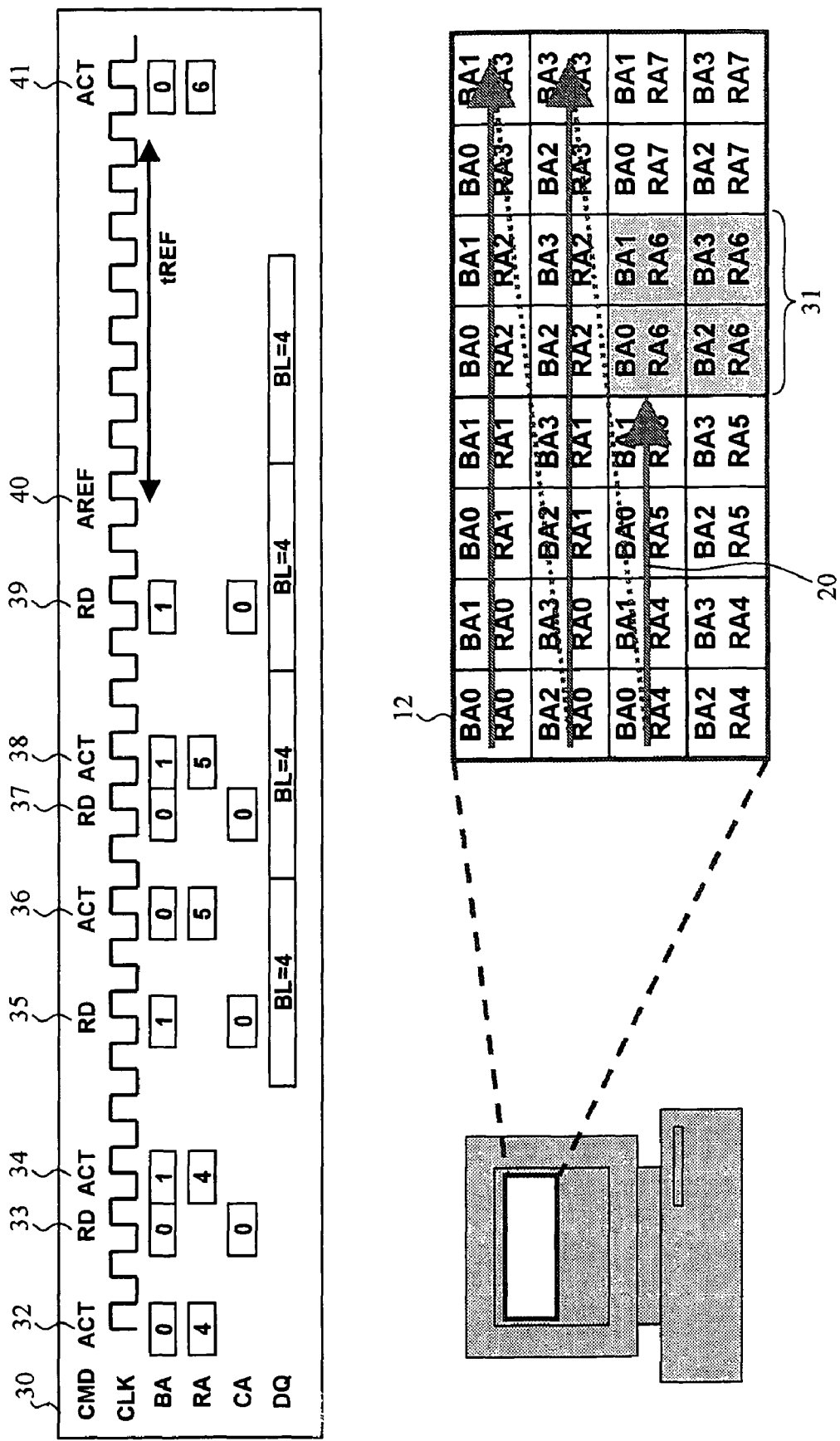
FIG. 3 is a figure showing a problem of a horizontal access.

FIG. 3 shows a problem of the horizontal access. There is shown a timing chart 30 of the horizontal access made in the horizontal direction 20 in the abovementioned memory map 12. In this timing chart, an automatic refresh command AREF is generated when horizontally accessing (20 in the figure) the page area in the fourth row of the memory map 12 (BA 0/RA 4, BA 1/RA 4, BA 0/RA 5, BA 1/RA 5). The timing chart 30 shows a command CMD, clock CLK, bank address BA, row address RA, column address CA, and input/output terminals DQ.

A burst length BL is set to 4 as a premise. When the active operation is performed on the page area with BA 0/RA 4 by an active command ACT 32 and an instruction is issued by a read command RD 33 to read the page area with BA 0/CA 0, four 32-bit data items are successively outputted from the input/output terminals DQ in four clock cycles after a predetermined latency (four clock in the figure). Specifically, each of the four 32-bit data items in the respective column addresses CA 0 through 3 within the page area BA 0/RA 4 is outputted four times successively. This burst operation is required to the SDRAM as a standard. The above-described operation suggests that each 4 byte (32-bit) data item of each of the column addresses CA 0 through 3 within the page area 14E enlarged in FIG. 1 is outputted four times successively.

Next, 4 bytes of data items of the page area BA 1/RA 4 are outputted by means of an active command ACT 34 and a read command RD 35. Similarly, 4 bytes of data items of the page area BA 0/RA 5 are outputted by means of an active command ACT 36 and a read command RD 37, and 4 bytes of data items of the page area BA 1/RA 5 are outputted by means of an active command ACT 38 and a read command RD 39.

At this point, when an automatic refresh command AREF 40 for specifying a row address RA 6 is generated, the SDRAM memory configuring the image memory executes a refresh operation on all incorporated banks, i.e., four banks BA 0 through 3, in parallel. Specifically, the word lines of the respective row addresses RA 6 within the respective four banks are driven simultaneously, the corresponding sense amplifiers are activated, rewriting is performed, and then the precharge operation is performed. This refresh operation is performed on four page areas 31 within the memory map 12 shown in FIG. 3. Therefore, the horizontal access (arrow 20) is stopped temporarily during a refresh operation period tREF. After the refresh operation period tREF, the next page area BA 0/RA 6 is accessed again by means of an active command ACT 41 and a read command RD (not shown), whereby the horizontal access is restarted.

Since the refresh operation is performed for four banks simultaneously by means of the refresh command AREF, the horizontal access is stopped temporarily when the refresh command is generated while the horizontal access is made, thus the effective bandwidth becomes narrow. This is the problem occurring in the horizontal access.

Figure 4:
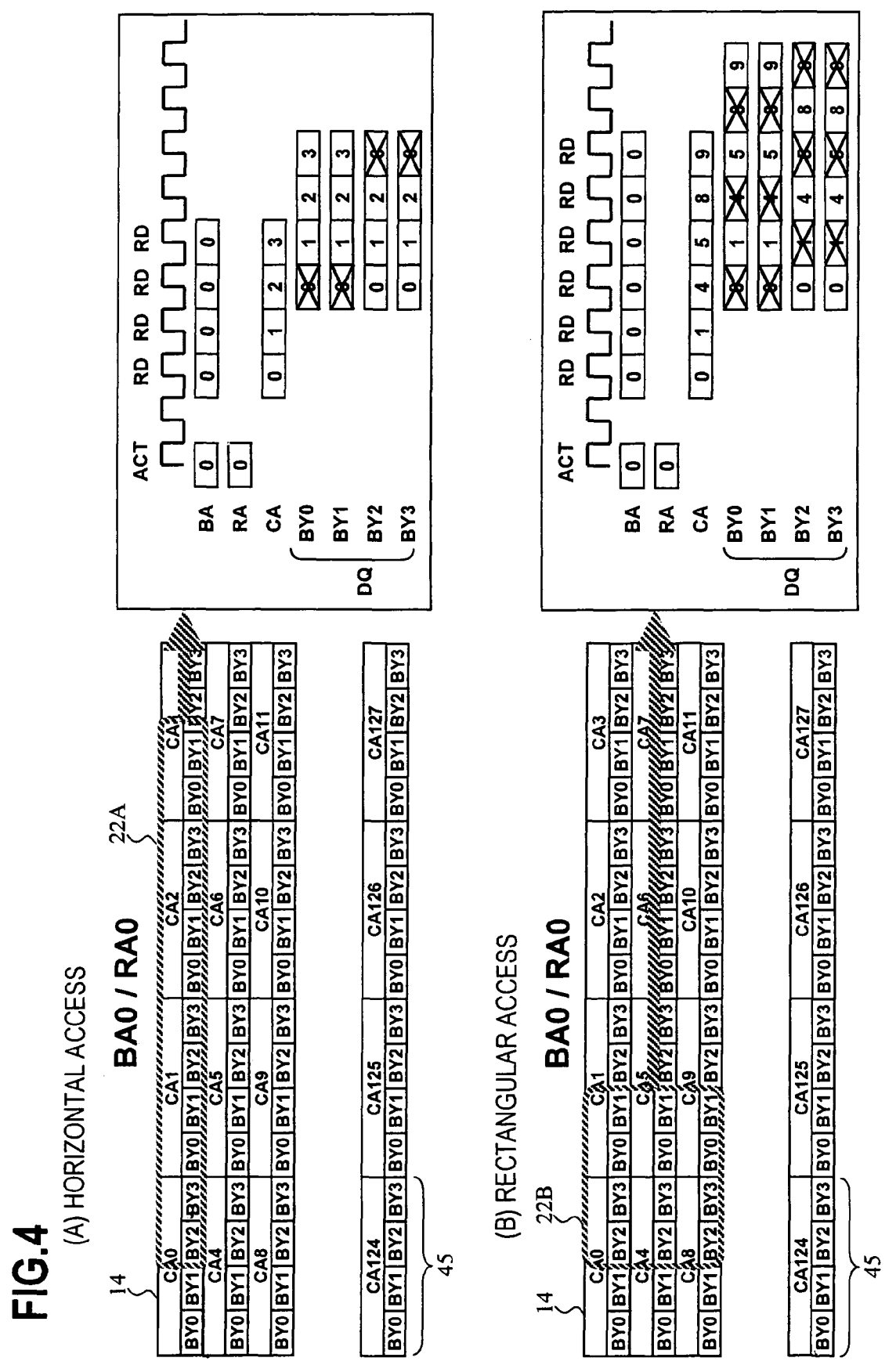

FIG. 4 shows a first problem of the rectangular access. FIG. 4(A) shows an example of the horizontal access, and FIG. 4(B) shows an example of the rectangular access. Both examples are the accesses exceeding the boundary of a memory unit area (4-byte area) 45 selected by a column address CA. As described above, according to a generally-known memory map, the page area 14 that is specified by a bank address BA and a row address RA is sectioned into a plurality of memory unit areas 45 selected by the column addresses CA 0 through 127, and 4 bytes of data items BY 0 through 3 are accessed simultaneously by a single column address CA. 8-bit data of each byte corresponds to a signal of a pixel.

Therefore, although the horizontal access is made relatively economically, unnecessary input/output of data occurs in the rectangular access, thus the effective bandwidth decreases.

In the horizontal access shown in FIG. 4(A), when accessing an area 22A, four read commands RD are issued for the column addresses CA 0 through 3 subsequent to the active command ACT for specifying the page area BA 0/RA 0, and 4 bytes of data items BY 0 through 3 of each of the column addresses CA 0 through 3 are inputted/outputted successively. In this case, the area 22A contains a section from bytes BY 2 and 3 of the column address CA 0 to bytes BY 0 and 1 of the column address CA 3. Therefore, of the input/output DQ of 4 bytes of data corresponding to the column address CA 0, the data items of the bytes BY 0 and 1 are not required, and, of the input/output DQ of 4 bytes of data corresponding to the column address CA 3, the data items of the bytes BY 2 and 3 also are not required. Therefore, the volume of the effective output data is 12 bytes/16 bytes.

On the other hand, in the rectangular access shown in FIG. 4(B), when accessing a rectangular area 22B, six read commands RD are issued for the column addresses CA 0, 1, 4, 5, 8 and 9 subsequent to the active command ACT for specifying the page area BA 0/RA 0, and 4 bytes of data items BY 0 through 3 of each of the column addresses CA 0 1, 4, 5, 8 and 9 are inputted/outputted successively. However, the rectangular area 22B does not match with the boundary of the memory unit area (4-byte area) 45 selected by the column addresses and exceeds the boundary of the 4-byte area, thus half of each of the 4-byte data items BY 0 through 3 is unnecessary data. Specifically, the volume of the effective output data is 12 bytes/24 bytes. FIG. 4(B) shows the worst case.

As described above, even if the data to be accessed has the same number of bytes, in the rectangular access 24 bytes of data need to be inputted/outputted by sending the read command RD six times, but in the horizontal access 16 bytes of data may be inputted/outputted by sending the read command RD four times. Therefore, in the rectangular access that exceeds the boundary of the 4-byte area (memory unit area) 45 selected by a single column address, the effective bandwidth decreases. This is the first problem of the rectangular access.

FIG. 5 shows a second problem of the rectangular access. The rectangular access is an access made to an arbitrary rectangular area and sometimes exceeds a boundary 14BOU of adjacent page areas 14. FIG. 5 shows a case in which a rectangular area 22(A) is a 16-byte area within the same page area BA 1/RA 6, and a case in which a rectangular area 22(B) is a 16-byte area covering four adjacent page areas BA 3/RA 2, BA 2/RA 3, BA 1/RA 6 and BA 0/RA 7.

In the case of the rectangular area 22(A), 16 bytes of data can be inputted/outputted by issuing an active command ACT (50 in the figure) once for the page area BA 1/RA 6 and a read command RD (52 in the figure) four times for the column addresses CA 6, 7, 10 and 11, as shown in the timing chart.

In the case of the rectangular area 22(B), on the other hand, 16 bytes of data cannot be inputted/outputted unless an active command ACT (54 in the figure) is issued four times for the page areas BA 3/RA 2, BA 2/RA 3, BA 1/RA 6 and BA 0/RA 7 and unless a read command RD (56 in the figure) is issued four times for the column addresses CA 127 (BA 3), CA 124 (BA 2), CA 3 (BA 1) and CA 0 (BA 0), as shown in the timing chart. Specifically, in the case where the rectangular area 22 includes adjacent page areas, the active commands ACT are issued a number of times in order to perform the active operation on different banks, and the read commands RD or write commands WR have to be issued for the column addresses within the respective banks. Therefore, the amount of data that can be accessed per unit time is reduced, and the effective bandwidth is narrowed.

In the case where the rectangular area 22(B) shown in FIG. 5 is sectioned at the middle of the memory unit area (4-byte area) selected by a column address, the first problem illustrated in FIG. 4 occurs at the same time, thus a plurality of active commands are required (second problem), and unnecessary data is contained in the input/output data DQ corresponding to the read commands (first problem), causing decrease of the effective bandwidth.

As described above, in the case of adopting the memory mapping, that utilizes the structural characteristics of the SDRAM, in the image memory, there are the first problem in which the horizontal access is stopped due to the occurrence of the refresh command when the horizontal access is performed, the second problem in which unnecessary input/output data is generated when the rectangular access area exceeds the boundary of the memory unit area (4-byte area) selected by a column address, and a third problem in which a plurality of bank active commands are required to be issued when the rectangular access area exceeds the boundary of the page areas specified by the bank addresses.

General Description of the Present Embodiment

Hereinafter, configurations and operations for solving these problems are described briefly.

The present embodiment is to solve the discontinuation of the access that is caused by the refresh operation, the decrease of the access efficiency that is caused by the rectangular access, and other problems, wherein, first of all, the refresh operation can be performed in the background along with an access operation at the time of the horizontal access, secondly, at the time of the rectangular access, a function of efficiently accessing an area straying from or exceeding the memory unit (4-byte area) selected by a column address is made possible, and, thirdly, a function of efficiently accessing a rectangular area exceeding the boundary of the page areas and containing a plurality of page areas is made possible.

Figure 6:
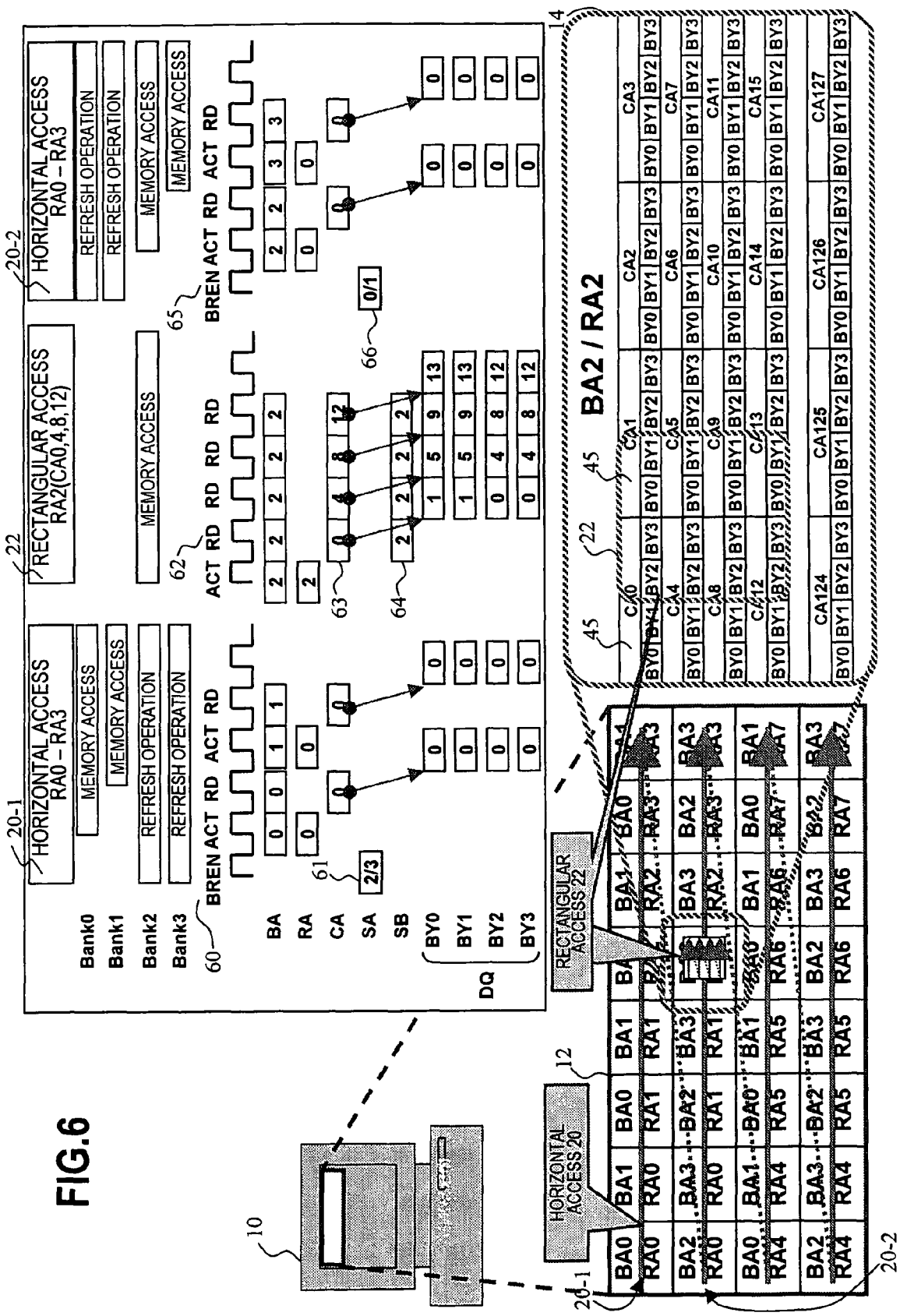
FIG. 6 is a figure showing the entire operation performed in the present embodiment.

FIG. 6 shows the entire operation performed in the present embodiment. As described above, in an image system utilizing an image memory, both the horizontal access and the rectangular access are generated. The example shown in FIG. 6 is an example in which a horizontal access 20-1 to page areas with the bank addresses BA 0 and BA 1 in the first row of the memory map 12, a rectangular access 22 to a page area BA 2/RA 2 in the second row, and a horizontal access 20-2 to page areas with the bank addresses BA 2 and BA 3 in the second row are generated sequentially. In the rectangular access 22, access is made to a rectangular area exceeding the memory unit area (4-byte area) 45 within one page area BA 2/RA 2.

In this case, in the rectangular access, access is generated in an arbitrary bank of the memory, while, in the horizontal access, access is generated only in a predetermined bank for a certain period of time. For example, in the horizontal access in the first row of the memory map 12, access is generated only in the banks BA 0 and 1, and no access is generated in the banks BA 2 and 3 in the second row. On the other hand, in the horizontal access in the second row, access is generated only in the banks BA 2 and 3, and no access is generated in the banks BA 0 and 1 in the first row.

Therefore, in the horizontal access 20-1, a background refresh command BREN for specifying a bank in which no access is generated for some time to come is issued before memory access is made, and information of the bank in which no access is generated, SA=2/3, is notified to the memory. Specifically, subsequent automatic refresh operation is allowed in the bank SA specified by the background refresh command BREN. Therefore, normal access is not allowed to the bank SA=2, 3 to which the refresh operation is applied.

In the horizontal access 20-1 shown in FIG. 6, refresh bank information SA (61 in the figure) for allowing subsequent refresh operation to be performed is issued along with the background refresh command BREN (60 in the figure), thereafter the active operation is performed on the page area BA 0/RA 0 by means of the active command ACT, and then 4 bytes of data items BY 0 through 3 of the column address CA 0 are outputted to the input/output terminal DQ by the read command RD (BA 0, CA 0). Similarly, the active operation is performed on the page area BA 1/RA 0 by means of the active command ACT, and then 4 bytes of data items BY 0 through 3 of the column address CA 0 are outputted to the input/output terminal DQ by the read command RD (BA 1, CA0). However, FIG. 6 omits the illustration of output of four 4-byte data items corresponding to BL=4.

During the period of this horizontal access 20-1, when an automatic refresh request (not shown), which is activated by the background refresh command BREN within the image memory, is issued, the refresh operation is started on the banks BA 2 and 3. However, in the horizontal access, access is generated only in the banks BA 0 and 1 and different banks can independently perform the active operation in the SDRAM, thus the horizontal access can be prevented from being disturbed and stopped by the refresh operation performed on the banks BA 2 and 3.

Next, in the rectangular access shown in FIG. 6, the rectangular area 22 is in the same page area BA2/RA2 and contains 2 bytes, BY 2 and 3, i.e., the second half of the column address CA 0, and 2 bytes, BY 0 and 1, i.e., the first half of the column address CA 1. In this case, according to a general read command of the SDRAM, a read command RD needs to be issued twice to the column addresses CA 0 and 1.

However, in the present embodiment, a read command RD (62 in the figure) is issued to the column address CA 0 (63 in the figure), and byte combination information SB (64 in the figure) on the access is supplied, whereby 4 bytes corresponding to the byte combination information SB can be automatically associated with the input/output terminal DQ. In the example described above, byte shift information SB=2, which means the bytes following 2 bytes, is specified as the byte combination information SB, whereby, out of the 4 bytes of data items of the column address CA 0, the data items of the bytes BY 2 and 3 subsequent to the 2 bytes are automatically outputted along with the data items of the first two bytes BY 0 and 1 of the 4 bytes of data items of the adjacent column address CA 1.

In the rectangular access shown in FIG. 6, after the active command ACT for the page area BA 2/RA 2 is issued, the read command RD 62 for specifying BA 2/CA 0 (63 in the figure) is issued along with the byte combination information SB=2 (64 in the figure). This byte combination information SB=2 indicates a combination of 4 bytes of data items including the byte BY 2 that follows the first 2 bytes within the 4-byte area. In other words, this byte combination information SB=2 indicates that the first byte position (start byte) of the 4-byte area is the BY 2. In response to this, the image memory associates the data items of the bytes BY 2 and 3 following the first 2 bytes (or from the start byte BY 2) of the 4 bytes of data items of the column address CA 0, and the data items of the bytes BY 0 and 1 of the column address CA 1, with the 4 bytes of input/output terminals DQ, for outputting thereto. The memory controller does not need to issue the read command RD twice to the column addresses CA 0 and 1. Moreover, only required data is outputted to all of the 4 bytes of input/output terminals DQ, thus unnecessary data is not outputted, and the access efficiency improves.

Furthermore, when the read command RD specifying BA 2/CA 4 is issued along with the combination information SB=2, the image memory outputs 4 bytes of data constituted by 2 bytes of data of column addresses CA 4 and 5. When the read command RD specifying BA 2/CA 8 is issued along with the combination information SB=2, the image memory outputs 4 bytes of data constituted by 2 bytes of data of column addresses CA 8 and 9. When the read command RD specifying BA 2/CA 12 is issued along with the combination information SB=2, the image memory outputs 4 bytes of data constituted by 2 bytes of data of column addresses CA 12 and 13.

As a result, even if the rectangular access area 22 includes the memory unit areas (four byte areas) of the eight column addresses CA 0, 1, 4, 5, 8, 9, 12 and 13, it is only necessary to issue the read command RD to the column addresses CA 0, 4, 8 and 12 four times, and unnecessary data is not outputted to the input/output terminals, thus the access efficiency can be improved by two times.

In the horizontal access 20-2 subsequent to the rectangular access, since the page areas in the second row of the memory map 12 are accessed, thus normal access is not generated in the banks BA 0 and 1 for a while. Therefore, as with the above explanation, SA=1 is specified along with the background refresh command BREN (65 in the figure) as the bank information SA on a bank (66 in the figure) in which the fresh operation can be performed, and the automatic refresh operation is allowed in the banks BA 0 and 1 in parallel with normal access to the subsequent banks BA 2 and 3.

As described above, the horizontal accesses 20-1 and 20-2 allow the automatic refresh operation in the background when normal access is made, but the rectangular access does not allow the automatic refresh operation in the background. As a result, in the horizontal access 20-1, the normal access operation can be performed in the banks BA 0 and 1 in parallel with the refresh operation in the banks BA 2 and 3, and in the horizontal access 20-2, the normal access operation can be performed in the banks BA 2 and 3 in parallel with the refresh operation in the banks BA 0 and 1. Accordingly, the horizontal accesses can be prevented from being disturbed by the refresh operation, and the effective bandwidth can be prevented from decreasing.

Furthermore, in the rectangular access, the background refresh operation is prohibited. Accordingly, the rectangular access made to an arbitrary area can be prevented from being stopped by the refresh operation. Therefore, the effective bandwidth can be totally prevented from decreasing.

Also, in the rectangular access, the byte combination information SB is specified along with the read command, whereby combined byte data, which is obtained by combining arbitrary bytes with a column address CA of the read command as a start area, can be outputted to the 4 bytes of input/output terminals DQ. The byte combination information SB can also be specified along with a command for setting a mode register in advance of the active command.

Figure 7:
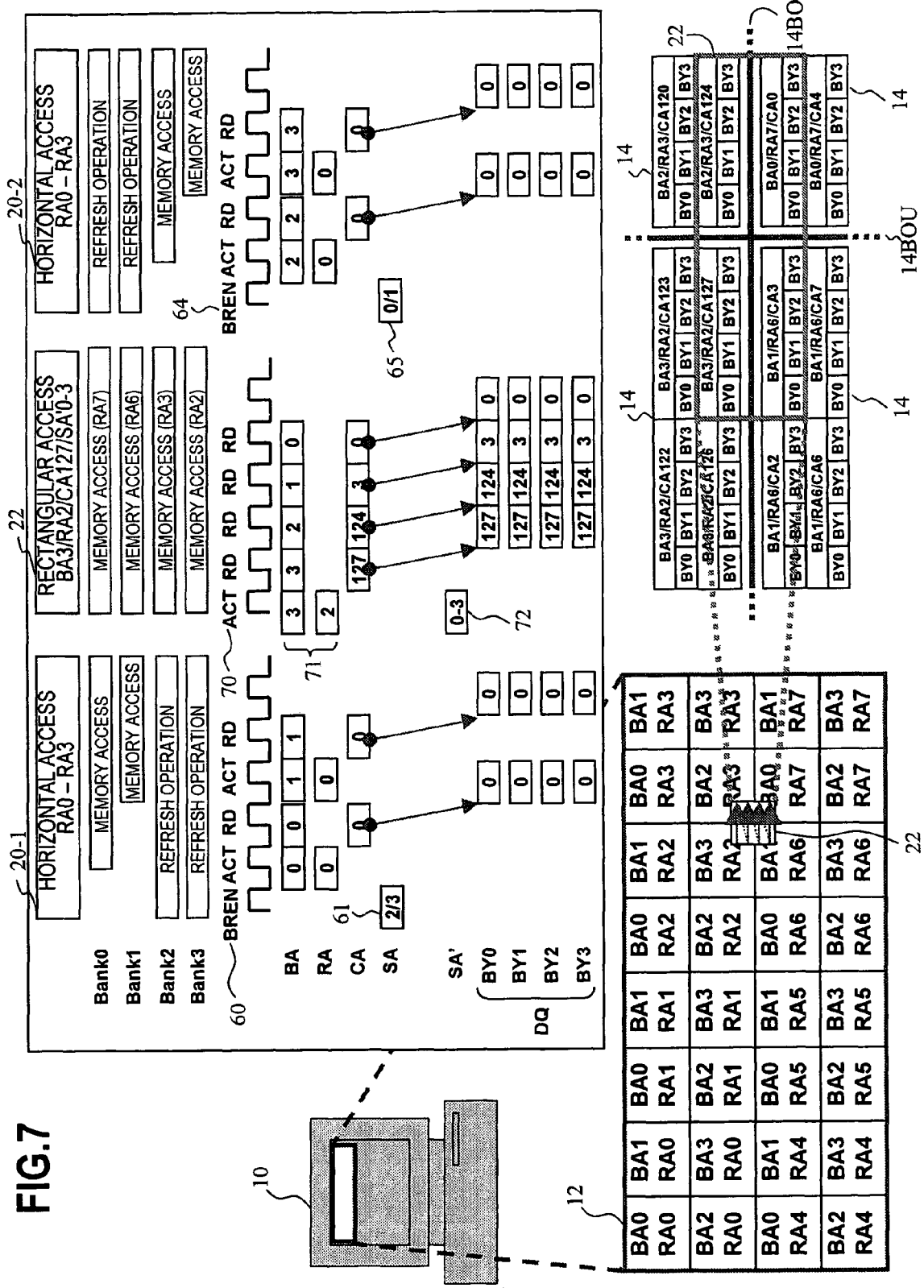
FIG. 7 is a figure showing another example of the entire operation of the present embodiment.

FIG. 7 shows another example of the entire operation of the present embodiment. This example is an example in which the horizontal access 20-1 to page areas in the first row of the memory map, the rectangular access 22, and the horizontal access 20-2 to page areas in the second row of the memory map are performed sequentially. In the rectangular access 22, the rectangular area 22 exceeds the boundary 14BOU of the page areas and contains four page areas BA 3/RA 2, BA 2/RA 3, BA 1/RA 6 and BA 0/RA 7.

As with FIG. 6, in the horizontal accesses 20-1 and 20-2, the refresh bank information SA is issued along with the background refresh command BREN, whereby subsequent automatic refresh operation is allowed in the subject banks, and the horizontal accesses are prevented from being disturbed by the refresh operation. In the rectangular access to the rectangular area 22 having a plurality of areas, i.e. a plurality of banks, multi-bank information SA' is issued along the active command ACT, as bank information on the banks that are subjected to the active operation simultaneously. In response to this, the image memory, performs the active operation on the page areas of the plurality of banks specified by the multi-bank information SA' and having upper left bank of address information BA, RA issued along with the active command ACT, simultaneously. As a result, in response to one active command ACT, the active operation can be performed on the plurality of banks simultaneously. Thereafter, the read command RD for each bank is issued along with the bank address BA and column address CA, whereby four bank data items of a memory unit area (4 bank area) selected by the column address CA of each bank can be outputted to the input/output terminals DQ.

In the example of the rectangular access shown in FIG. 7, address information items BA 3 and RA 2 (71 in the figure) for specifying the page areas in the upper left section are issued along with an active command ACT (70 in the figure), and at the same time the multi-bank information SA'=0-3 (72 in the figure) is issued. In response to this, the image memory, performs the active operation on four banks BA 3, BA 2, BA 1 and BA 0 simultaneously, the four banks being specified by the multi-bank information SA', placing a bank BA 3 of the upper-left page area in front and sequentially outputs 4 bytes of data items of the banks BA/columns CA that are specified by the subsequent four read commands RD. The same applies to the write command. In the figure, BA 3/CA 127, BA 2/CA 124, BA 1/CA 3, and BA 0/CA 0 are supplied in response to the four read commands, and 4 bytes of data items of these memory areas are outputted.

If the multi-bank information SA' indicates "two banks in the lateral direction", a bank on the right side of an upper left bank corresponding to the bank address BA supplied by the active command ACT is also subjected to the active operation simultaneously. If the multi-bank information SA' indicates "two banks in the vertical direction", a bank that is located below the upper left bank is also subjected to the active operation simultaneously. Similarly, if the multi-bank information SA' indicates "four banks in the lateral and vertical directions", four banks that are located on the right side, below, and on the lower right side of the upper left bank are also subjected to the active operation simultaneously. Therefore, in order to perform the active operation automatically on multiple banks, it is preferred to previously set, in the register or the like, information indicating how the row addresses RA in the respective rows of the memory map are arranged, or indicating, specifically, in what unit the row addresses RA are wrapped (row address step information).

In the rectangular access method shown in FIG. 7, when the byte combination information SB described in FIG. 6 is issued along with the read command RD in addition to the multi-bank information SA' at the active command ACT, a partial byte combination of the memory unit areas (four bank areas) exceeding the boundary 14BOU of a page area 14 and selected by a column address CA can be associated automatically with the input/output terminals DQ.

Figure 8:
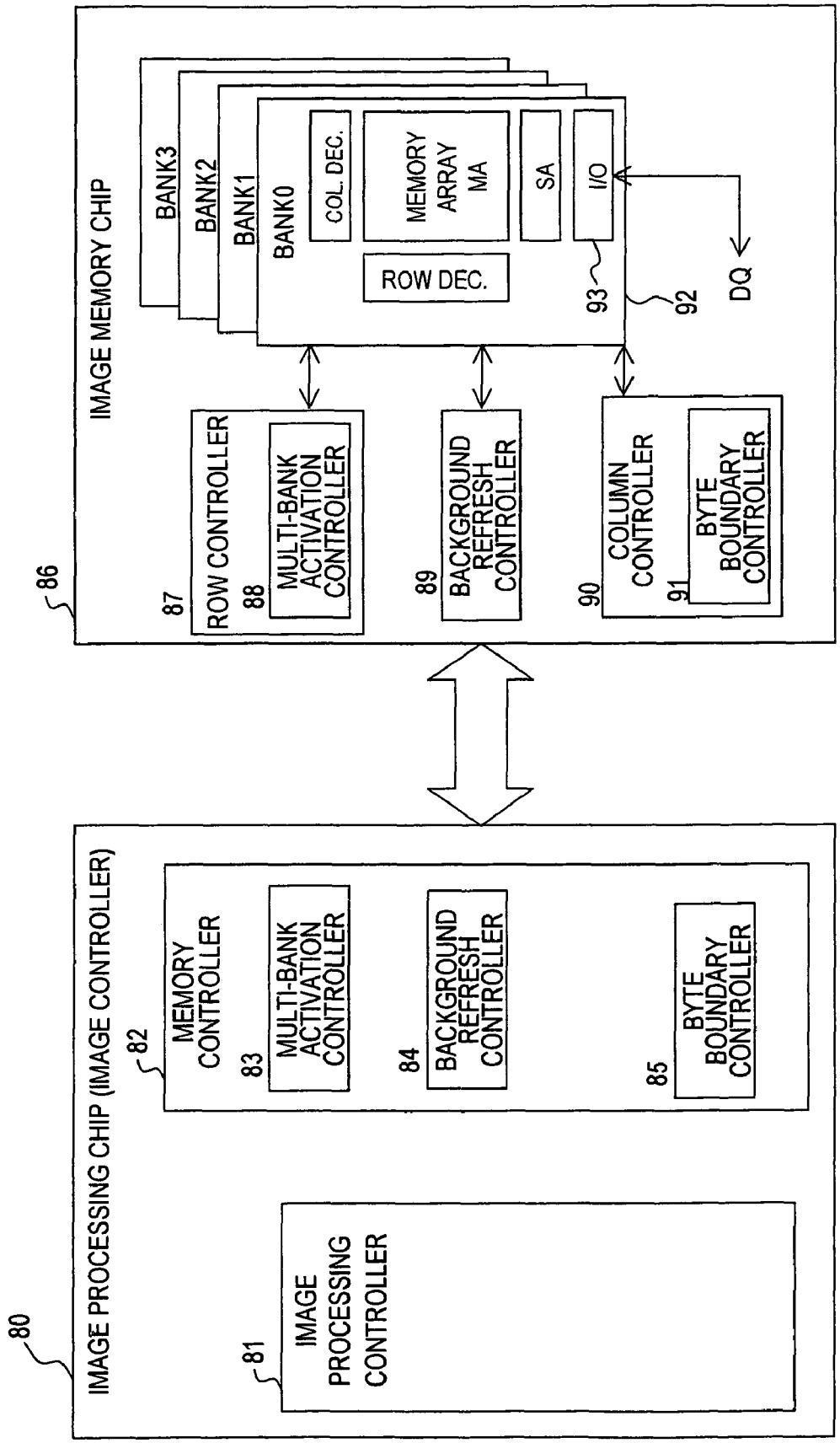
FIG. 8 is a configuration diagram of an image processing system according to the present embodiment.

FIG. 8 is a configuration diagram of an image processing system according to the present embodiment. The image processing system is constituted by an image processing chip 80 corresponding to the memory controller, and an image memory chip 86 for storing image data which is a target of image processing. The image processing chip 80 and the memory chip 86 are each a semiconductor chip wherein an integrated circuit is formed on a single semiconductor substrate.

The image processing chip 80 has: an image processing controller 81 for performing image processing, such as an encoder or decoder that responds to image compression and expansion of, for example, MPEG; and a memory controller 82 for controlling an access to the image memory chip 86 in response to a memory access request that includes image area specification issued from the image processing controller 81. The memory controller 82 has: a background refresh controller 84 for controlling the background refresh operation in the horizontal access; a byte boundary controller 85 for controlling an access to an arbitrary combination of bytes in the memory unit area (4-byte area) in the rectangular access; and a multi-bank activating controller 83 for controlling accesses to a plurality of areas in the rectangular access. By performing these control operations, commands required in each operation, bank addresses, row addresses, column addresses, byte combination information SB, refresh bank information SA, multi-bank information SA' and the like are issued to the image memory 86.

The image memory 86 has a plurality of banks Bank 0 through 3 within memory core 92, and further has a row controller 87 for controlling mainly the active operation, a column controller 90 for controlling the read or write operation, and a background refresh controller 89, there controllers performing control with respect to the memory core 92. The row controller 87 has a multi-bank activation controller 88, and the column controller 90 has a byte boundary controller 91. A row decoder RowDec, column decoder ColDec, memory area MA, sense amplifier group SA, and input/output unit 93 for associating the memory area MA with the input/output terminals DQ are provided in each of the banks Bank 0 through 3.

Figure 9:
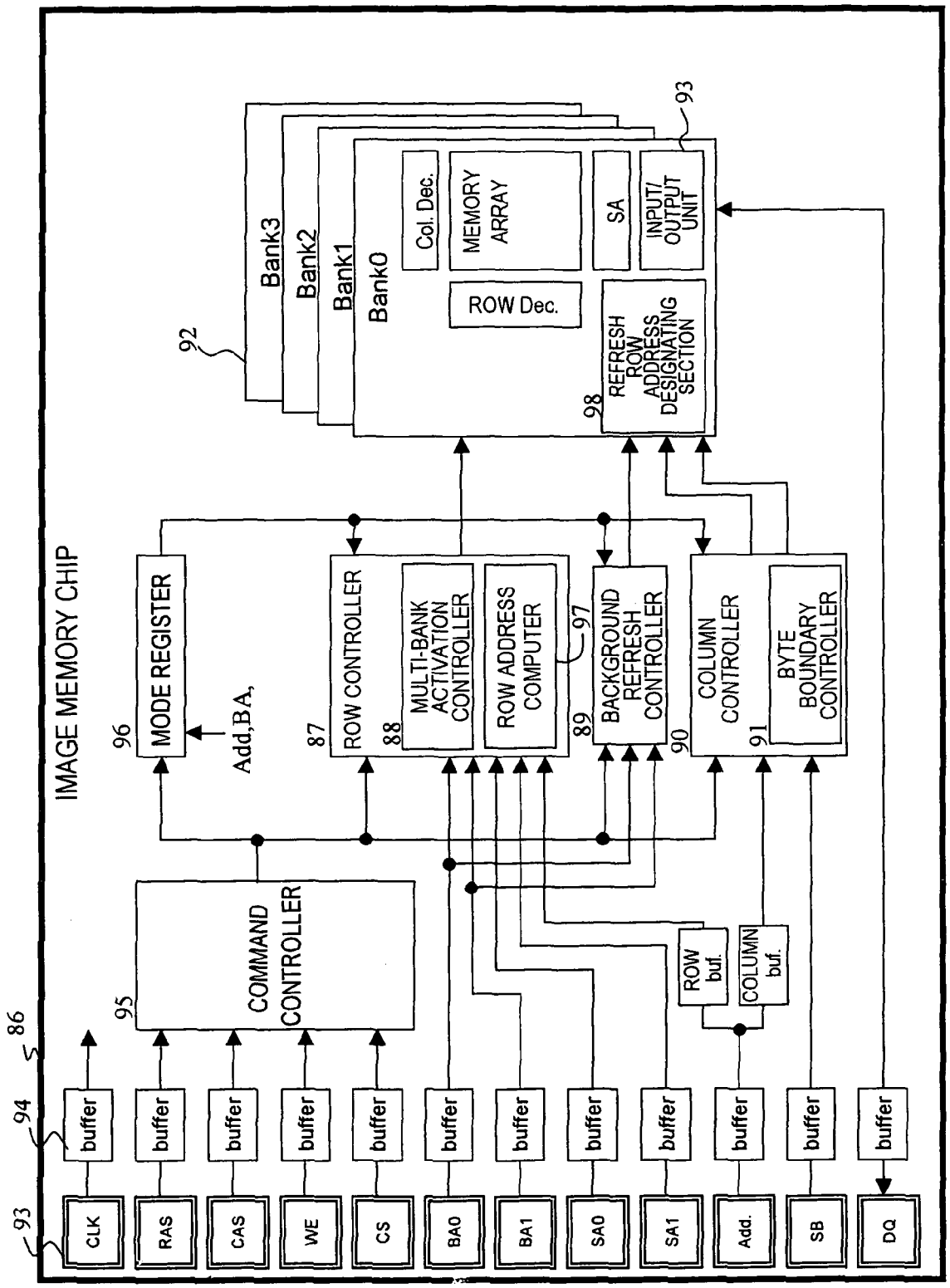
FIG. 9 is a configuration diagram of an image memory according to the present embodiment.

FIG. 9 is a configuration diagram of the image memory according to the present embodiment. In the memory chip 86, the input/output terminal group 93 has, not only the clock CLK, but also command terminals constituted by RAS, CAS, WE and CS, bank address terminals BA 0 and BA 1, refresh bank information terminals SA 0 and SA 1, a plurality of address terminals Add, a byte combination information terminal SB with a predetermined number of bits, a data input/output terminals DQ with a predetermined number of bits, and a multi-bank information terminal SA' which is not shown.

It should be noted that the terminals SB, SA' and SA, that are required in the abovementioned byte boundary function, a multi-bank access function, and the background refresh function, can be realized using a common special pin. These information items are supplied along with different commands, thus input data at special pin may be set to a corresponding register in response to the supplied commands.

Also, these terminals SB, SA' and SA can be realized using unused terminals. For example, in the case where row addresses are inputted at address terminals Add 0 through 12 and column addresses are inputted at the address terminals Add 0 through 9, the address terminals Add 10 through 12 are not used when the column addresses are inputted. Therefore, control data SB, SA' and SA can be inputted from the address terminals Add 10 through 12 that are not used when inputting the column addresses.

The group of external terminals 93 are connected to internal circuits via buffers 94 respectively. The abovementioned group of commands is inputted to a command controller 95, and control signals corresponding to the commands are supplied to the internal circuits. Also, in response to a mode register set command, the command controller 95 sets a predetermined set value to a mode register 96 on the basis of a set data supplied to an address pin Add. The set information that is set by the mode register 96 is supplied to the internal circuits. The row controller 87 has the multi-bank activation controller 88 and a row address calculator 97 required for multi-bank activation. An active pulse is supplied from the multi-bank activation controller 88 to a bank to be activated. Furthermore, a row address to be activated is supplied from the row address calculator 97 to each bank. The bank Bank is provided with a refresh row address designator 98 that designates a row address to be refreshed within the bank. The refresh row address designator 98 has, for example, a refresh counter for generating a row address required when automatically generating a refresh command. The internal configuration of the bank is as explained above.

Hereinafter, image memory and memory controller are described in detail with reference to the byte boundary function, multi-bank active function, background refresh function illustrated in FIG. 6 and FIG. 7 sequentially.

<<Byte Boundary>>

FIG. 10 is a figure for explaining the byte boundary functions. This figure shows a group of bytes (or a group of bits) selected by a row address RA and a column address CA within a certain bank. As described above, in this example as well, 4 bytes of a data area (memory unit area) is selected by a row address RA and a column address CA and associated with the 32 bits of input/output terminals DQ 0 through 31. Therefore, the numbers in an intersection of the row address RA and the column address CA, i.e., "0123", indicate the bytes BY 0, BY 1, BY 2, and BY3 respectively. Also, the volume of the data area may be 4 bits, instead of 4 bytes. In this case, 4 bits of a data area (memory unit area) is selected by a row address RA and a column address CA and associated with 4 bits of input/output terminals DQ 0 through 3. For simplification, the following is an example of the 4-byte data area.

FIG. 10(A) is a conventional example in which 4 bytes of a data area is uniquely determined by a row address RA and a column address CA, and 32 bits of each of 4-byte data areas (memory unit areas) 100 and 101 are always associated with the input/output terminals DQ 0 through 31.

On the other hand, FIG. 10(B) shows the present embodiment in which a 4-byte area specified by a row address RA and a column address CA is placed in front, and any combinations of bytes are made to be associated with the input/output terminals DQ 0 through 31. In the figure, the 4-byte area 100 selected by RA=0 and CA=0 is entirely associated with the input/output terminals DQ 0 through 31. On the other hand, a 4-byte area 102, which starts from the third byte after the two byte shift of the 4-byte area selected by RA=2 and CA=1, is associated with the input/output terminals DQ 0 through 31. In this case, first information (start byte) for determining which byte of the 4-byte area selected by RA=2 and CA=1 to be placed in front, and second information on a byte order (big endian or little endian) in which 4 bytes are arranged continuously in an incrementing direction or decrementing direction from the front byte, or arranged every other byte in the incrementing direction or decrementing direction are provided along with a read command or a write command.

Then, the input/output unit of the image memory extracts a total of 4 bytes out of byte data corresponding to a different column address CA within a page, on the basis of byte combination information consisting of the first and second information, and associates the 4 bytes with the input/output terminals DQ 0 through 31. Then, required 4-byte data is inputted/outputted once from 32 bit input/output terminals DQ.

Figure 11:
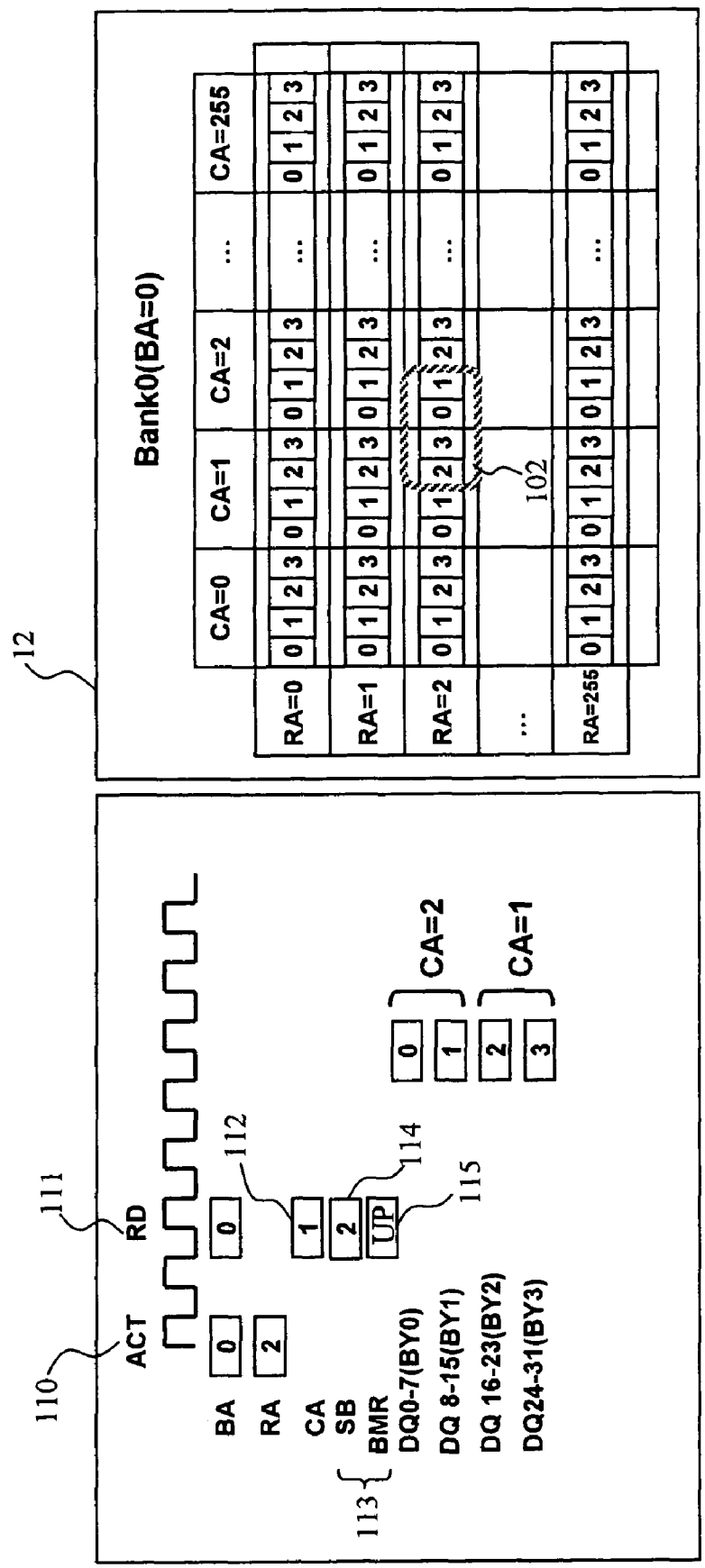
FIG. 11 is a timing chart of the byte boundary functions.

FIG. 11 is a timing chart of the byte boundary functions. This example shows an example of accessing the 4-byte area 102 within the memory map 12. First of all, an active command ACT (110 in the figure) is provided along with a bank address BA=0 and a row address RA=2, the corresponding page area is then subjected to the active operation, a read command RD (111 in the figure) is provided along with the bank address BA=0 and a column address CA=1 (112 in the figure), and, as byte combination information 113, the first information SB=2 (114 in the figure) indicating the amount of byte shift or start byte is provided along with the second information BMR=UP (115 in the figure) indicating the combination pattern.

The image memory associates 2-byte data (BY 2, 3), which is the second half of the 4-byte area selected by a column address CA=1, with 2-byte data (BY 0, 1), which is the first half of the 4-byte area selected by a column address CA=2, in a manner shown by DQ 16-23, DQ 24-31, DQ 0-7, and DQ 8-15, on the basis of the byte combination information SB=2 and BMR=UP. This association is performed in the input/output unit 93 by the byte boundary controller 91 shown in FIG. 9. Therefore, even in the case of data with a different column address, 4-byte data in any combination can be associated with the input/output terminals DQ by providing the read command RD once. The same is true for the write command.

In FIG. 11, the same byte boundary functions can be applied, although the 4-byte area selected by the row address RA and column address CA is 4 bit area. In this case, 4 bit data of the 4 bit area is associated with the input/output terminals DQ 0 through 3.

Figure 12:
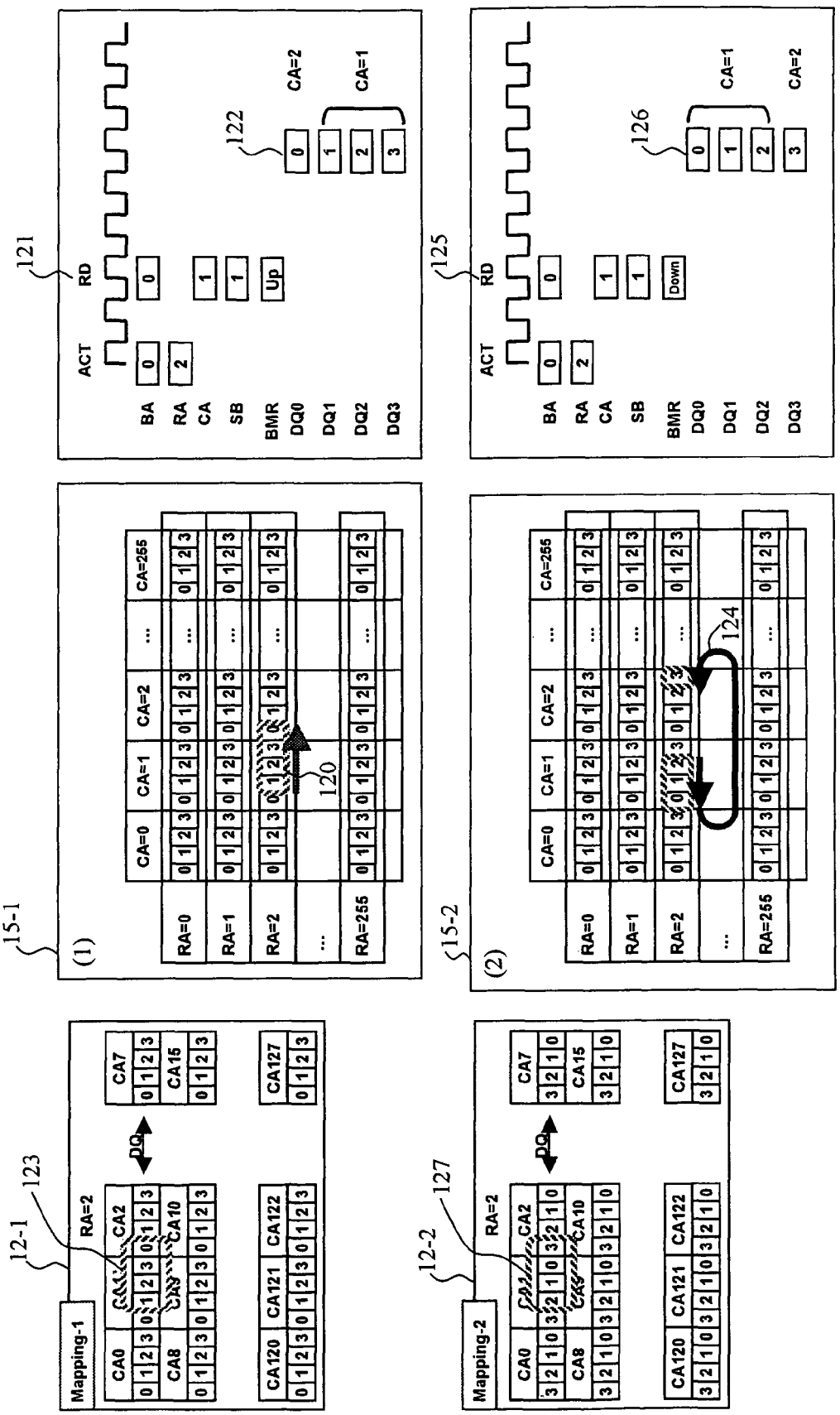
FIG. 12 is a figure for explaining the byte boundary functions for different mapping.

FIG. 12 is a figure for explaining the byte boundary functions for different mapping. In FIG. 12, a memory unit area to be selected by a row address RA and a column address CA is constituted by 4 bits for simplification. The left side of FIG. 12 shows memory mapping 12-1 and 12-2 showing the relationship between pixels of the image and a memory space, the center of FIG. 12 shows logical spaces 15-1 and 15-2 of the memory, and the right side of FIG. 12 shows a timing chart corresponding to the left and center sides of FIG. 12.

"0 through 3", which indicate 4 bits within a 4-bit area selected by a row address RA and a column address CA, are shown within each of the memory logical spaces 15-1 and 15-2, and correspond to the input/output terminals DQ 0 through 3 respectively. Also, "0 through 3", which indicate 4 bits within each memory logical space corresponding to the pixels of the image, are shown in each of the memory mappings 12-1 and 12-2 on the left side. Specifically, the memory mapping shows how each pixel of the image is associated with each of the input/output terminals DQ 0 through 3 of the memory.

In the image system, a system designer can freely associate an image pixel with any of the 4 bit input/output terminal DQ 0 through 3 that are simultaneously accessed using certain addresses BA, RA and CA. The mapping 12-1 is an example of mapping four pixels arranged from left to right in the figure onto the input/output terminals DQ 0 through 3 arranged in the same direction as the incrementing direction of the addresses (from left to right), and this mapping is called "big endian". On the other hand, the mapping 12-2 is an example of mapping four pixels onto the input/output terminals DQ 3 through 0 arranged in the direction opposite to the incrementing direction of the addresses, and this mapping is called "little endian".

In mapping 12-1 and mapping 12-2, the rectangular access is generated in four pixels 123 and 127 between the 6$^{th}$ pixel to the 9$^{th}$ pixel on the upper left corner of the image. However, such mapping is performed in the direction opposite to that of 4 bits within the memory, thus different accesses are required. Specifically, in the case of the mapping 12-1, it is necessary to input/output data with respect to the pixels arranged from left to right in the image, in order of DQ1 within CA=1, DQ2 within CA=1, DQ3 within CA=1, and DQ0 within CA=2, as shown by the arrow 120. In the case of the mapping 12-2, on the other hand, it is necessary to input/output data with respect to the pixels arranged from left to right in the image, in order of DQ2 within CA=1, DQ1 within CA=1, DQ0 within CA=1, and DQ3 within CA=2, as shown by the arrow 124.

The bit combination information items SB, BMR are set in order to respond to such different types of mapping. Specifically, in the case of the mapping 12-1, as shown by 121 in the figure, a starting address constituted by BA=0 and CA=1 and bit combination information constituted by SB=1 and BMR=UP are issued along with a read command RD, and, in response to this issuance, 3 bits of CA=1, i.e., DQ 1, 2 and 3, and DQ 0 of CA=2 are simultaneously outputted as shown by 122 in the figure.

In the case of the mapping 12-2, on the other hand, as shown by 125 in the figure, a starting address constituted by BA=0 and CA=1 and bit combination information constituted by SB=1 and BMR=DOWN are issued along with a read command RD, and, in response to this issuance, 3 bits of CA=1, i.e., DQ0, 1 and 2, and DQ 3 of CA=2 are simultaneously outputted as shown by 126 in the figure.

In this manner, the bit combination information SB and BMR are specified in accordance with the different memory mappings such as big endian and little endian, whereby the image memory can input/output 4 bits simultaneously in response to the memory mapping on the system side. By increasing the types of such bit combination information, a flexible 4 bit access can be realized on various mapping types.

Figure 13:
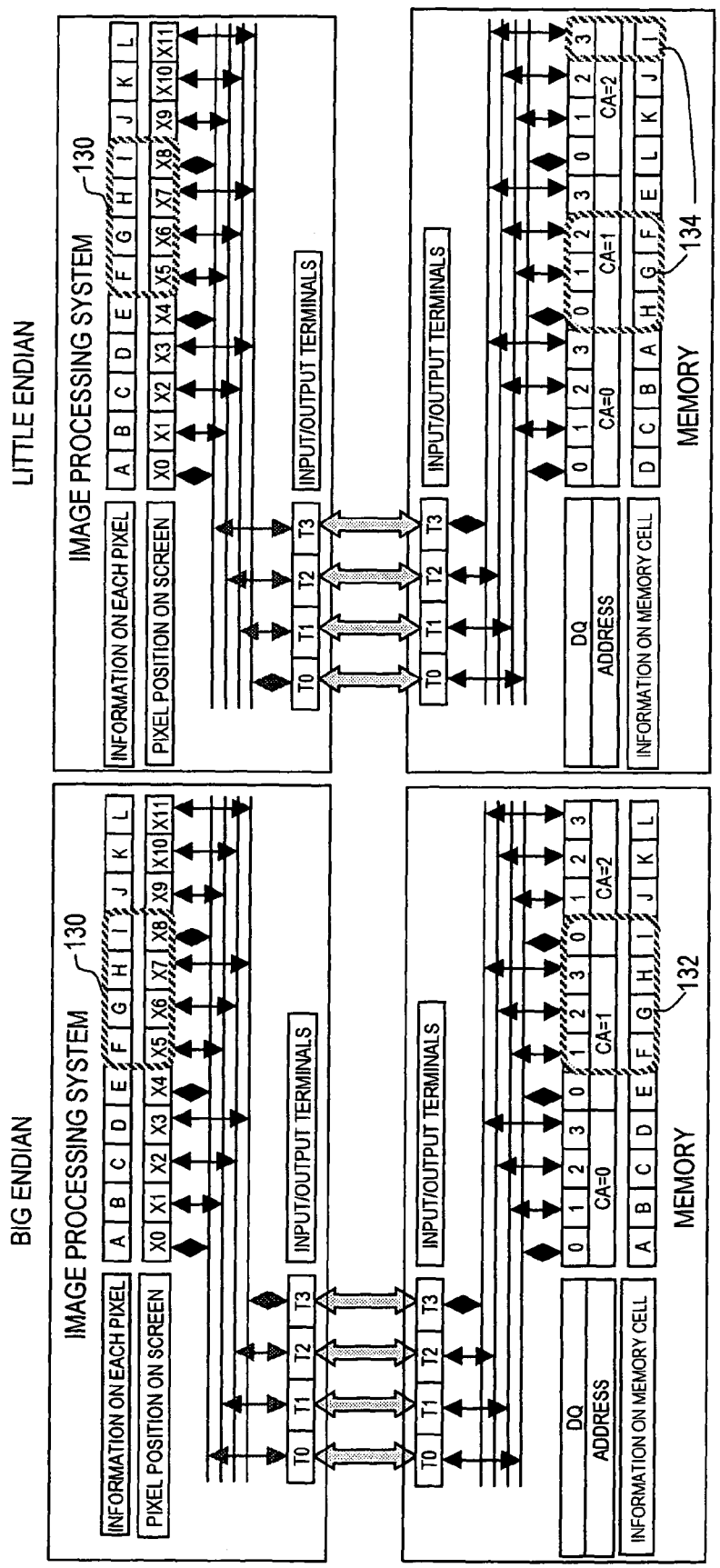
FIG. 13 is a figure for explaining a big endian and little endian shown in FIG. 12.

FIG. 13 is a figure for explaining the big endian and little endian shown in FIG. 12. FIG. 13 shows the image processing system at right and left that uses a memory of which input/output bit widths consist of 4 bits, wherein the left side is a big endian system that uses the direction of the input/output terminals DQ of the memory, i.e., DQ 0 through 3, as a forward direction, while the right side is a little endian system that uses the direction of the DQ of the memory, i.e., DQ 3 through DQ 0, as the forward direction.

Pixel positions (X 0 through X 11) in the screen indicate physical positions on the same screen. "Information on each pixel" that each pixel position has is designated as "A" through "L" in both systems, and this means that both systems display the same image.

In the big endian system, the pixel positions X 0 through 3 are associated with DQ 0 through 3 of address CA 0 of the memory, the pixel positions X 4 through 7 are associated with DQ 0 through 3 of address CA 1 of the memory, and the pixel positions X 8 through 11 are associated with DQ 0 through 3 of address CA 2 of the memory.

In the little endian system, on the other hand, the pixel positions X 0 through 3 are associated with DQ 3 through 0 of the address CA 0 of the memory, the pixel positions X 4 through 7 are associated with DQ 3 through 0 of the address CA 1 of the memory, and the pixel positions X 8 through 11 are associated with DQ 3 through 0 of the address CA 2 of the memory.

Specifically, when comparing the both systems, the relationship between each of the pixels X 0 through 3 within the image processing system and each of the input/output terminals T 0 through 3 in the big endian is opposite to that in the little endian. Therefore, the pixel information "A" of the pixel position X0 is stored in the physical positions (DQ 0 of CA 0 and DQ 3 of CA 0) of different memory cells in the big endian system and the little endian system.

Here, in the case where the image processing system generates a rectangular access (130 in the figure) to pixel information "F-G-H-I" of the pixel positions X 5 through 8, the memory has to access the physical positions 132 and 134 of different memory cells in the big endian system and the little endian system. Therefore, the minimum amount of information items that are required to be supplied to the memory are three information items, i.e., the information BMR on whether the system is the big endian (Up) or the little endian (Down), the address CA having a bit as a starting point, and the positional information SB of the bit which is the starting point within an address.

Figure 14:
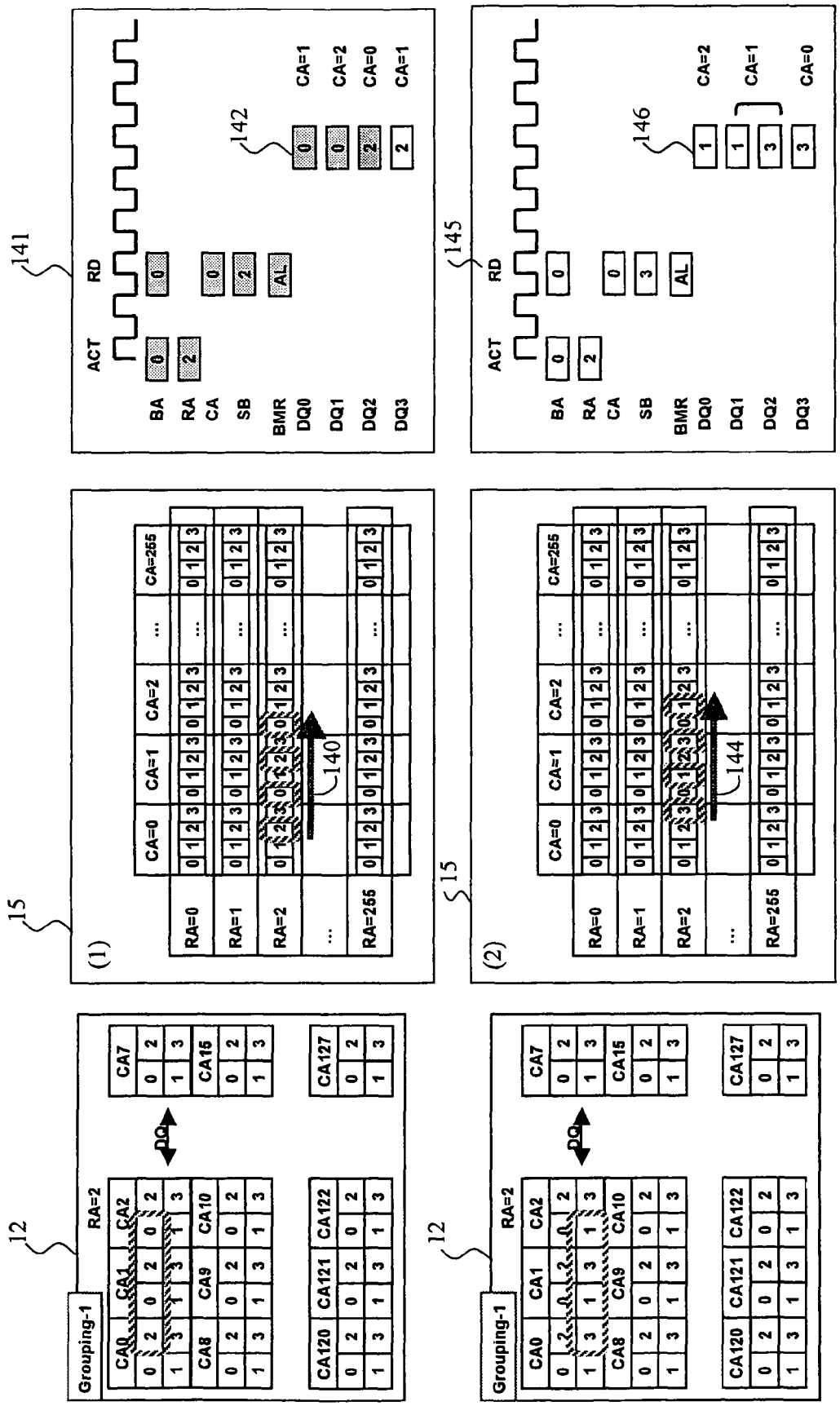
FIG. 14 is a figure for explaining the byte boundary functions in a special memory mapping.

The big endian and the little endian are the same when the memory unit area that is accessed with the addresses RA, CA is a 4-byte area (byte group). FIG. 14 is a figure for explaining the byte boundary functions in a special memory mapping. As FIG. 12, FIG. 14 shows the memory mappings 12 on the left side, the memory logical spaces 15 at the center, and corresponding timing charts on the right side.

In the figure, the memory mappings 12 on the left side each shows which bit of the memory is allocated to each pixel within a frame image. In this example, one pixel is constituted by 2 bits of information. For example, an even-numbered bit holds data on luminance, while an odd-numbered bit holds data on a color difference.

Grouping-1 means a rectangular access that collects only the luminance information (even-numbered bits) of pixels from the second pixel through the fifth pixel, and Grouping-2 means a rectangular access that collects only the color difference information (odd-numbered bits) of pixels from the second pixel to the fifth pixel on the upper left corner. In this case, although both Grouping-1/2 are rectangular accesses made to the second pixel through the fifth pixel on the upper left corner of the image, the accesses from the image processing system to the memory and the input/output terminals DQ that are shown in the timing charts are as follows, due to the difference between the luminance (even-numbered bits) shown by the arrow 140 and the color difference (odd-numbered bits) shown by the arrow 144.

Grouping-1: DQ 0 of CA=1, DQ 0 of CA=2, DQ 2 of CA=0, and DQ 2 of CA=1 are associated with the input/output terminals DQ 0 through 3 respectively (142 in the figure), with respect to the access with CA=0/SB=2, BMR=AL (designation for collecting 4 bits every other bit) (141 in the figure).

Grouping-2: DQ 1 of CA=2, DQ 1, 3 of CA=1, and DQ 3 of CA=0 are associated with the input/output terminals DQ 0 through 3 respectively (146 in the figure), with respect to the access with CA=0/SB=3, BMR=AL (designation for collecting 4 bits every other bit) (145 in the figure).

In this manner, the same DQs (DQ0 and DQ2 in Grouping-1, for example) are accessed simultaneously within the 4-bit area of different column addresses, thus the input/output units for transferring the data to the input/output terminals DQ need to perform processing of switching the terminals for some data, i.e., processing of using a data bus of a different DQ.

FIG. 15 is a figure for explaining the special memory mapping shown in FIG. 14. FIG. 15 shows an image processing system that uses a memory of which the input/output bit width consists of 4 bits, and particularly shows the image processing system that uses an even-numbered DQ of the memory as the luminance information on each pixel, and an odd-numbered DQ as the color difference information on each pixel. FIG. 15(A) shows a case where only the luminance information is accessed, while FIG. 15(B) shows a case where only the color difference information is accessed.

The pixel positions (X 0 through 5) on the screen indicate the same physical positions on the screen on both right and left. The pixel positions hold "A, C, E, G, I, K" respectively as "luminance information", and "B, D, F, H, J, L" respectively as "color difference information".

Here, in the case where the image processing system generates a rectangular access 151 to the luminance information "C-E-G-I" of the pixel positions X 1 through 4, the memory has to access only the even-numbered DQs (153 in the figure) as shown in FIG. 15(A). In the case where the image processing system generates a rectangular access 152 to the color difference information "D-F-H-J", the memory has to access only the odd-numbered DQs (154 in the figure) as shown in FIG. 15(B).

The minimum information items that the memory needs to receive in order to make such accesses are three information items, i.e., information indicating whether the system adopts a method of holding the luminance information in the even-numbered DQs and the color difference information on the odd-numbered DQs (whether access needs to be made every other DQ) (BMR=AL), the address having a bit as a starting point (CA), and position information (SB) of the bit which is the starting point in the 4-bit area of the address. The column address CA and bit combination information SB and BMR are already explained in FIG. 14.

In this case, since the same DQs (DQ0 and DQ2 in Grouping-1, for example) are accessed with different addresses, the input/output unit for transferring the data to the input/output terminals needs to perform the processing of switching the terminals so as to use the data bus of a different DQ. Therefore, a plurality of switches shown by white circles and black circles are provided in the memory, and these switches are controlled based on the above-described information SB and MBR.

Figure 16:
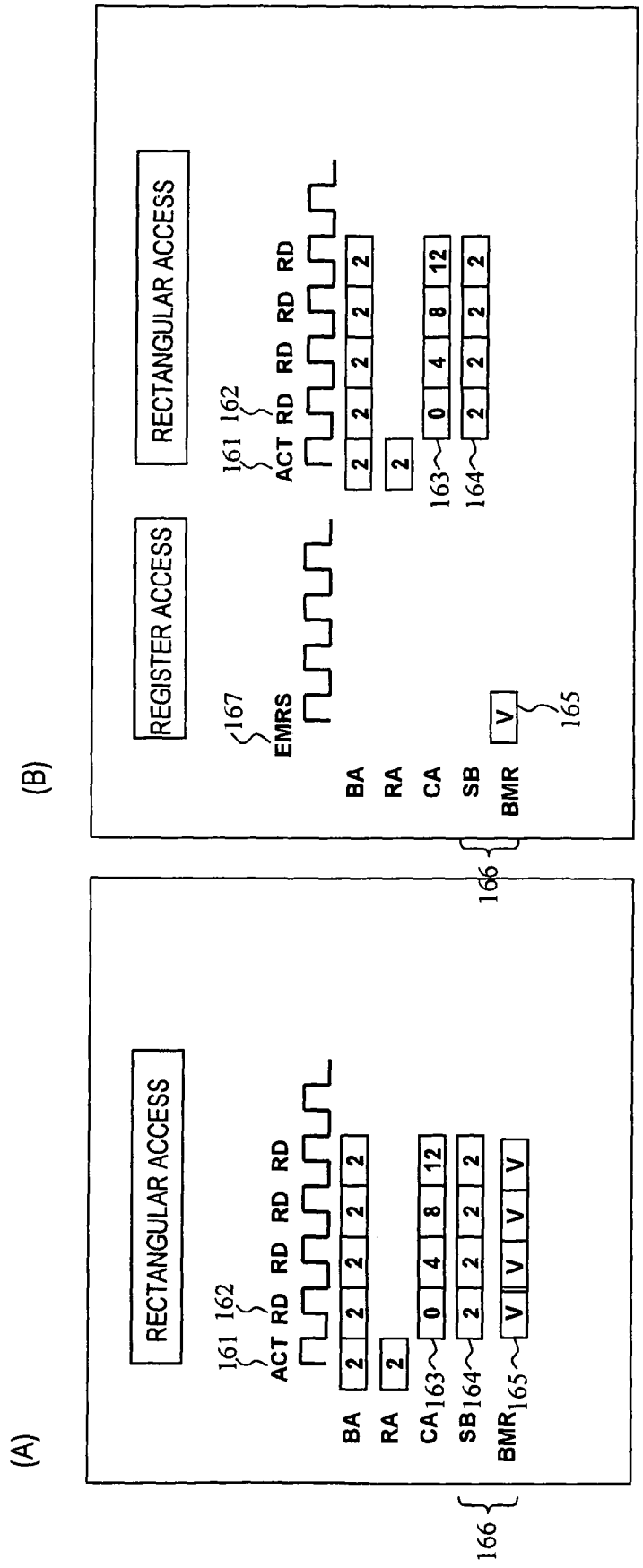
FIG. 16 is a Timing charts showing the byte boundary functions in a rectangular access.

FIG. 16 shows timing charts showing the byte boundary functions in the rectangular access. This rectangular access is an example of accessing the rectangular area 22 shown in FIG. 6. As described above, in the rectangular access, in order to read an arbitrary combination of byte data (bit data) from an arbitrary byte position (or bit position) within a memory unit area (4-byte area or 4-bit area) selected by a column address CA, the starting column address CA and, the first information SB and the second information BMR, byte combination information 166, are required.

FIG. 16(A) is an example in which the byte combination information items SB and BMR are supplied along with a read command RD. A bank address BA=2 and a row address RA=2 are supplied with an active command ACT (161 in the figure), and the first information SB=2 (164 in the figure) indicating the position of the start byte (start bit) and the second information BMR=V (165 in the figure) indicating a combination of bytes (bits) are supplied along with the bank address BA=2 and the column address CA=0 with a following read command RD (162 in the figure). Accordingly, the first 4 bytes (4 bits) of the rectangular area 22 shown in FIG. 6 are outputted to the input/output terminals DQ. The rest of three combinations of 4 bytes (4 bits) of the rectangular area 22 are also specified by the same bank address BA, column address CA, and the byte combination information items SB and BMR.

In FIG. 16(B), out of the byte combination information items SB and BMR, the second information BMR (165 in the figure) is supplied simultaneously with the mode register set command EMRS (167 in the figure) in a register access mode before the active command ACT is issued, and this second information BMR is recorded in the mode register. In a subsequent rectangular access, column access is made based on this second information BMR. The active command ACT (161 in the figure) and a read command RD (162 in the figure) in this rectangular access are the same as those shown in FIG. 16(A) except for the second information BMR.

The abovementioned second information BMR=V can have various information on the big endian (V=UP), little endian (V=DOWN), and the cases where the luminance information is stored in the even-numbered DQs and the color difference information is stored in the odd-numbered DQs (V=AL).

The image system can realize the byte boundary functions in the rectangular access in any methods of (A) and (B) of FIG. 16.

Figure 17:
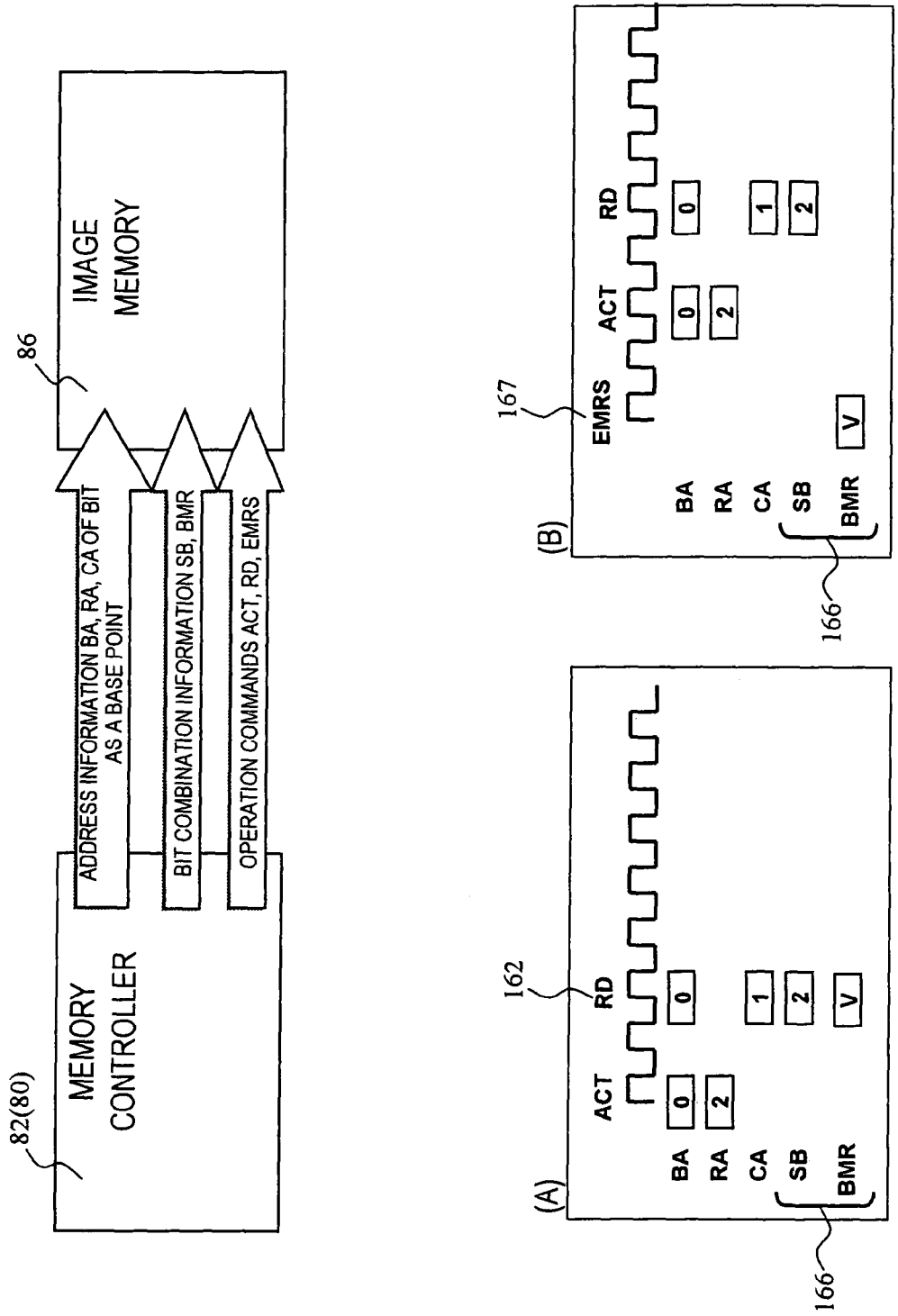
FIG. 17 is a configuration diagram of an image processing system for realizing the byte boundary functions.

FIG. 17 is a configuration diagram of the image processing system for realizing the byte boundary functions. As with FIG. 8, the memory controller 82 for controlling the image memory 86 is provided in the image memory 86. The address information BA, RA and CA, the byte combination information (bit combination information) 166 that is constituted by the first information SB indicating the start byte (start bit) within a 4-byte area (or a 4-bit area) selected by the address information and the second information BMR indicating a byte combination, and the operation commands ACT, RD and EMRS are supplied from the memory controller 82 to the image memory 86.

As described above, in the timing chart (A), a read command RD or a write command WT, which is not shown, is supplied simultaneously with the byte combination information SB and BMR (166 in the figure). Also, in the timing chart (B), a mode register set command EMRS (167 in the figure) is supplied simultaneously with the second information BMR, and the read command RD or the write command WT, which is not shown, is supplied simultaneously with the first information SB.

Figure 18:
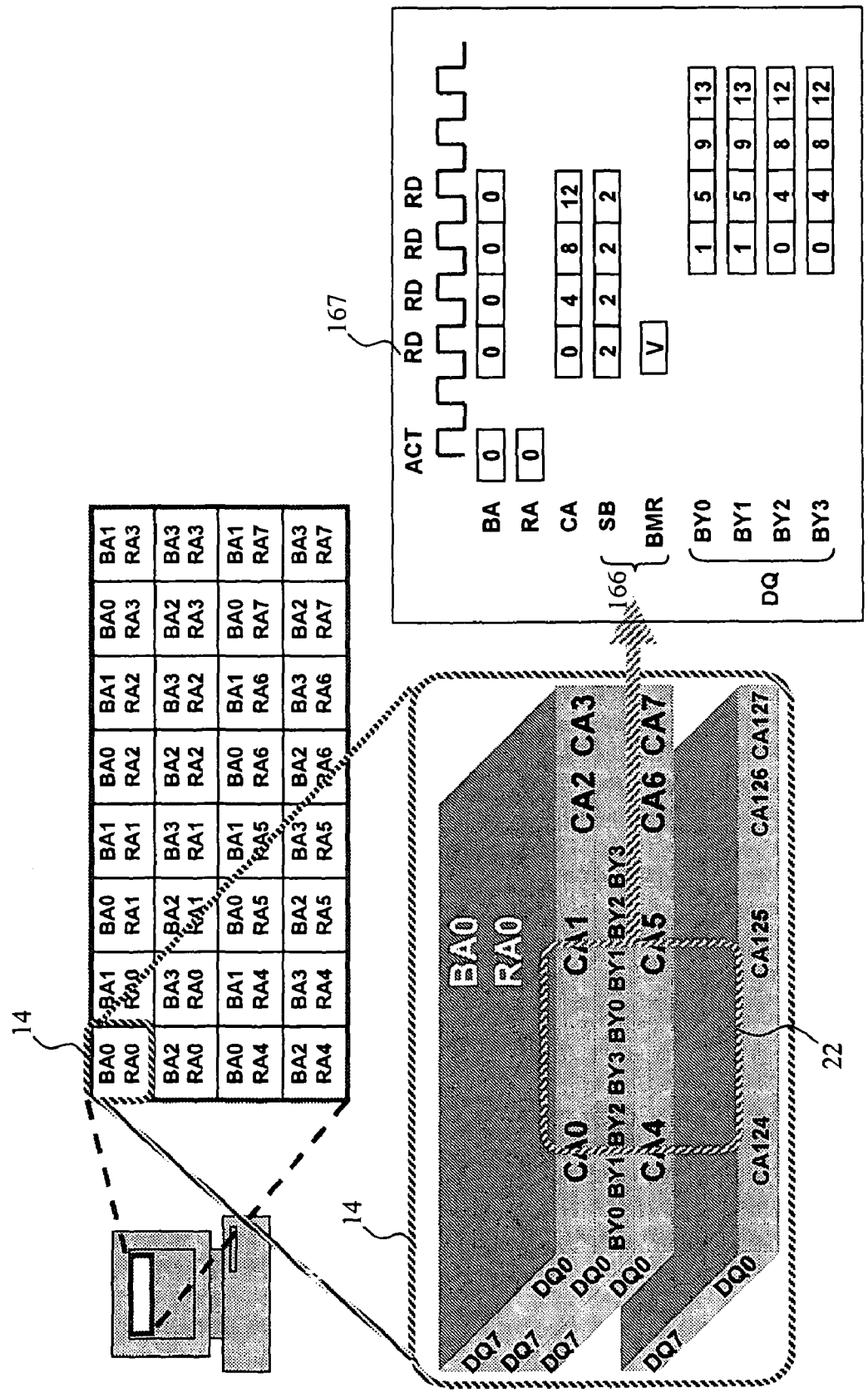
FIG. 18 is a figure showing the byte boundary functions.

FIG. 18 shows the byte boundary functions. This figure shows the same rectangular access as that of FIG. 6. The figures after FIG. 10 explain the examples of a 4 bit memory unit area selected by the column address CA. However, the rectangular access can be made by the byte boundary functions also in the case where the memory unit area consists of 4 bytes as described above. FIG. 18 shows such a case.

In the example shown in FIG. 18, a bank address BA, column address CA, and the byte combination information 166 constituted by the first information SB and second information BMR are issued along with the read command RD (167 in the figure) in order to effectively access the rectangular area 22 within the page area 14 (BA=0, RA=0). In response to this issuance, 4 bytes of data items BY 0 through 3 within the rectangular area 22 are outputted simultaneously to the input/output terminals DQ. The same operation is performed in the case of a write command WT. Specifically, byte data items within CA1, CA1, CA0 and CA0 are associated with the four 4-byte terminals BY 0 through 3 of the input/ output terminals DQ respectively in response to the first read command RD, and byte data items within CA5, CA5, CA4 and CA4 are associated with the four 4-byte terminals BY 0 through 3 of the input/output terminals DQ respectively in response to the next read command RD. The relationship between each column address and each input/output terminal in response to the rest of the read commands RD is as shown in the figure.

In this manner, the bit boundary or byte boundary functions can be realized even in the case where the width of the input/output terminals DQ is 4 bits or 32 bits (4 bytes).

Figure 19:
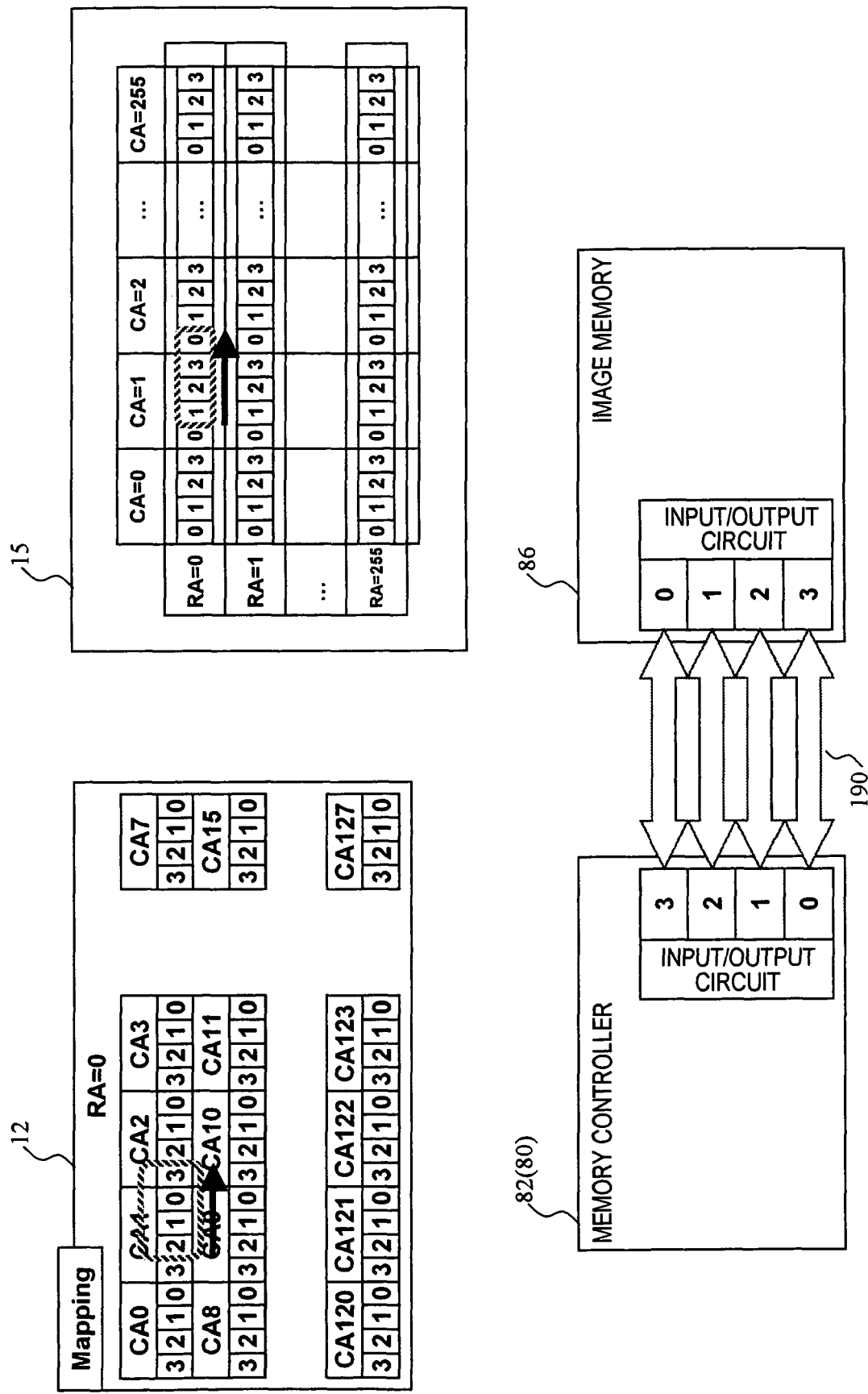
FIG. 19 is a configuration diagram of the image processing system that realizes simplified byte boundary functions.

FIG. 19 is a configuration diagram of the image processing system that realizes simplified byte boundary functions. As described above, in the system designing, either one of the two memory mapping types, i.e., the big endian and the little endian, can be selected. In the above-described embodiment, accordingly, BMR=UP is specified for the big endian and BMR=DOWN is specified for little endian as the second information BMR of the byte combination information so that each pixel of the image can be associated with a byte position within the memory space even when the rectangular access is made shifting from byte to byte.

In the example shown in FIG. 19, in the case where the system in the memory mapping 12 is designed to have a configuration corresponding to the little endian, even if the byte boundary functions for only the big endian can be performed to the system in the memory space 15, the entire system can realize the byte boundary functions for the little endian by providing, between the image memory 86 and the memory controller 82, switching means 190 for switching the input/output terminals.

Specifically, in the case where the memory mapping on the system side is designed for the little endian, the switching means 190 is provided to switch the input/output terminals 0 through 3 in the image memory 86 to 3 through 0 in the memory controller 82. As a result, to the image memory, the system side appears to respond to the big endian. Therefore, even if the system is configured to have a memory only for the second information BMR=UP, the byte boundary functions for the little endian can be realized.

Figure 20:
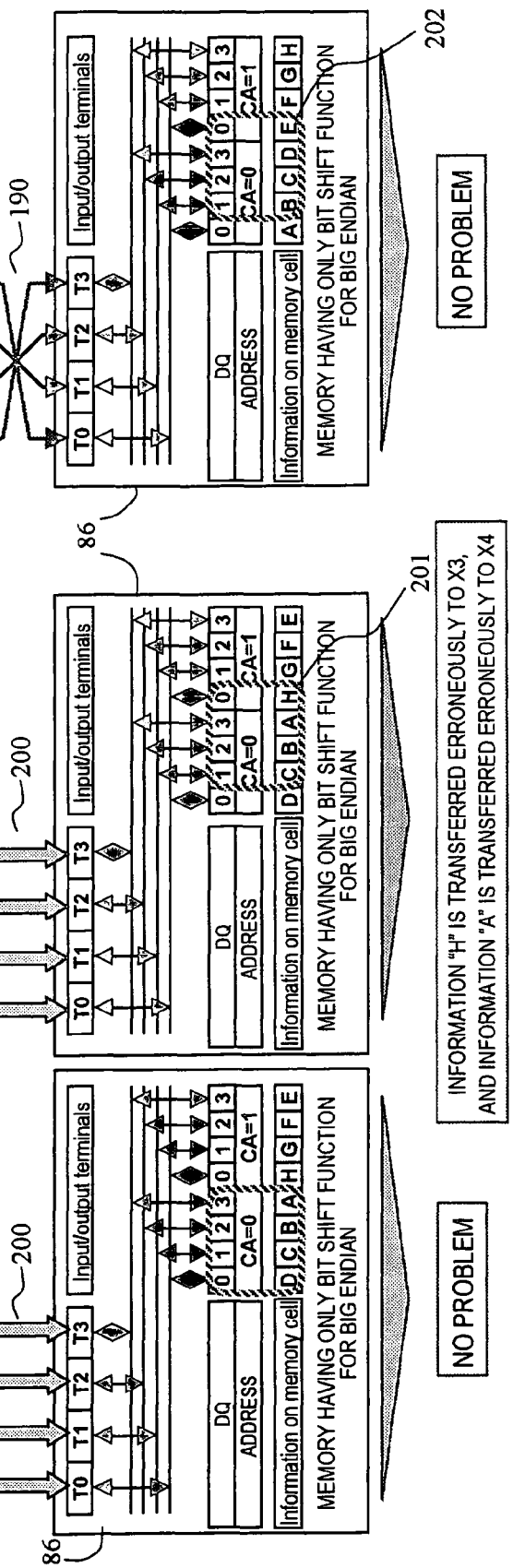
FIG. 20 is a figure for explaining the image processing system that realizes the simplified byte boundary functions shown in FIG. 19.

FIG. 20 is a figure for explaining the image processing system that realizes the simplified byte boundary functions shown in FIG. 19. FIG. 20(1) shows an example in which the image processing system 80 and the image memory 86 are connected to each other via a connecting unit 200 that connects input/output terminals T 0 through 3 without switching them. FIG. 20(2) shows an example in which the image processing system 80 and the image memory 86 are connected to each other via a connecting unit 190 that switches the input/output terminals. In either case, the image memory 86 has the bit boundary functions for only the big endian, while the image processing system 80 is a little endian type which, for associating the 4 bit data, an input/output bit width, associates the pixel positions X 0 through 3 to the input/output terminals T 3 through 0.

In FIG. 20(1), in the case where an access is made in units of addresses (A), the pixel positions (X 0 through 7) on the screen are associated one-on-one with addresses (CA) on the memory side (X 0 through 3 and CA=0, X 4 through 7 and CA=1), thus there is no problem. However, in the case where a signal SB is specified to make an access in units of bits (B), a shift in the pixel positions (X 1 through 4 (BCDE), 200 in the figure) does not match with a shift in the physical positions of memory cells (CBAH, 201 in the figure) in the memory where the only bit boundary functions (BMR=UP only) corresponding to the big endian exists, thus wrong data CBAH is transferred. In this case, the BCDE on the memory cells can be outputted by means of the bit boundary functions (BMR=DOWN) corresponding to the little endian. However, if the bit boundary functions that are capable of responding to both the big endian and the little endian are provided in the memory, increase in costs is caused.

Therefore, as shown in FIG. 20(2), the connecting unit 190 for cross-connecting the input/output terminals on the system side and the memory side is provided so that the pixels X 0 through 3 on the image correspond to the DQ 0 through 3 on the memory cells, whereby the image processing system 80 for little endian appears to the memory 86 to be a system for big endian. Accordingly, the shift 200 of the pixel positions matches with the shift 202 of the physical positions of the memory cells, and thereby normal data BCDE can be transferred even if an access is made while shifting bits so as to respond to the big endian.

As described above, by using the connecting unit 190 capable of performing cross-conversion to switch the terminals connecting the system and the memory, even in the case of the memory having the bit boundary (or byte boundary) functions for big endian, the bit boundary (or byte boundary) functions can be realized in the image processing system for little endian. Moreover, in the case of the memory having the bit boundary (byte boundary) functions for both big endian and little endian, the memory and the system may be connected to each other via the connecting unit 200 that makes connection without switching the terminals.

Figure 21:
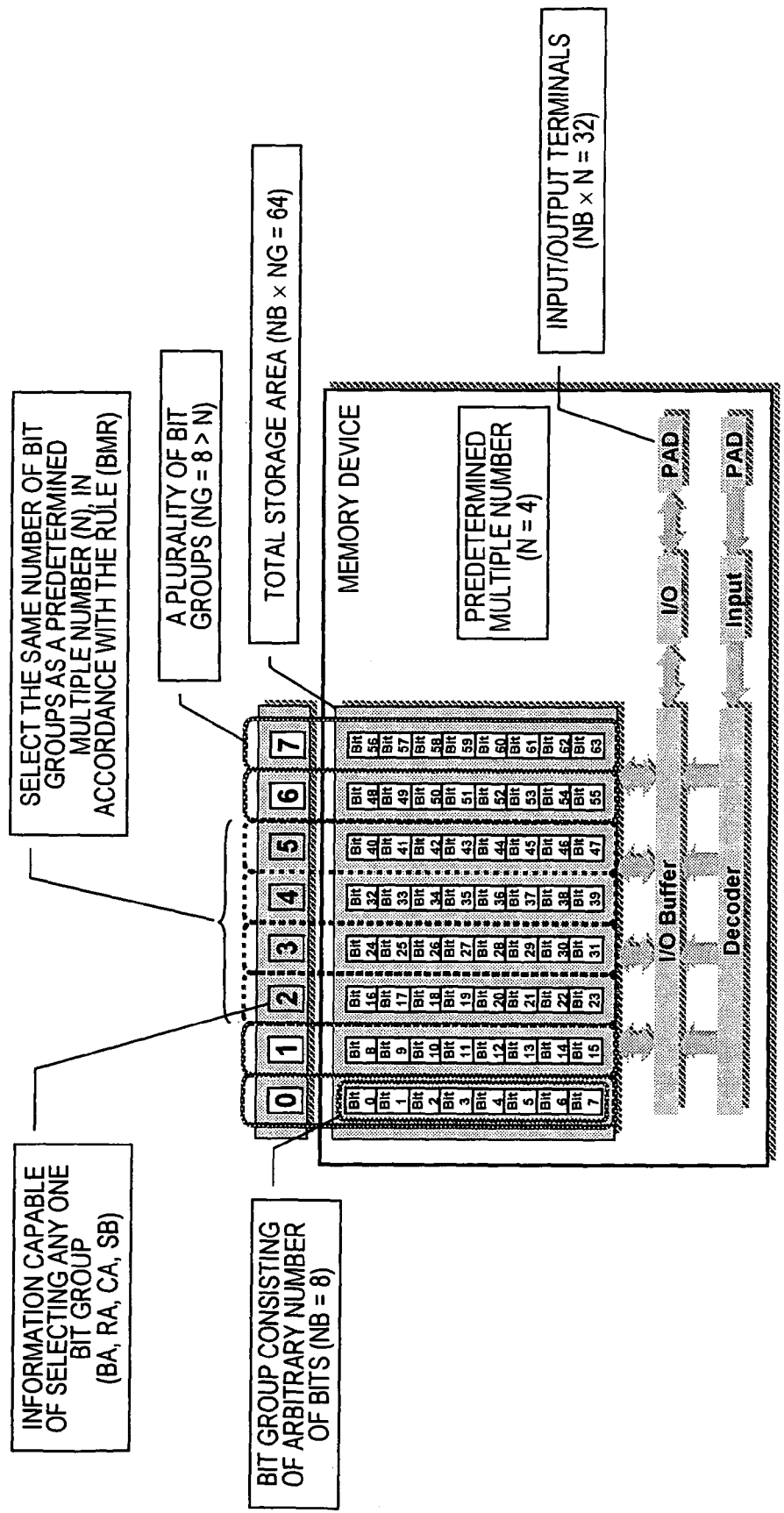
FIG. 21 is a figure showing a schematic configuration of a memory having the byte boundary functions.

FIG. 21 is a figure showing a schematic configuration of the memory having the byte boundary functions. This memory is configures a bit group with at least one or an arbitrary number (Nb) of bits, and has input/output terminals (Nb×N), which is the multiples (N), that is two or more of the arbitrary number (Nb) of bits. A plurality of bit groups (Ng), the number of which is higher than the predetermined multiple number (N), configures the entire storage area (Nb×Ng). Address information that can select any one of the plurality of bit groups (Ng) is received in synchronization with a first operation code. The one bit group that is selected by the address information is taken as a starting point, and the same number of bit groups as the multiple number (N) are selected in accordance with a predetermined rule. A plurality of bits (Nb×N) corresponding to the selected bit groups simultaneously deliver and receive stored information via input/output terminals (Nb×N).

The arbitrary number of bits (Nb) described above means concept including both bit units and byte units, and Nb=8 (1 byte) is set according to the above-described embodiment. Also, the multiple number (N) explains that data items of many times of the arbitrary number of bits (Nb) are accessed from one address, and Nb×N corresponds to the number of input/output terminals. N=4 is set according to the above-described embodiment, thus the multiple number corresponds to the input/output terminals, the number of which is equivalent to 4 bytes. More concretely, the number of input/output terminals is Nb×N, thus the number of input/output terminals=32 (=8×4).

Also, Ng indicating the plurality (Ng) of bit groups is the number of groups of all bits or bytes (groups of Nb bits) that the memory has, and is equivalent to the number obtained by dividing the capacity of the entire storage area by Nb. Normally, the number of Ng is much larger than the multiple number (N) that is the number of bit groups inputted/outputted at once. For example, in the case of a 64 M-bit memory, if Nb=1, Ng=64M, and if Nb=8, Ng=8M. According to the previous examples, when considering the 64 M-bit memory, if Nb=8, Ng=8M. According to the previous examples, the address information that can select any one bit group is information (SB) indicating a bit which is a starting point of an address (BA, RA, CA), wherein data that is narrowed down to 4 bytes by the address (BA, RA, CA) is limited to a byte as a starting point by the information (SB) indicating a byte as a starting point.

Selecting the same number of bit groups as the multiple number (N) in accordance with a rule means that, according to the previous examples, a plurality of bytes are selected in accordance with the information on a combination of bytes (BMR) that are selected simultaneously with a start byte. Since N=4, when BMR=Up, 4 bytes that continue in the Up direction can be accessed simultaneously from an arbitrary byte.

The image processing system accesses, via 32-bit (=Nb× N) input/output terminals, 4 bytes that are selected by the information capable of selecting any one bit group (1 byte according to the previous examples) (BA, RA, CA), the information on a byte that is a starting point (SB), and the information on a combination of bytes (BMR) that are accessed simultaneously.

The amount of memory of a memory device shown in FIG. 21 is 64 bits. Therefore, eight (Ng=8) bit groups with Nb=8 bits exist. The address (BA, RA, CA) and the start byte (SB) are constituted by a total of 3 bits, thus one bit group is selected from the Ng=8 bit groups. Moreover, the bit groups (N=4) that are accessed simultaneously are determined by the combination information (BMR). Therefore, in the example shown in FIG. 21, a second group is selected by the address (BA, RA, CA) and the start byte (SB), and four groups (group 2 through group 5) following the second group are accessed simultaneously from the input/output terminals by means of the combination information BMR=UP.

If the address is incremented by one bit in the same 64 bit memory, the number of bit groups with a bit unit of 4 (Nb=4) is 16 (Ng=16), and if the input/output terminals remain Nb×N=32, the predetermined multiple number becomes 8 (N=8), thus seven other bit groups are selected by the combination information BMR.

[Memory with Byte Boundary Functions]

The configuration of the image memory having the byte boundary functions is described next in detail. According to the byte boundary functions, 4 bytes of data beyond a memory unit area (4-byte area) can be selected, the memory unit area being selected by the column address. Therefore, functions for inputting/outputting 4-byte to be required data are added to the memory. Hereinafter, for simplification, there is described an example in which only the first information SB (referred to as "start byte" or "start bit") is provided as the byte combination information. The second information BMR is an example of UP only.

[Example of Internal Column Control]

First of all, several specific examples of column control performed on the inside of the memory are described.

Figure 22:
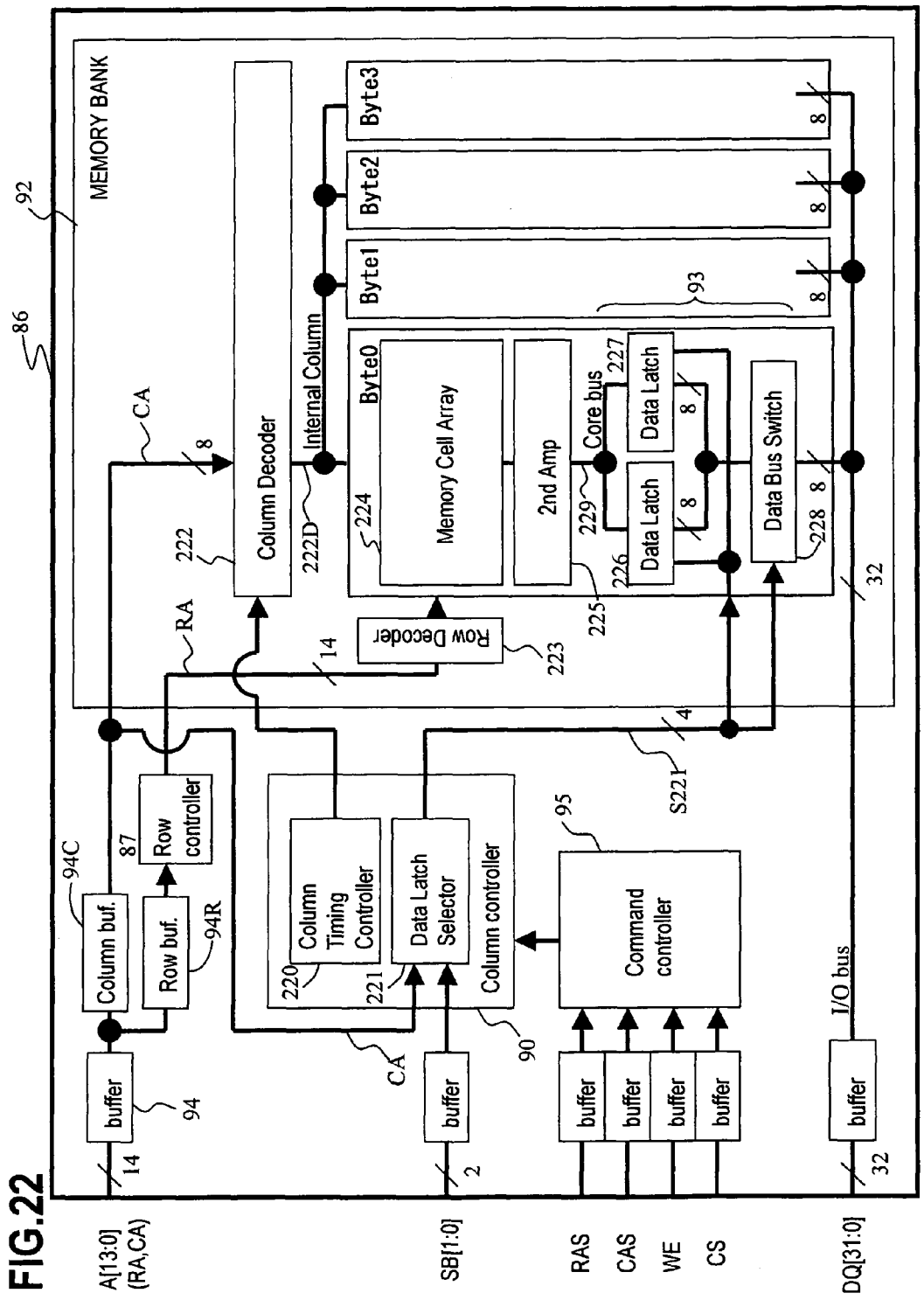
FIG. 22 is a figure showing a first example of the image memory having the byte boundary functions.

FIG. 22 shows a first example of the image memory having the byte boundary functions. FIG. 23 is a figure for explaining the operation in FIG. 22.

As shown in FIG. 22, the same components as the image memory shown in FIG. 9 are applied with the same reference numbers. An address signal A is inputted by a multiple system. A row address RA is latched into a row address buffer 94R, and a column address CA is latched into a column address buffer 94C. The row controller 87 supplies the row address RA to a row decoder 223 of a selected memory bank 92. The column address CA within the column buffer 94C is also supplied to a column decoder 222 of the selected memory bank.

The memory bank 92 is divided into byte areas 0 through 3, which are four memory blocks. Each byte area has a memory cell array 224, a second amplifier 225, a pair of data latches 226 and 227, and a data bus switch 228, and inputs/outputs one byte (8 bits) of data at one access. A total of 32 bits (4 bytes) of data are inputted/outputted to an I/O bus from the four byte areas. The I/O bus is connected to 32 bits of input/output terminals DQ 0 through 31 via buffers. It should be noted that FIG. 22 shows only one memory bank 92, and the remaining three memory banks are omitted.

The column controller 90 has a column timing controller 220 for controlling the timing for operating the column decoder 222, and a data latch selector 221 for controlling the data latch circuits 226 and 227 and the data bus switch 228. The data latch selector 221 controls the data latch circuits 226 and 227 and data bus switch 228 within each of the byte areas 0 through 3 in response to a column address CA and a start byte SB.

As shown in FIG. 23, suppose that 4 bytes of data from the second byte of a column address CA 0 to the first byte of a column address CA 1 within a page area of a row address RA 0 are accessed. Therefore, start byte SB=1 is established.

The memory chip 86 shown in FIG. 23 shows the relationship between the memory space and input/output terminals DQ. In FIG. 23, a 4-byte data item of a memory unit area that is selected by a column address CA once is indicated by Q 00 through 15. Specifically, 4-byte data items Q 00 through 03 are selected by a column address CA 0, and 4-byte data items Q 04 through 07 are selected by a column address CA 1.

The right side of FIG. 23 shows a timing chart. First, a bank address, which is not shown, and a row address RA 0 are provided along with an active command ACT, so that a word line within a corresponding bank is driven, and then a sense amplifier is activated. Thereafter, the column address CA 0 and a start byte signal SB=1 as the bank combination information are provided along with a read command RD. In response to this, the column decoder 222 within the selected memory bank 92 outputs an internal decode signal 222D corresponding to the column address CA 0 and an internal decode signal 222D corresponding to CA 1 obtained by incrementing CA 0 by one to four byte areas 0 through 3 in a time-sharing manner. Two 1-byte data items corresponding to CA 0 and CA 1 respectively are cached to the data latch circuits 226 and 227 in each byte area. Then, the data bus switch 228 outputs either one of the 1-byte data items, which are selected in accordance with the combination of CA 0 and SB 1 in each byte area, from the data latch circuit 226 and 227 to the I/O bus. Specifically, the data items Q 01, Q 02 and Q 03 of CA 0 and the data item Q 04 of CA 1 are outputted to the I/O bus. When the write operation is performed, the 1-byte data is inputted to either one of the data latch circuits from the I/O bus.

Specifically, the column decoder selects column lines (bit lines) equivalent to one byte in each byte area at one access. When the read operation is performed, data equivalent to 1 bytes are selected from the memory cell array 224 of each byte area, are then amplified by the second amplifier 225 and cached to the data latch circuits 226 and 227. At this moment, memory cells that are mapped by the same column address CA are accessed in each byte area. In order to realize a byte boundary access made across the boundaries of the memory unit areas (four byte areas) that can be selected by the column address, the column decoder 222 selects a column line again after ending the first access. The address of this column line is CA 1, which is an address after the previous address CA 0. 1 byte of data that is read from the memory cell array 224 is amplified by the second amplifier, and cached to the data latch circuit 227 different from the first access.

Therefore, 8 bytes of data items, which are twice as large as the 4-byte data required by the input/output terminals DQ in one access, are present in the data latch circuits 226 and 227, thus the data bus switch 228 selects 1 byte of data, i.e., half data, from 2-byte data cached to the data latch circuits of each byte area, and transfers this data to the I/O bus. The data latch selector 221 controls cache operation on the data latch circuits 226 and 226 within each byte area and switching operation on the data bus switch 228, in response to the column address CA0 and the start byte signal SB=1. Accordingly, byte data corresponding to different column address CA 0 and CA 1 can be transferred from each byte area to the I/O bus.

As a result, as shown in FIG. 23, 4-byte data items Q 04, Q 01, Q 02 and Q 03 are transferred to the input/output terminals DQ respectively via the I/O bus. In this manner, the input/output unit 93 is configured by the second amplifier 225, data latch circuits 226 and 227, and data bus switch 228.

Figure 24:
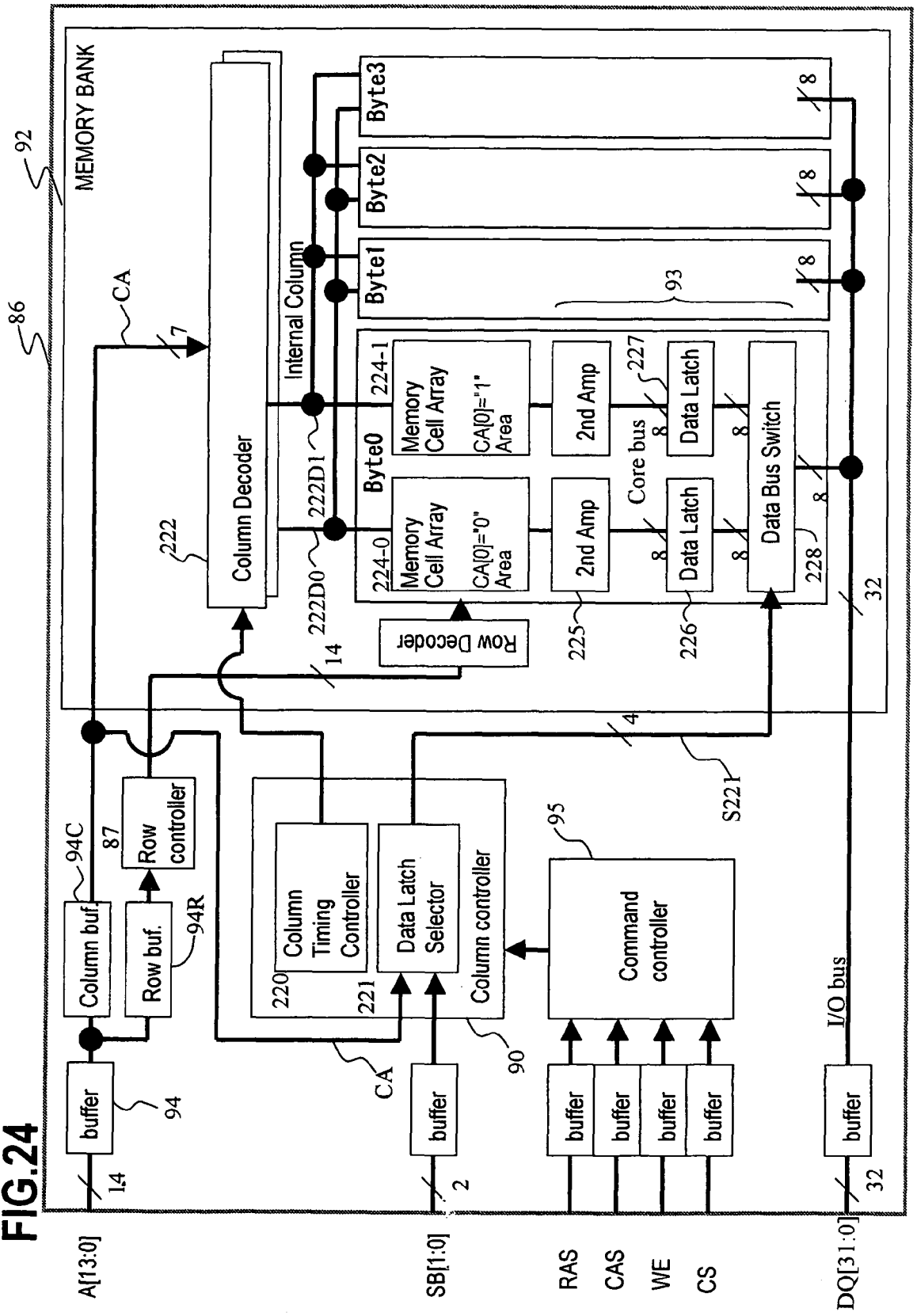
FIG. 24 is a figure showing a second example of the image memory having the byte boundary functions.

FIG. 24 shows a second example of the image memory having the byte boundary functions. FIG. 25 is a figure for explaining the operation shown in FIG. 24.

The configuration shown in FIG. 24, which is different from that of FIG. 22, is that, in each of the byte areas 0 through 3 within the memory bank 92, the memory cell array is divided into two arrays, 224-0 and 224-1, and the second amplifier 225 and the data latch circuits 226 and 227 are provided in each array. A pair of memory cell arrays 224-0 and 224-1, corresponds to an even number column address CA (CA[0]=0) and to an odd number column address CA (CA[0]=1). The column decoder 222 does not output decode signals of CA 0 and CA 1 from the given column address CA 0 in a time sharing manner, but outputs two decode signals 222D0 and 222D1 simultaneously to the pair of memory cell arrays 224-0 and 224-1. In response to this, the pair of memory cell arrays each outputs 1-byte data to the data latch circuits 226 and 227. Accordingly, byte areas cache simultaneously 2-byte data of a provided column address CA and, the column address obtained by incrementing the column address CA by one. Then, the data latch selector 221 controls switching of the data bus switch 228 in response to the column address CA and the start byte signal SB, and transfers required 1-byte data to the input/output bus. Each of the four byte areas outputs 1-byte data, thus a total of 4 bytes of data are outputted from the input/output terminals DQ.

In the case of a write command, the 4-byte data that is supplied to the input/output terminals DQ is stored into the two data latch circuits 226 or 226 via the data bus switch 228 that is switched and controlled in response to the column address CA and the start byte signal SB, and then written to the two memory cell arrays 224-0 or 224-1.

FIG. 25 shows an operation performed when start byte signal SB=1 and burst length BL=4. The column address CA 0 and the start byte signal SB=1 are supplied along with a read command RD, and, when the burst length BL=4 is set by the mode register, the column decoder 222 supplies decode signals 222D0, 222D1 corresponding to the column addresses CA 0 and CA 1 to each of the byte areas 0 through 3 simultaneously, the column address CA 1 being obtained by incrementing the column address CA 0 by one. In response to this, the pair of memory cell arrays 224-0 and 224-1 of each byte area each outputs 1-byte data to the data latch circuits 226 and 227 via the second amplifier 225. Accordingly, 2 bytes of data are cached from each byte area. Then, based on the column data CA and the start byte signal SB, the data latch selector 221 supplies to the data bus switch 228 a control signal S221 for selecting data of either one of the data latch circuits in each byte area (1 bit in four byte areas, i.e., a total of 4 bits), and then controls the switching operation within the data bus switch. As a result, 4 bytes of data items Q 04 and Q 01 through 03 are transferred to the I/O bus in the first cycle.

In FIG. 25, since the burst length BL=4, the column decoder 222 issues the decode signals 222D0 and 222D1 corresponding to column addresses CA 2, CA 3 in response to the control performed by the column timing controller 220, so as to further caches 8 bytes of data to the data latch circuits 226 and 227. Since the data latch circuits 226 and 227 need to hold 8-byte data of CA 0 and CA 1 as well, each of the data latch circuits is configured so as to be able to hold 2 bytes of data. As a result, new 8-byte data Q 08 through 15 are latched to the data latch circuits. Then, the data bus switch 228 transfers to the input/output bus 4-byte data Q 05 through 08 among the 8-byte data Q 00 through 07 held in the previous clock cycle and 8-byte data Q 08 through 15 held in the present clock cycle. Therefore, the selected signal S221 of the data latch selector 221 in this case consists of 8 bits (2 bits in each byte area).

In the next clock cycle, the column decoder 222 issues decode signals 222D0 and 222D1 corresponding to column address CA 4 and CA 5, and further caches 8 bytes of data Q16 through Q23 to the data latch circuits. Then, the data bus switch 228 transfers 4 bytes of data Q 09 through 12. In the next clock cycle, the data bus switch 228 transfers 4 bytes of data Q 13 through 16 to the input/output bus. At this moment, it is not necessary to cache new 8-byte data from the memory cell arrays.

As with the above explanation, the write operation is performed such that, if the burst length BL is 4, 4 bytes of data are supplied to the input/output terminals DQ in four cycles, and then stored in the data latch circuits 226 and 227 via the data bus switch 228. Then, in response to the decode signals of the column addresses CA 0, 1, CA 2, 3, and CA 4, 5 from the column decoder 222, a total of 16 bytes of data are written to the memory cell arrays in three cycles.

FIG. 26 shows an operation of a modified example (1) of the second example of the image memory having the byte boundary functions. In the example shown in FIG. 25, each of the byte areas 0 through 3 caches 2-byte data to the pair of data latch circuits 226 and 227. However, in the modified example shown in FIG. 26, in a first column control after a read command RD, the column decoder 222 issues the internal decode signals 222D0 and 222D1 of the column address CA 0 and CA 1 simultaneously and each byte area caches 2-byte data to the pair of data latch circuits simultaneously. Then, in the subsequent cache operation, the column decoder 222 issues the internal decode signal 222D0 of the even numbers (CA 2, CA 4) and the internal decode signal 222D1 of the odd number (CA 3) alternately, and each byte area caches 1-byte data to the pair of data latch circuits 226 and 227 alternately.

Specifically, 8 bytes of data Q 00 through 07 are cached first, and thereafter 4 bytes of data Q 08 through 11, Q 12 through 15, and Q 16 through 19 are cached to the data latch circuits. Then, the data bus switch 228 transfers the 4 bytes of data DQ 1 through 4, Q 05 through 08, Q 09 through 12, and Q 13 through 16 to be transferred, to the input/output bus sequentially. In this case as well, the selected signal S221 of the data latch selector 221 consists of 8 bits (2 bits in each byte area). As described above, in the read operation, the memory cell arrays cache the data to the data latch circuits in four cycles by means of the decode signals of the column addresses, and the data transfer operation with respect to the input/output bus from the data latch circuits is also performed in four cycles.

In the case of writing operation as well, 4 bytes of data are supplied to the input/output terminals DQ in four cycles, and stored in the data latch circuits 226 and 227 via the data bus switch 228 in four cycles. Thereafter, in response to the decode signals of the column addresses CA 0/1, CA 2, CA 3 and CA 4 from the column decoder 222, a total of 16 bytes of data are written to the memory cell arrays in four cycles.

FIG. 27 shows an operation of a modified example (2) of the second example of the image memory having the byte boundary functions. This example is applied to a DDR (Double Data Rate). An SDRAM of the DDR performs input and output of data from DQ terminals at both rising edge and a trailing edge of a clock CLK. Specifically, 4 bytes of data Q 05 through 08 are inputted/outputted at the rising edge, and 4 bytes of data Q 09 through 12 are inputted/outputted at the trailing edge.

Since the input/output rate is doubled in this manner, it is necessary to double the amount of data in the memory that needs to be cached. In the example shown in FIG. 27, 16 bytes of data Q 00 through 03, Q 04 through 07, Q08 through 11, and Q 12 through 15 are cached simultaneously to the data latch circuits in a first cache cycle after a read command RD, and 4 bytes out of the 16 bytes of data, i.e., Q 05 through 08, are transferred to the I/O bus at the rising edge of a clock, and the next 4 bytes of data Q 09 through 12 are transferred to the I/O bus at the trailing edge of the clock.

In order to enable such collective caching of the 16-byte data as shown in FIG. 27, the memory is divided into four memory cell arrays within each of the byte areas 0 through 3 shown in FIG. 24, and the second amplifier and the data latch circuits are provided in each array. Then, in each of the byte areas, the column decoder 222 provides internal decode signals of the respective column addresses CA 0 through 3 to the four memory cell arrays in response to the starting column address CA 1, and then 4 bytes of data are cached to four data latch circuits. Thereafter, 1-byte data of the data latch circuit selected by the data bus switch 228 is transferred to the input/output bus from the four data latch circuits by the data latch select signal S221. In the figure, a core bus corresponds to the input/output bus of the memory cell arrays, and the data of the core bus is cached to the data latch circuits.

It should be noted that the example shown in FIG. 27 is configured without considering an LSB (CA[0]) of an input column address CA, and that data items corresponding to column addresses CA 0 through 3 are always accessed in the case of input column address CA 0 or CA 1. Specifically, column addresses to be paired are fixed regardless of whether the input column addresses are designated as odd numbers or even numbers.

Moreover, in the next clock cycle, the column decoder 222 issues internal decode signals of column addresses CA 4 through 7 to the four memory cell arrays, and further caches 4 bytes of data to the four data latch circuits. Accordingly, 16 bytes of data Q 16 through 31 are latched to the data latch circuits, and selected 4 bytes of data out of the 16 bytes of data, i.e., Q 13 through 16, and 4 bytes of data Q 17 through 20 are outputted at the rising edge and the trailing edge of the clock respectively.

In the write operation, write data is written in a direction opposite to the above-described direction into the memory cell arrays from the input/output terminals DQ via the data latch circuits.

In the case of FIG. 27 as well, the data latch select signal S221 is a control signal consisting of 2 bits in each byte area, i.e., a total of 8 bits. Such data latch select signal is generated by the data latch selector 220 within the column controller 90 in response to a column address CA and start byte signal SB.

FIG. 28 shows an operation of a modified example (3) of the second example of the image memory having the byte boundary functions. As with FIG. 27, FIG. 28 is an operation example corresponding to the DDR, and the difference with FIG. 27 is that a combination of column addresses to be accessed simultaneously in a column direction is different in accordance with whether an input column address CA is designated as an odd number or even number. Specifically, data items that correspond to CAs obtained by incrementing the input column address CA by one, two and three are accessed simultaneously. In other words, in the case of an input column address CA 1, data items of CA 1, CA 2, CA 3 and CA 4 are accessed. Specifically, the column decoder monitors the LSB (CA[0]) of the input column address CA to determine column addresses to be accessed simultaneously.

As shown in FIG. 28, the column decoder generates internal decode signals 222D 0 through 3 of CA 1 through 4 for the input column address CA 1, then 4 bytes of data for each byte area, i.e., a total of 16 bytes of data, are cached to the data latch circuits. Then, internal decode signals 222D0 through 3 of CA 5 through 8 are generated in the next clock cycle, and 6 bytes of data are cached. Therefore, the 16-byte data to be cached are obtained by shifting 4 bytes in FIG. 27.

Therefore, the read operation and write operation shown in FIG. 28 can be realized in the same memory configuration as the one shown in FIG. 27.

Figure 29:
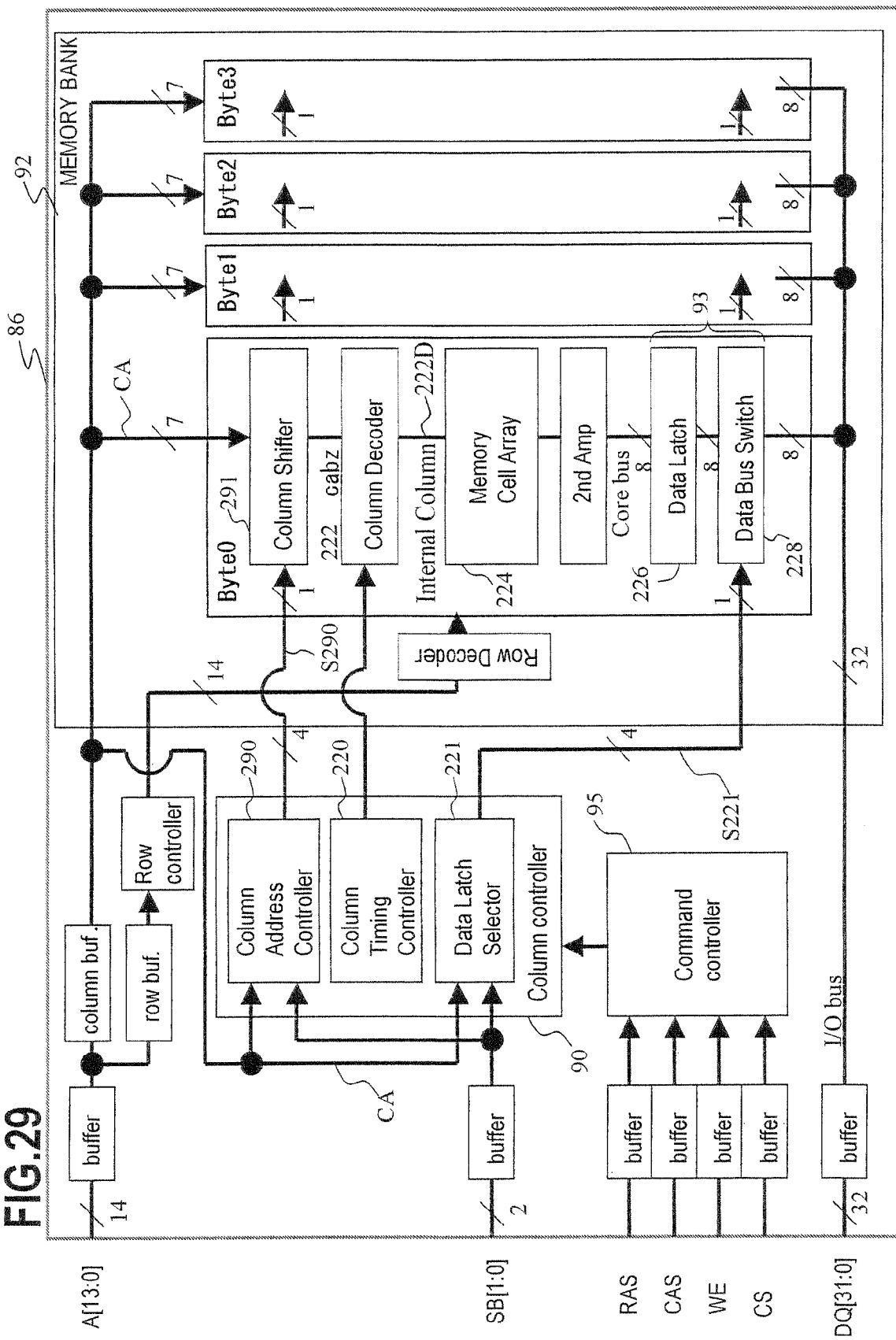
FIG. 29 is a figure showing a third example of the image memory having the byte boundary functions.
Figure 30:
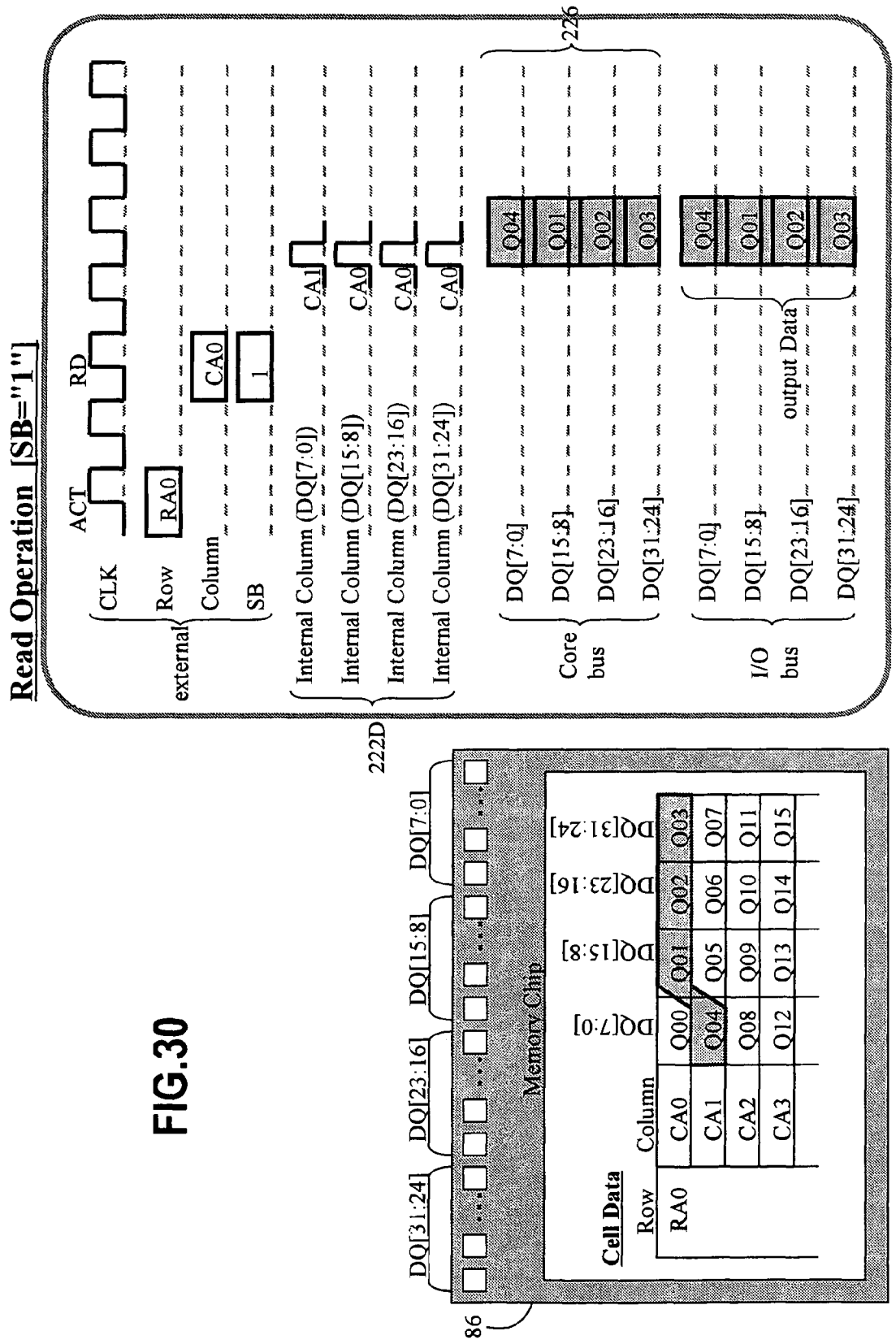
FIG. 30 is a figure for explaining the operation shown in FIG. 29.

FIG. 29 shows a third example of the image memory having the byte boundary functions. Also, FIG. 30 is a figure for explaining the operation shown in FIG. 29. In the third example, 4 bytes of data Q 01 through 04 to be inputted/outputted by the byte boundary functions are transferred to/from the input/output bus by accessing each of the byte areas 0 through 3 in one column access. Specifically, unlike the first and second examples described above, in order to access 4 bytes of data corresponding to memory unit areas of adjacent column addresses, 8 bytes of data or 16 bytes of data are not cached from a plurality of memory unit areas of the adjacent column addresses.

As shown in FIG. 29, the column controller 90 has a column address controller 290, and supplies, to a column shifter circuit 291 within each of the byte areas 0 through 3 within the memory bank 92, a shift control signal S290 indicating whether to shift a column address CA by one. Each byte area has the column shifter 291, the column decoder 222 for decoding an output of the column shifter, the memory cell array 224 for inputting/outputting 1 byte of data by means of the internal decoded signal 222D, the second amplifier, the data latch circuit 226, and the data bus switch 228. The column shifter 291 within each byte area outputs a column address to the column decoder 222 by shifting or without shifting the column address CA by one, in response to the shift control signal S290. The data latch circuit 226 is only required to hold only 1 byte of data. Therefore, the data bus switch 228 always selects 1-byte data within the data latch circuit 226 and transfers the data to the I/O bus.

According to FIG. 30 showing the operation, the column address controller 290 performs control so as to shift the column address CA 0 by one to the column shifter 291 of the byte area 0 to generate CA 1 in response to the input column address CA 0 and start byte signal SB, and further performs control so as not to shift the column address CA 0 by one to the column shifters of other byte areas 1 through 3. As a result, in the byte area 0, 1-byte data Q 04 is accessed on the basis of the internal decode signal 222D corresponding to the column address CA 1, and latched to the data latch circuit 226. Also, in the other byte areas 1 through 3, 1-byte data Q 01, Q 02 and Q 03 are accessed respectively on the basis of the internal decode signal 222D corresponding to the column address CA 0, and latched to the data latch circuit 226.

As described above, in the third example shown in FIG. 29 and FIG. 30, the column address has a complex configuration because the column addresses are generated inside the memory associated with the 4-byte data to be accessed, but the cache operation of byte data larger than the 4-byte data can be eliminated. Therefore, the configuration in the input/output unit 93 can be simplified and the power consumption within the memory bank can be reduced.

In the read operation, 1-byte data corresponding to a column address provided from the column decoder 222 in each byte area is outputted to the data latch circuit 226, and then transferred to the input/output terminals DQ via the data bus switch 228. In the write operation, the 4-byte data that is inputted to the input/output terminals DQ is latched to the data latch circuit 226 via the data bus switch 228 in each byte area. Thereafter, the latched data is written to a memory corresponding to the column address from the column decoder 222 in each byte area.

In the case where the memory unit area selected by a column address is constituted by 4 bits, the four byte areas within the bank shown in FIGS. 22 through 31 are configured as 4-bit areas, and a plurality of combinations or one combination of data are accessed from each bit area in a bit unit of 1.

[Control of Relationship with Input/Output Terminals]

Next, there is described an example of control of a relation between the input/output terminals DQ within the image memory and a bus or data latch circuit within the memory cell array.

Figure 31:
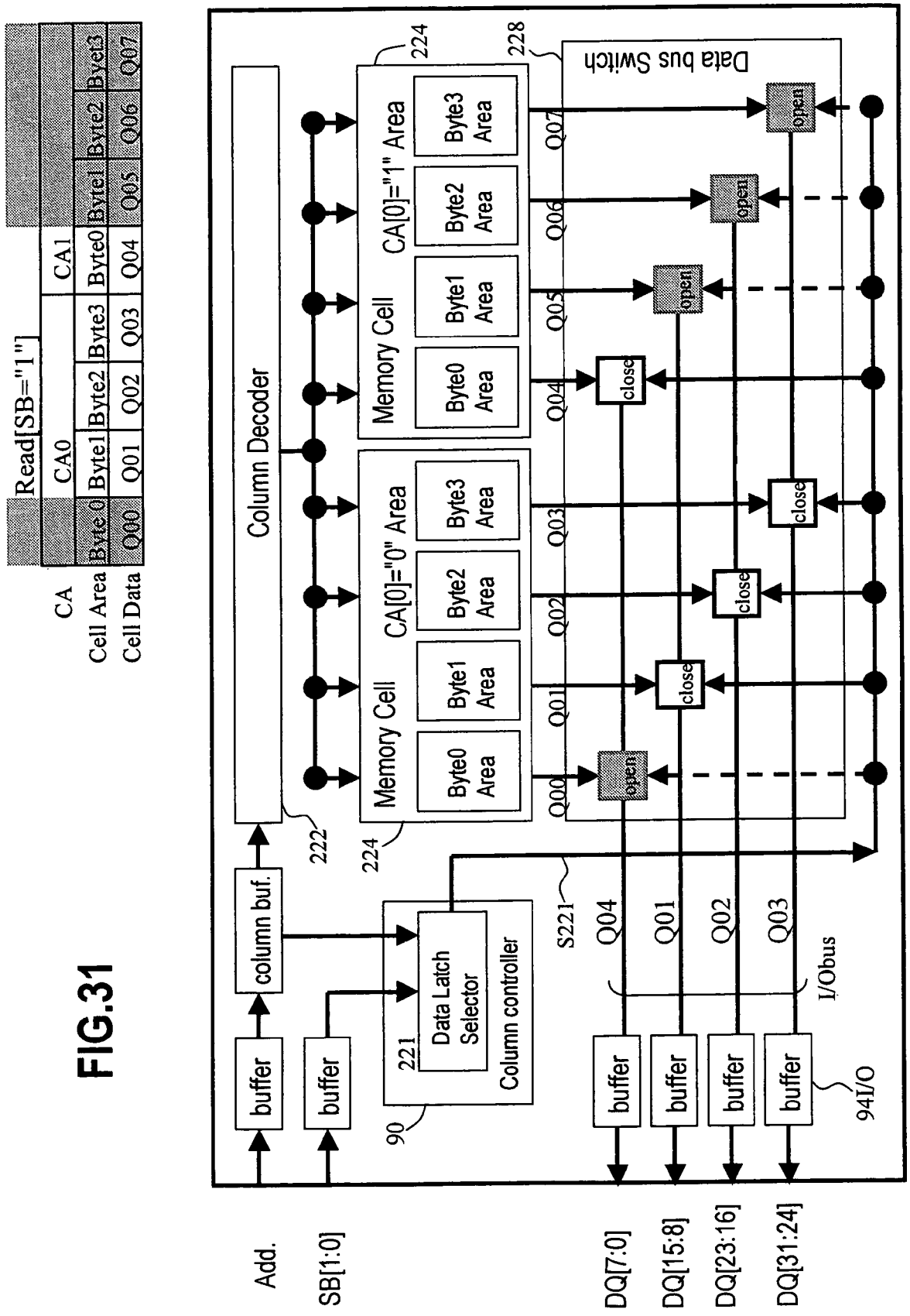
FIG. 31 is a figure showing relation means of input/output terminals of the image memory having the byte boundary functions.
Figure 32:
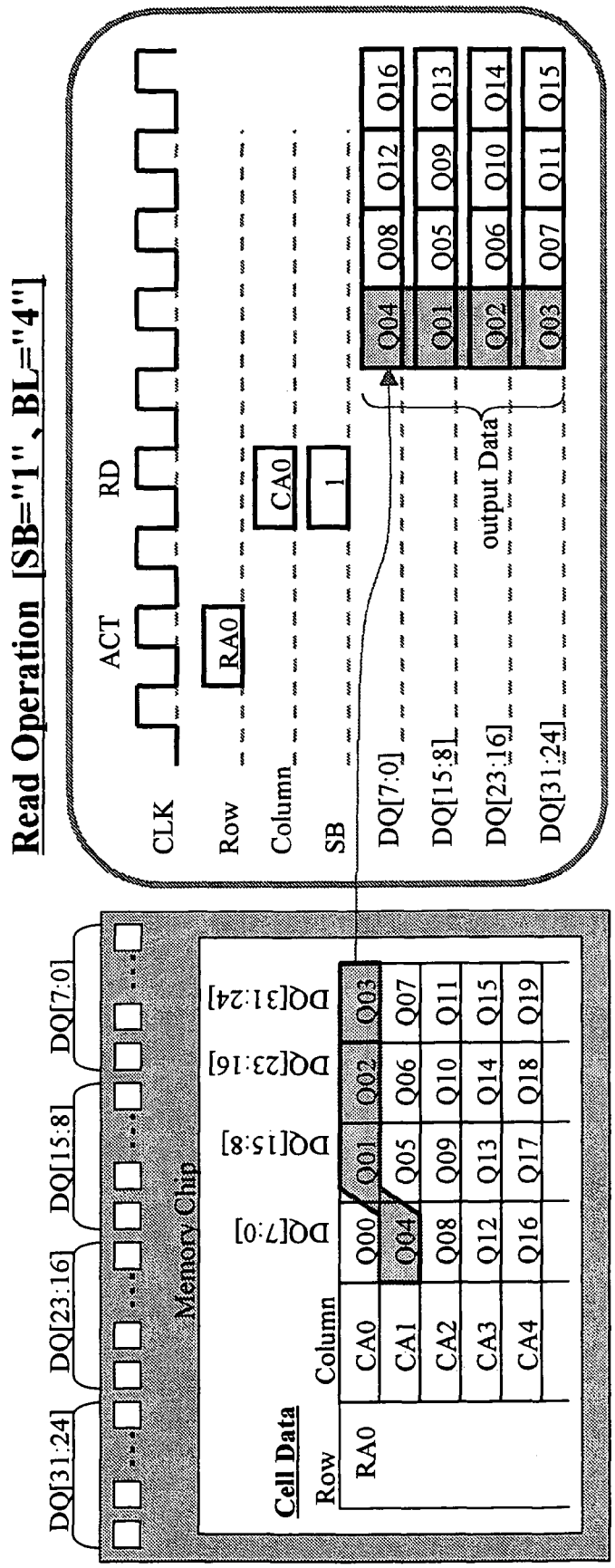
FIG. 32 is a figure showing the operation show in FIG. 31.

FIG. 31 shows relation means to the input/output terminals of the image memory having the byte boundary functions. FIG. 32 shows the operation of FIG. 31. In the relation means to the input/output terminals, as shown in FIG. 32, 4 bytes of data corresponding to a column address CA within the memory space are always associated with a group of input/output terminals DQ[7:0] through DQ[31:24], and relationships there between are not switched around dynamically. Specifically, each relationship (allocation relation) between the input/output terminal DQ and the bus within the memory (input/output bus of the memory cell array 224) is always fixed without being effected by the start byte signal SB. Therefore, even if the start byte signal SB is different at the time of writing and at the time of reading, the input/output terminals DQ to be inputted at the time of writing are the same as the input/output terminals DQ to be outputted at the time of reading.

FIG. 31 shows a method of connecting the DQ terminals when accessing the 4-byte data extending across a 4-byte area selected by a column address CA. This figure assumes the read operation (SB=1) performed from Byte 1 (Q01) in the 4-byte area of a column address CA 0.

In the case where the input/output terminals DQ are not switched around, data that is stored as the data of Byte 1 is outputted to the DQ terminal corresponding to Byte 1, without depending on the start byte signal SB. Therefore, connections between the memory cell array 224 and input/output buffers 94I/O are always fixedly allocated. Therefore, designation of the start byte signal SB is performed for simply determining which bus of the column address CA in the memory cell array 224 should be connected to the input/output butter 94I/O.

The example shown in FIG. 31 is a configuration example corresponding to the first example shown in FIG. 22 and the second example shown in FIG. 24, wherein each of the byte areas 0 through 3 is allocated to a pair of areas (odd-numbered column address, CA[0]=0, and even-numbered column address, CA[0]=1). Specifically, as with FIG. 24, there exists a memory cell area corresponding two column addresses CA, i.e., odd-numbered column address and even-numbered column address, and this memory cell area is further divided into four byte areas. The byte areas, Byte 0 Area through Byte 3 Area, include the column decoder through data latch circuits. In the case of the read operation, data that is twice as large the data required for one-time access is outputted from the byte areas, and half of the data, i.e., 4-byte data, is connected to the input/output buffer 94I/O at each of a group of switches (eight squares in the figure) of the data bus switch 228.

In this manner, if the input/output terminals DQ are not switched around, the data Q 01 that is outputted from Byte 1 Area of the memory cell is definitely connected to the input/output terminal DQ[15:8] corresponding to Byte 1 of the input/output buffer 94I/O. Therefore, the control of the data bus switch 228 using the byte start signal SB means control of connecting the input/output buffers 94I/O to either one of the data latch circuits of an area corresponding to the two column addresses CA.

The data bus switches 228 within the respective four byte areas 0 through 3 shown in FIG. 24 are collectively shown as the data bus switch 228 of FIG. 31. Therefore, the data bus switch 228 of each byte area is constituted by a pair of switches corresponding to the same input/output terminal DQ within FIG. 31.

Figure 33:
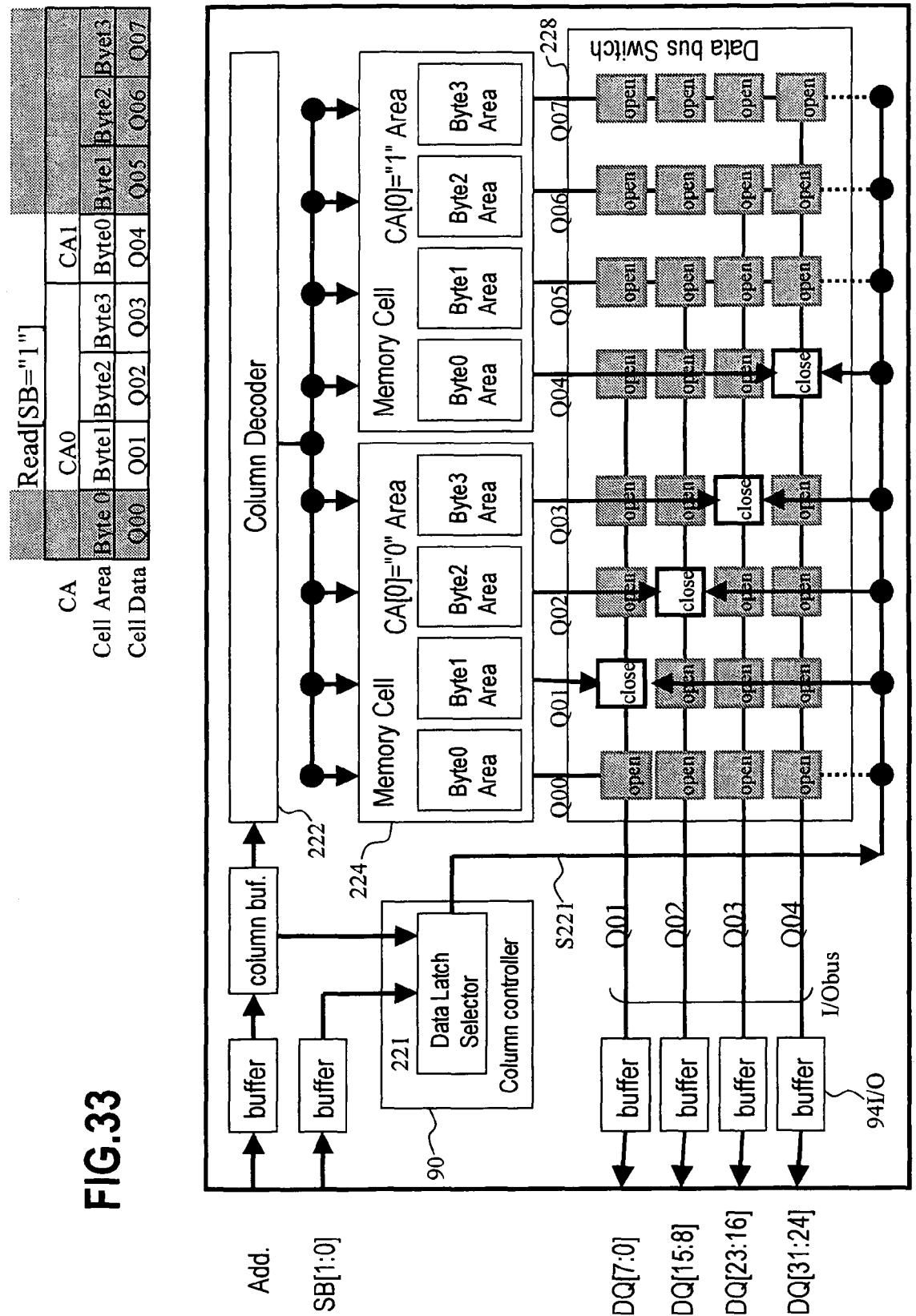
FIG. 33 is a figure showing relation means for controlling the input/output terminals of the image memory having the byte boundary functions.
Figure 34:
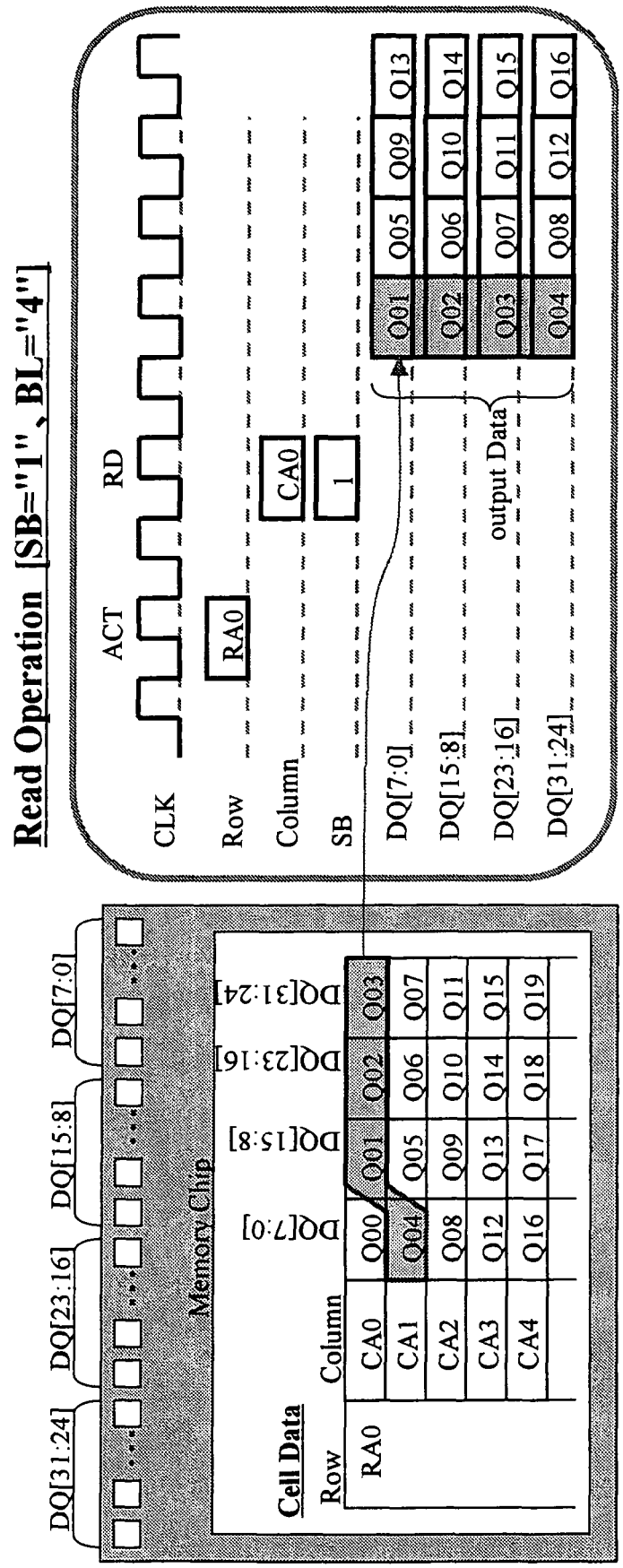
FIG. 34 is a figure showing the operation shown in FIG. 33.

FIG. 33 shows relation means to the input/output terminals of the image memory having the byte boundary functions. FIG. 34 shows the operation shown in FIG. 33. In the relation means to the input/output terminals, as shown in FIG. 34, 4 bytes of data corresponding to a column address CA within the memory space are associated sequentially with the group of input/output terminals DQ[7:0] through DQ[31:24], starting from the start byte, according to the start byte signal SB, and a relationship between the memory cell array 224 and each group of input/output terminals DQ is switched around dynamically. Specifically, each relationship (allocation relation) between the input/output terminal DQ and the bus within the memory is influenced by the start byte signal SB and thus changed. Therefore, if the start byte signal SB is different at the time of writing and at the time of reading, the input/output terminals DQ to be inputted at the time of writing are different from the input/output terminals DQ to be outputted at the time of reading.

As is clear from FIG. 34, in the case where the start byte SB=1, the data items Q 01 through 04 within the memory are associated with the input/output terminal groups DQ[7:0] through DQ[31:24]. Specifically, the relation between the bus or data latch circuit within the memory cell array and the input/output terminal group is configured such that the starting byte data is associated with the input/output terminal DQ[7:0] and the remaining 3-byte data is associated with the remaining input/output terminals DQ sequentially according to the start byte signal SB. Therefore, the data bus switch 228 shown in FIG. 33 is provide with a group of input/output buses I/O bus, the buses or data latch circuits of the memory cell array 224, and switched at all intersecting positions. The group of these switches are subjected to ON/OFF control by the data latch selector 221 using the data latch select signal S221, whereby the above-described dynamic association can be realized.

In this manner, the input/output terminals DQ are switched around with respect to the busses or data latch circuits within the memory cell array according to the start byte signal SB. Specifically, the byte data Q 01 that is outputted from the byte area Byte 1 within the memory cell array is connected to the DQ[7:0] corresponding to Byte 0 of the input/output buffer 94I/O when SB="1", and is also connected to DQ[15:8] if SB="0". The byte data Q05 of the byte area Byte 1 is connected to DQ[23:16] hen SB="3", and is also connected to DQ[31:24] when SB="2". Specifically, the positions of the four switches in the closed state as shown in FIG. 33 are shifted to the right according to the start byte signal SB.

Next, control of a relation between the big endian and little endian is described with reference to the control of the relation with the input/output terminals.

Figure 35:
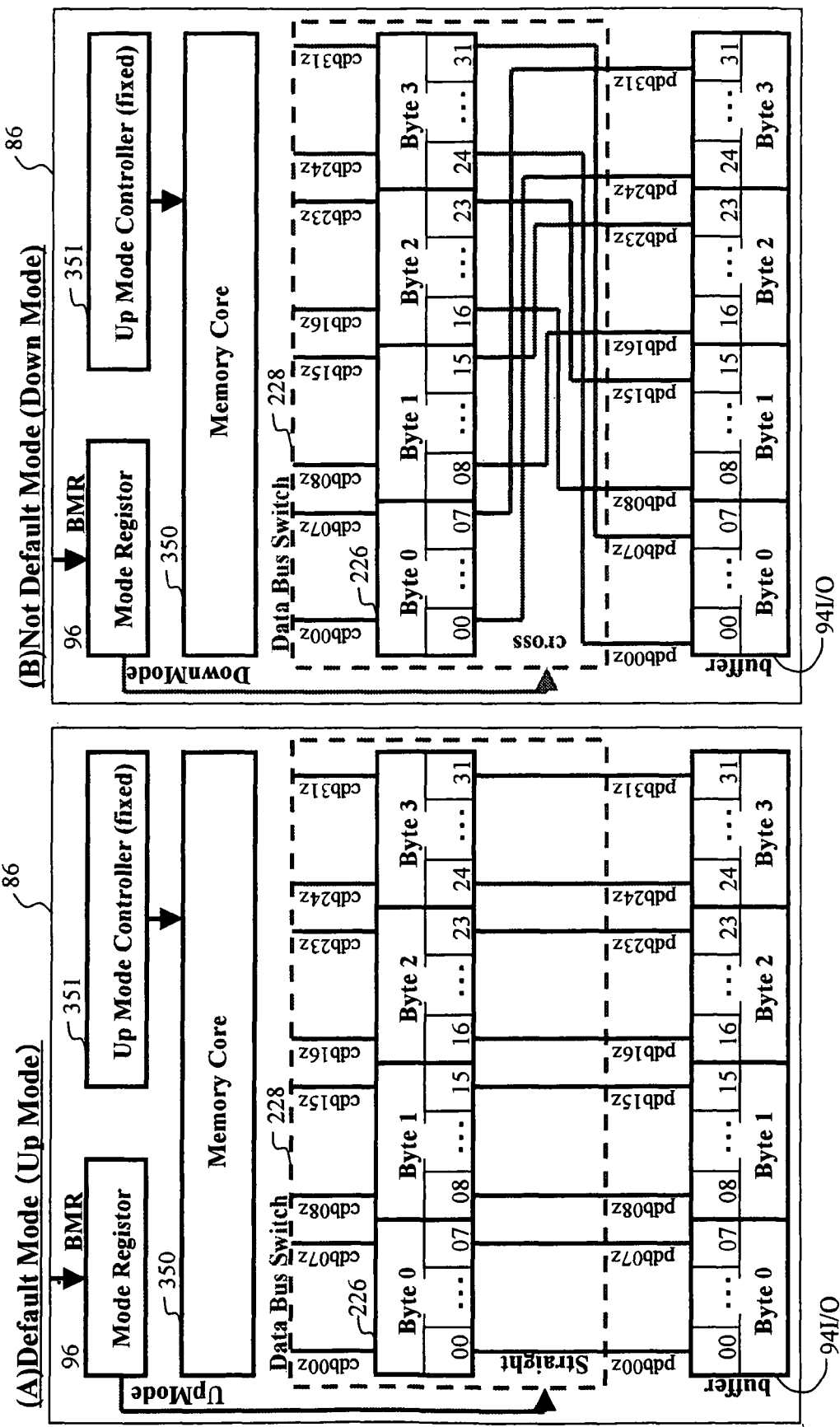
FIG. 35 is a configuration diagram (1) of the image memory having the byte boundary functions and capable of responding to the endians.

FIG. 35 is a configuration diagram (1) of the image memory having the byte boundary functions and capable of corresponding to the endians. In this example, as with the image memory described with reference to FIG. 19 and FIG. 20, the configuration within a memory core 350 corresponds to the big endian (up mode) only. Specifically, only a function of accessing 4 bytes of data in the up mode from byte positions corresponding to the start byte signal SB in byte boundary operation is described. Even in this case, the group of switches of the data bus switch 228 are controlled, whereby the image system for the big endian and the image system for the little endian both can realize input and output of proper data.

In the figure, the mode register 96 is provided with the second information BMR as the byte combination information indicating the up mode or down mode, and the mode is set to either one of the modes. However, the memory core 350 having the column decoder, memory cell array, and second amplifier that are shown in FIG. 29 and the like respond to up mode control only. Specifically, a column control circuit has an up mode controller 351 only and does not have a down mode controller.

FIG. 35(A) shows the data bus switch 228 for the up mode. Specifically, in the case of the up mode, which is the big endian, the memory core 350 is controlled to be the up mode by the up mode controller 351. Therefore, the data bus switch 228 connects the 4 bytes of data of the data latch circuit 226, i.e., Byte 0 through 3, to the input/output buffers 94I/O directly. Specifically, core data buses cdb00z through cdb31z of the memory core 350 are connected directly to I/O data bus pdb00z through pdb31z.

On the other hand, FIG. 35(B) shows the data bus switch 228 in the case of the down mode. Specifically, in the case of the down mode, which is the little endian, the memory core 350 is controlled to be the up mode by the up mode controller 351, but the data bus switch 228 associates 4 bytes of data of the data latch circuit 226, i.e., Bytes 0, 1, 2 and 3, to 4 bytes of data of the input/output buffers 94I/O, i.e., Bytes 3, 2, 1 and 0. In this case, a core bus cdbxxz and an I/O bus pdbxxz are interchanged in units of bytes.

In the example in FIG. 35(B) showing the data bus switch 228, the same means as the switching means 190 of the input/output terminals shown in FIGS. 19 and 20 is provided within the image memory 86. In this manner, the memory core is configured so as to be able to respond to either the big endian or little endian, and the above-described data bus switch 228 is provided to interchange the switches thereof in accordance with the down mode or the up mode, whereby the image memory can respond to both endians.

Figure 36:
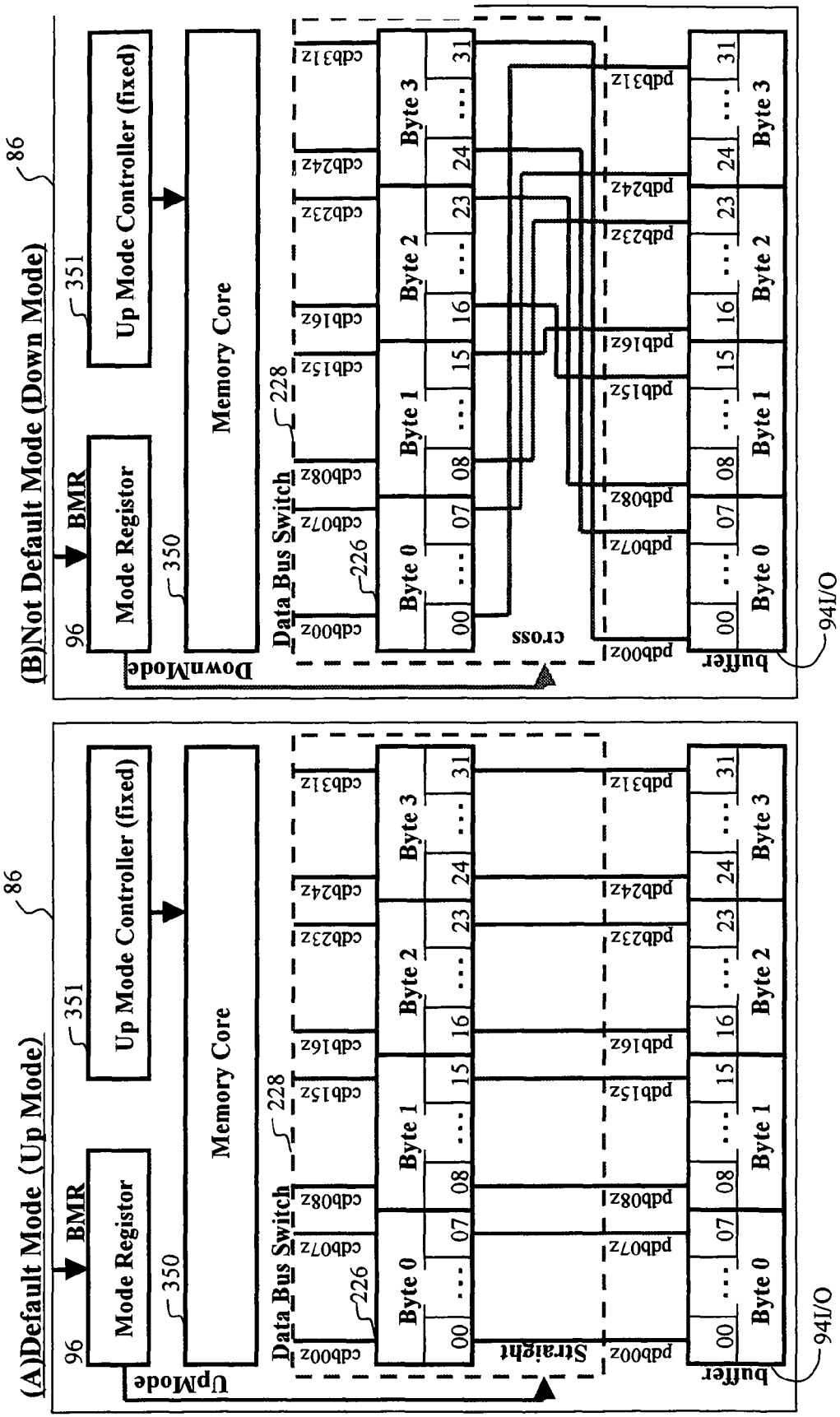
FIG. 36 is a configuration diagram (2) of the image memory having the byte boundary functions and capable of responding to the endians.

FIG. 36 is a configuration diagram (2) of the image memory having the byte boundary functions and capable of corresponding to the endians. As with FIG. 35, this image memory has a memory core configuration capable of corresponding to the up mode control only, and the data bus switch 228 is switched in accordance with the second information BMR=UP/DOWN that is set in the mode register 96, whereby the image memory can respond to both modes. The difference with FIG. 35 is that switching of data performed by the data bus switch 228 is carried out so that MSB (DQ 31) and LSB (DQ 00) are interchanged. Specifically, in addition to 4 bytes, 8 bits of data in each byte are also changed.

Figure 37:
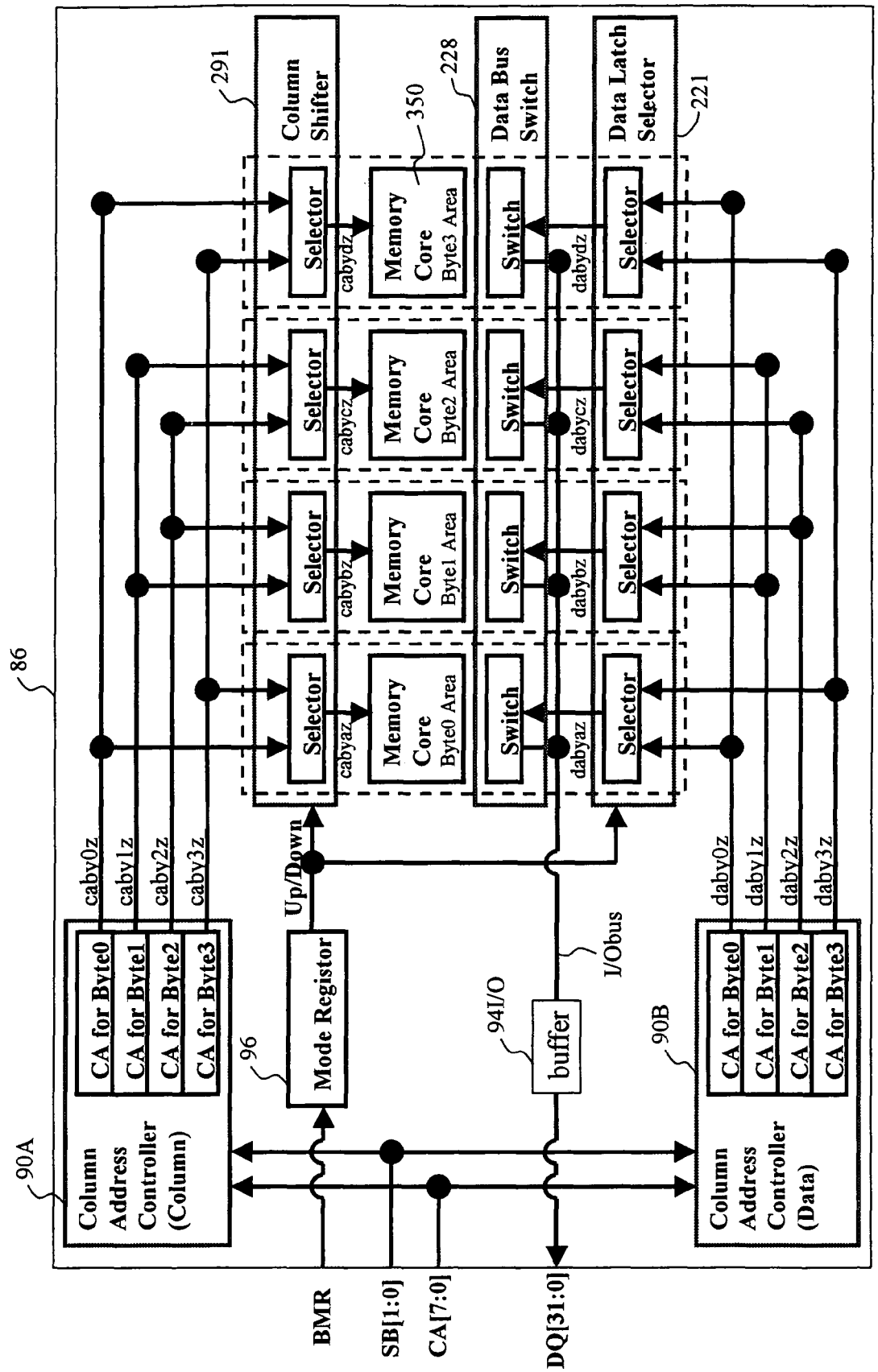
FIG. 37 is a configuration diagram (3) of the image memory having the byte boundary functions and capable of responding to the endians.

FIG. 37 is a configuration diagram (3) of the image memory having the byte boundary functions and capable of corresponding to the endians. This image memory corresponds to the image memory shown in FIG. 29, wherein a combination of column addresses of respective four byte areas within the respective memory cores 350 is controlled to be changed in response to the operation mode, and 4 bytes of data extending in the up direction or down direction from the byte corresponding to the start byte signal SB are inputted/outputted from the four memory arrays.

For example, when the column address CA 0 and start byte SB=1 as shown in FIG. 30, the internal column addresses of the four byte areas Byte 0 through 3 become CA 1, CA 0, CA 0 and CA 0 respectively in the case of the up mode, and data items Q 04, Q 01, Q 02 and Q 03 are inputted/outputted from 4 bytes of input/output terminals DQ. In the case of the down mode, on the other hand, the column addresses become CA 0, CA 0, CA 1 and CA 1 respectively, and data items Q 00, Q 01, Q 06 and Q 07 are inputted/outputted from 4 bytes of input/output terminals DQ.

In this manner, the column address to be provided to the four byte areas Byte 0 through 3 within the respective memory cores are switched around by the column shifter 291 in accordance with the up mode or down mode. Then, a combination of column addresses, which is uniquely determined by the start byte signal SB and the mode signal BMR, is supplied to each byte area of each memory core 350 via the column shifter 291. This column shifter 291 selects one of the two column addresses required to be switched around, in accordance with the up mode/down mode Up/Down, the two column addresses being selected from four column addresses caby0z through caby3z from a column address controller 90A. Specifically, in the byte area Byte 0, either caby0z or caby3z is selected. In the byte area Byte 1, either caby1z or caby2z is selected. In the byte area Byte 2, either caby1z or caby2z is selected. Also, in the byte area Byte 3, either caby0z or caby3z is selected.

In the case of a single data rate (SDR), 4 bytes of data is only able to be accessed at one access, thus, as described with reference to FIG. 29, 1-byte data that is held in the data latch circuit corresponding to each byte area may be transferred directly to the input/output bus.

In the case of a double data rate (DDR), on the other hand, 4 bytes of 8-byte data need to be inputted/outputted at one access. Therefore, in the configuration shown in FIG. 29, each of the byte areas Byte 0 through 3 is provided with a block of even column addresses (CA[0]=0) and a block of odd column addresses (CA[0]=1), then a combination of column address, which is uniquely determined by the start byte signal SB and the mode signal BMR, is supplied from the column shifter 291 to the pair of blocks, and required 4 bytes of data are selected by the data bus switch 228 and transferred to the input/output bus I/O bus. In this case, each switch within the data bus switch 228 selects the data of the even block or odd block in response to control signals dabyaz through dabydz sent from the data latch selector 221, and transfers the selected data to the input/output bus I/O bus. For this reason, column addresses daby0z through daby3z for the data bus are supplied from a column address controller 90B to the data latch selector 221, and the data latch selector 221 selects, or the four byte areas, one of two byte required to be switched in accordance with the up mode/down mode Up/Down. The combination of candidates for switching is same as the column shifter 291 described above.

As shown in FIG. 37, by controlling the combination of column addresses, the number of switches within the data bus switch 228 can be reduced. Specifically, in the data bus switch shown in FIGS. 35 and 36, 2N*8 switches are required when the number of input/output terminals DQ is N bytes. However, by controlling the combination of column addresses, as shown in FIG. 37, 2N number of switches are required in the column shifter 291 and in the data bus switch 228, respectively thus a total of 4N number of switches are required. Therefore, the number of switches can be reduced to ¼ from the number of switches shown in FIGS. 35 and 36.

FIG. 38 is an operation timing chart of the up mode of the DDR memory shown in FIG. 37. In this example, the column address is. CA1 and the start byte signal SB is 1, and the data items DQ 05 through 08 stored in the memory 86 in the big endian are read out. Specifically, the relationships between the data items Q 00 through 19 and the input/output terminals DQ corresponding to the column addresses within the memory 86 are as shown in the figure.

As described above, in the case of the DDR memory, each byte area within the memory cell array has the block of even column addresses (CA[0]=0) and a block of odd column addresses (CA[0]=1), then a controlled combination of column addresses caby is supplied to these blocks, and a controlled combination of column addresses for switching the data buses, daby, is supplied to the data bus switch 228.

Specifically, CA 1 is inputted as a base column address CA. Along with this input, the column addresses CA that are supplied to the even block (CA[0]="0") and odd block (CA [0]="1") within each of the byte areas Byte 0 through 3 are controlled. A column line of the column address CA 2 is activated in the area of the even block (CA[0]="0"). A column line of the column address CA 3 is activated in the byte area Byte 0, and column lines of the column addresses CA 1 are activated in the byte areas Bytes 1, 2 and 3 in the area of the odd block (CA [0]="1").

As a result, the data items Q 05 through 12 are outputted to the core buses of the memory cores. Specifically, the data items Q 08 through 11 are outputted to the core buses of the even block, and the data items Q 5 through 7 and also Q 12 are outputted to the core buses of the odd block.

In the DDR memory, it is necessary to transfer 4 bytes of data from this 8-byte data to the I/O bus. Here, on the basis of the start byte signal SB and the column address CA, the data bus switch selects the data of the even block (CA[0]="0") in the byte area Byte 0 only. As a result, the data items Q 05 through 08 can be outputted to the input/output terminals DQ.

Here, in each of even block area and odd block area (CA [0]="0"/"1"), the internal column address cabyaz selects caby0z, an internal column address cabybz selects caby1z, cabycz selects caby2z, and cabydz selects caby3z. Similarly, in each of even block area and odd block area (CA[0]="0"/ "1"), the column address for data bus, dabyaz selects daby0z. Similarly, dabybz selects daby1z, dabycz selects daby2z, and dabydz selects daby3z.

FIG. 39 is an operation timing chart of the down mode of the DDR memory shown in FIG. 37. In this example, the column address is CA1 and the start byte signal SB is 2, and the data items DQ 05 through 08 stored in the memory 86 in the little endian are read out. Specifically, the relationships between the data items Q 00 through 19 and the input/output terminals DQ corresponding to the column addresses within the memory 86 are as shown in the figure. The difference with FIG. 38 is that the relationships between 4 bytes of data and the input/output terminals DQ are opposite to those shown in FIG. 38.

In this case, CA 1 is inputted as the base column address CA. Along with this input, the column addresses CA that are supplied to the even block (CA[0]="0") and odd block (CA [0]="1") within each of the byte areas Byte 0 through 3 are controlled. A column line of the column address CA 2 is activated in the even block (CA[0]="0"). A column line of the column address CA 3 is activated in the byte area Byte 3, and column lines of the column addresses CA 1 are activated in the byte areas Bytes 2, 1 and 0 in the odd block (CA[0]="1").

As a result, the data items Q 05 through 12 are outputted to the core buses of the memory cores. Specifically, the data items Q 08 through 11 are outputted to the core buses of the even block, and the data items Q 5 through 7 and also Q 12 are outputted to the core buses of the odd block.

In the DDR memory, it is necessary to transfer 4 bytes of data from this 8-byte data to the I/O bus. Here, on the basis of the start byte signal SB and the column address CA, the data bus switch selects the data Q 08 of the even block (CA[0] ="0") in the byte area Byte 3 only, and selects the data items Q 05 through 07 from the odd block for the rest of the byte areas. Accordingly, 4 bytes of data items Q 05 through 08 can be outputted to the input/output terminals DQ.

Here, in each of even block area and odd block area (CA [0]="0"/"1"), the internal column address cabyaz selects caby3z, an internal column address cabybz selects caby2z, cabycz selects caby1z, and cabydz selects caby0z. Similarly, in each of even block area and odd block area (CA[0]="0"/ "1"), the column address for data bus, dabyaz selects daby3z. Similarly, dabybz selects daby2z, dabycz selects daby1z, and dabydz selects daby0z.

Figure 40:
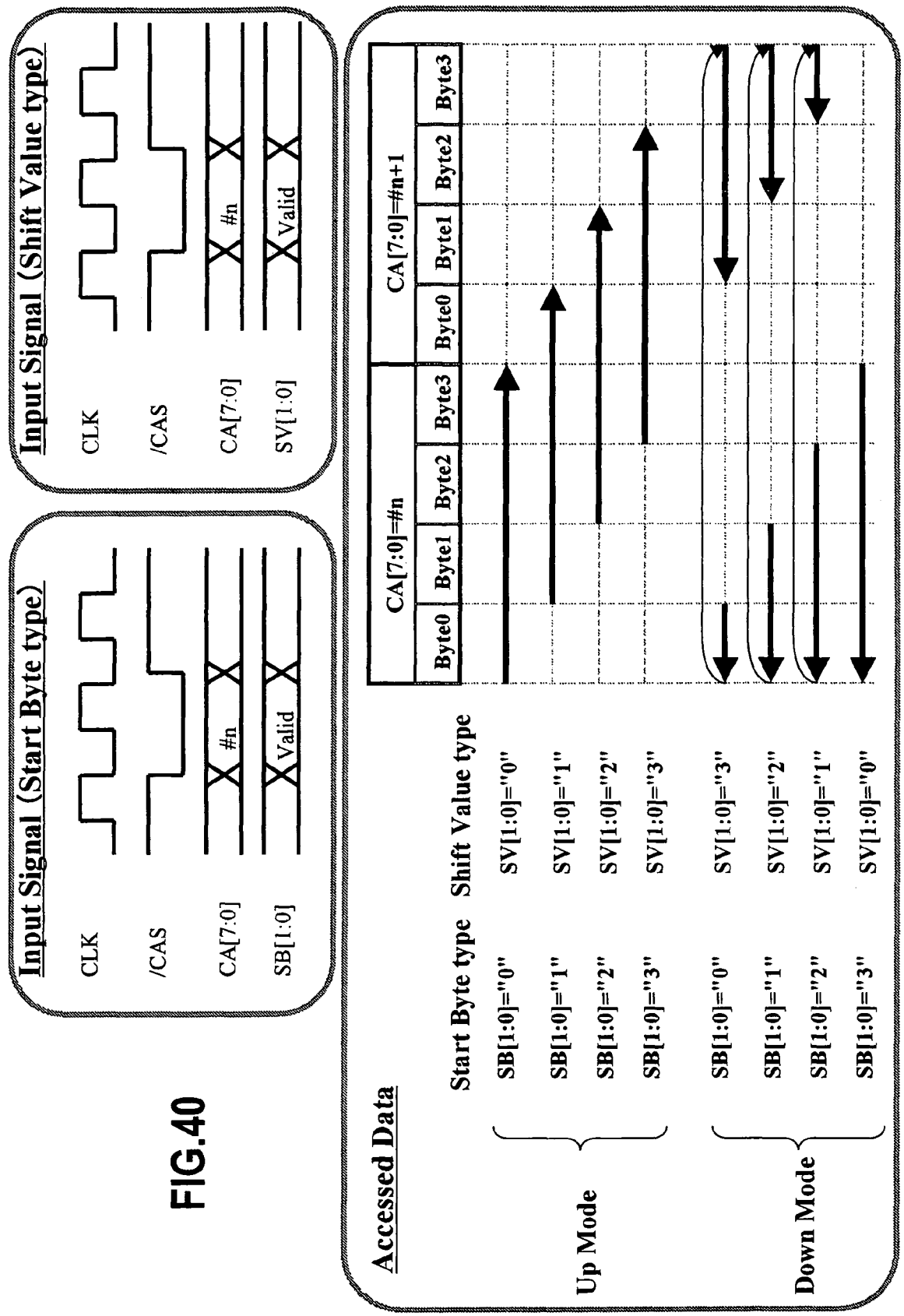
FIG. 40 is a figure for explaining a method of designating a boundary of the byte boundary functions.

As described above, when comparing the downmode shown in FIG. 39 with the up mode shown in FIG. 38, cabyz and dabyz are switched between the byte areas Byte 0 and Byte 3 and between the byte areas Byte 1 and Byte 2, whereby the mode can correspond to the arrangement of byte data items in two types of endians, the big endian and little endian. FIG. 40 is a figure for explaining a method of designating a boundary of the byte boundary functions. In the figure, in the byte boundary function where an access is made across the boundaries of adjacent four byte areas of the column address CA[7:0]=#n and #n+1, a case in which the boundary designation method is performed based on the start byte SB and a case where the boundary designation method is performed based on a shift value SV are considered. The start byte SB=N means that an access is made across 4 bytes from a byte N, and the shift value SV=N means that an access is made across 4 bytes from a position shifted by N bytes from a border of 4-byte areas of column address.

In this case, the relationship between the start byte SB and the shift value SV changes in the up mode and the down mode in accordance with the two modes of the endian. Specifically, in the case of the up mode, since the byte data items are arranged in the manner of Byte 0 through 3, SB and SV are the same. However, in the case of the down mode, the byte data items are arranged in the manner of Byte 3 through 0, thus SB and SV are different and in an opposite relationship.

Therefore, in the case where the image memory has a start byte signal SB terminal only and the internal structure is controlled in accordance with the shift value SV, it is necessary to non-invert or invert the start byte signal SB so as to obtain the shift value SV depending on whether the mode is the up mode or down mode. The same is true for the case where the image memory has a shift value SV terminal only and the internal structure is controlled in accordance with the start byte SB.

Figure 41:
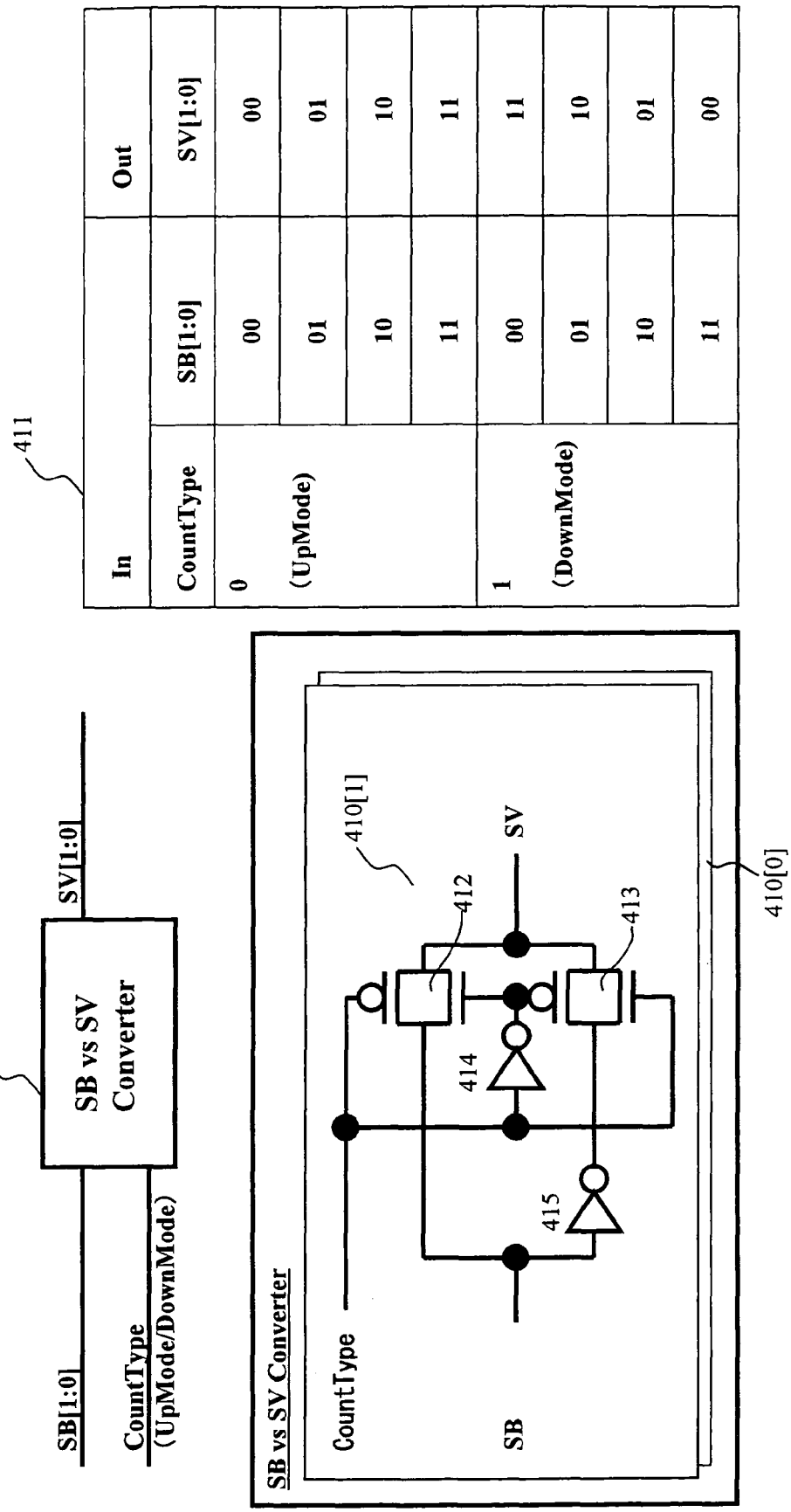
FIG. 41 is a figure for showing a conversion circuit of a start byte SB and a shift value SV.

FIG. 41 shows a conversion circuit of the start byte SB and the shift value SV. A conversion circuit 410 consists of 2 bits 410 [0], 410 [1], and is constituted by CMOS transfer gates 412 and 413, and inverters 414 and 415. An input start byte SB is non-inverted or inverted so as to obtain the shift value SV according to a count-type signal indicating the up mode or the down mode. As shown in a truth table 411 of the conversion circuit 410, the SB is not inverted to becomes SV in the case of the up mode, but SB is inverted to becomes SV in the case of the down mode.

[Column Address Control in Rectangular Access]

As shown in FIG. 1, in the memory mapping 12 and 14E for associating the memory space of the image memory with the pixels of the image, within the page area 14 selected by a bank address BA and a row address RA, the mapping is performed so as to wrap a memory unit area (4-byte area) selected by the column address CA at a predetermined wrap width (CA Wrap), in accordance with the arrangement of the matrix of pixels in the image. In the example shown in FIG. 1, the column address CA is wrapped in units of 4 within the page area 14. That is, the wrap width CA Wrap of the column address is 4. This wrap width of the column address is also called "step" of the column address.

By this mapping of wrapping the memory unit area selected by the column address at a predetermined wrap width, efficiency of a rectangular access that is made frequently in the image memory can be improved. Specifically, while a page area is subjected to active operation by an active command, a read command and a write command are repeatedly issued in accordance with a rectangular area to be accessed, whereby an access can be made to the rectangular area within the same page area. Since an access can be made to the rectangular area within the same page area by performing the active operation once, an efficient access can be made.

As shown in FIG. 16, in such rectangular access, it is necessary to repeatedly issue the read command RD, bank address BA, column address CA, and start byte signal SB. However, if the mapping information of the memory, or particularly the wrap width (CA Wrap) of the column address CA of the page area is already known, the starting column address CA of the rectangular area, rectangular width and the rectangle size can be provided so that the image memory can internally and automatically issue the column address to be accessed, whereby the image data of the rectangular area can be accessed. In this case, the read command and the column address may be issued once, thus it is not necessary to issue them a number of times as in FIG. 16.

Figure 42:
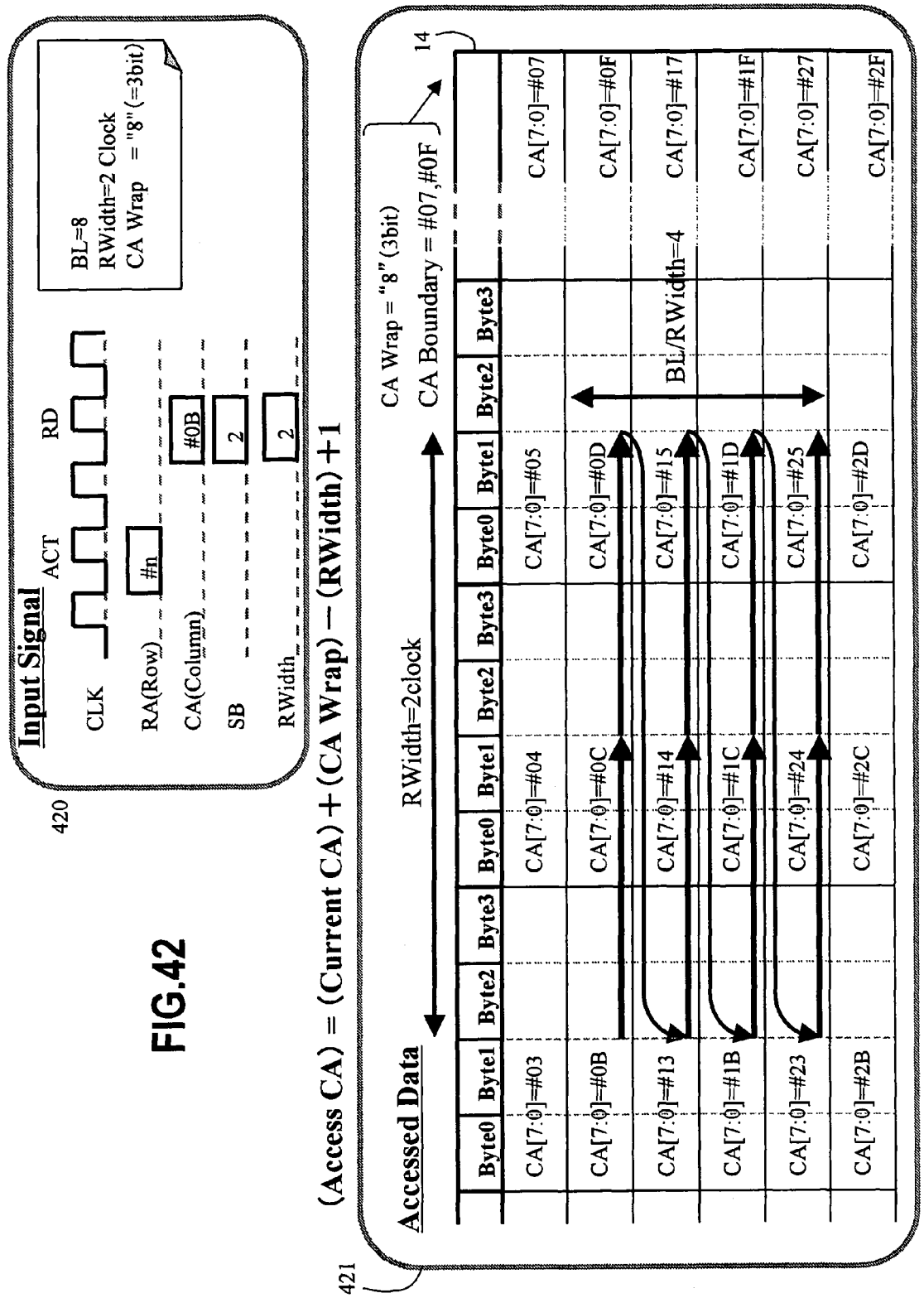
FIG. 42 is a figure for explaining an automatic rectangular access using the byte boundary functions.

FIG. 42 is a figure for explaining an automatic rectangular access using the byte boundary functions. In this example, data areas to be accessed are shown by arrows in a memory mapping 421. In this memory mapping, column addresses CA are wrapped at 8 within a page area 14. Thus, the column address wrap width CAWrap is 8. Therefore, column addresses CA on a right end of the page area 14 are #07, #0F, #17 and #1F (Hexadecimal), and the wrap width CAWrap is 8. Also, the starting address CA of the rectangular area to be accessed is CA=#B, the start byte SB=2, the width of the rectangular area Rwidth=2 clocks (4 bytes×2 clocks=8 bytes), and the size of the rectangular area is burst length BL=8 (4×8=32). Therefore, the height of the rectangular area is BL/Rwidth=4.

Figure 43:
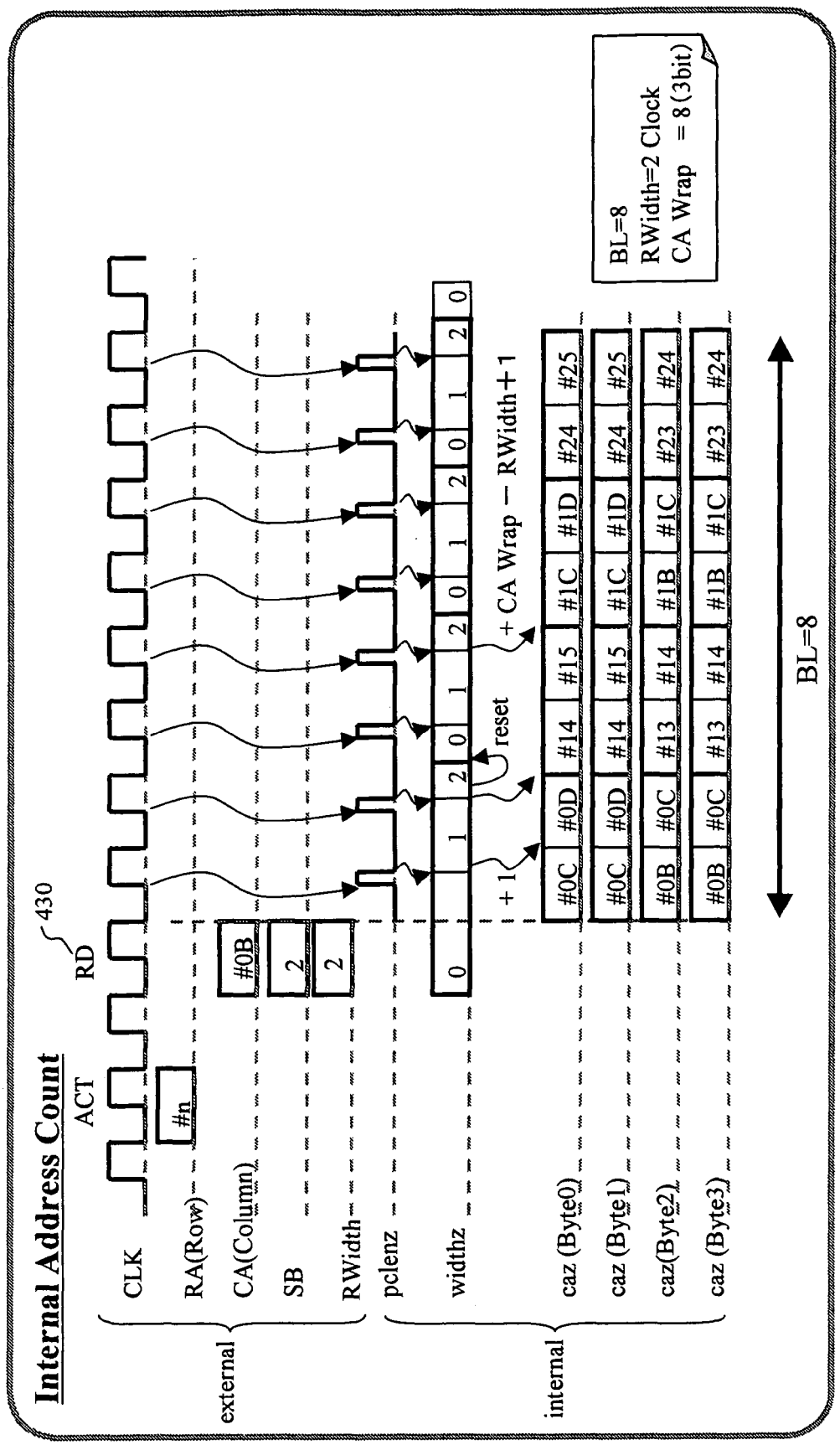
FIG. 43 is a timing chart of an automatic rectangular access.
Figure 44:
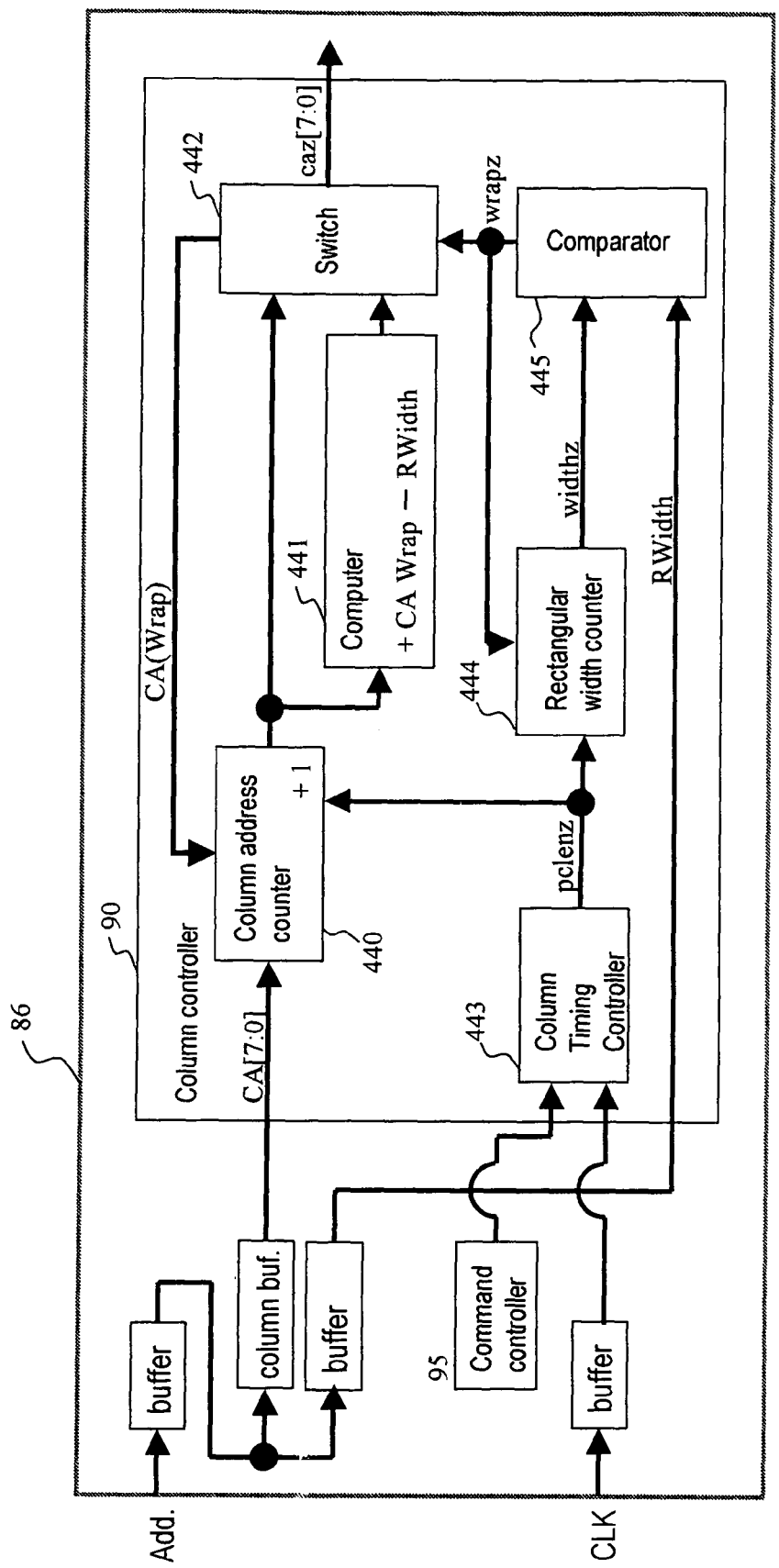
FIG. 44 is a configuration diagram of an internal column address calculator that is required in the automatic rectangular access.

FIG. 43 is a timing chart of an automatic rectangular access. FIG. 44 is a configuration diagram of an internal column address calculator that is required in the automatic rectangular access. In order to perform the rectangular access shown in FIG. 42, column addresses CA=#0B/#0C, #0C/#0D, #13/#14, #14/#15, #1B/#1C, #1C/#1D, #23/#24, and #24/#25 may be issued within the memory in response to supplied column addresses CA=#0B and SB=2. Specifically, in the first access, Bytes 2 and 3 access to CA=#0B, and Bytes 0 and 1 access to CA=#0C. In the second access, progress is made in the column address CA by 1, thus Bytes 2 and 3 access to CA=#0C, and Bytes 0 and 1 access to CA=#0D. In this example, since the rectangular width RWidth=2, the third access is made to wrapped column addresses CA=#13 and #14 in place of the position after the column address CA is shifted by 1. Therefore, it is necessary to compute the third column address from the column address wrap width CAWrap and the rectangular width Rwidth. When considering this third address with Bytes 2 and 3, third CA to be accessed is obtained as CA=12+8−2+1=19 (Decimal)=#13 (Hexadecimal) by an equation shown in FIG. 43 (CA+ CAWrap−Rwidth+1) on the basis of the current column address CA=#0C (=12 (Decimal)), CAWrap=8, and RWidth=2. FIG. 44 shows the column address calculator within the column controller 90. This calculator has a column address counter 440 that increments by one a column address CA supplied from the outside and a wrapped column address CA (Wrap), in synchronization with an internal clock pclenz that synchronizes with the timing of a clock, a computer 441 that adds CA Rwap to a count value of the column address counter and subtracts Rwidth, a switch 442 for selecting an output of the computer 441 when the rectangular area is wrapped, a rectangular width counter 444 that counts the synchronizing clock pclenz and counts count values in the horizontal direction during an access, and a comparator 445 that detects that the horizontal count value widthz of the rectangular width counter 444 matches with the rectangular width Rwidth, and generates a switching signal wrapz for the switch 442.

Explanation is provided with reference to the timing chart shown in FIG. 43. First, suppose that the rectangular area size is set as burst length BL=8 in the mode register, and the wrap width of a column address CAWrap=8 within a page area is also set in the mode register. Then, the starting column address CA=#0B, start byte SB=2, and rectangular width of the rectangular area to be accessed Rwidth=2 are supplied along with a read command 430 following an active command. In response to this, the timing clock pclenz is generated in synchronization with a clock, the rectangular width counter 444 then counts up the count values widthz in the horizontal direction during the access, and the column address counter 440 counts up starting from the starting column address CA=#0B.

An internal column address caz [7:0] that is issued for the first access is CA=#0B/#0C, as shown in FIG. 43. In the second access, #0C/#0D is outputted in response to the column address caz[7:0]=#0C obtained by incrementing caz=#B by one by the column address counter 440. In the third access, the rectangular area needs to be wrapped at a rectangular width, thus a computed value of the computer 441 is selected by the switch 442, column address caz[7:0]=#03 is outputted, and, after wrapping is performed in response to this output, column address CA=#13/#14 is generated. In the fourth access, #14/#15 is generated. In the fifth access the rectangular area is wrapped and #1B/#1C is generated. Thereafter, #1C/#1D, #23/#24 and #24/#25 are generated similarly.

The configuration of the image memory corresponding to this automatic rectangular access is as shown in, for example, FIG. 29, wherein a combination of four column addresses corresponding to the byte boundary functions is supplied to four byte areas Bytes 0 through 3. Specifically, a combination of the internal column addresses caz shown in FIG. 43 is supplied to the column decoder in each byte area. As a result, the data items of these column addresses are outputted from the four byte areas respectively.

In the above example, the rectangular width Rwidth at the time of rectangular access is supplied along with the read command, but the rectangular width Rwidth may be set beforehand by means of the mode register set command in the mode register. Alternatively, the rectangle size BL and rectangular width Rwidth may be supplied along with the read command. The wrap width CAWrap of the column address is set by the image system beforehand, thus it is preferred that the wrap width CAWrap is set by means of the mode register set command.

In this manner, in the case of the rectangular access, if the column address CA as a starting point, the rectangular width Rwidth, and the rectangle size (BL) are provided, an internal column address to be accessed can be generated automatically on the basis of the wrap width CAWrap of the column address that is set beforehand. Therefore, the rectangular access can be made by issuing a read command once.

[Byte Boundary Functions of Page Area Boundary]

The byte boundary functions can efficiently access predetermined bytes (4 bytes) of data across the boundary of a memory unit area (4-byte area) selected by a column address. However, in the case of performing a rectangular access across a page area boundary, adjacent page areas need to be subjected to the active operation again by means of another active command.

FIG. 45 shows an example of memory operation performed when an access made by the byte boundary functions reaches the end of a page area. This figure shows an example in which the page area is constituted by column address CA[7:0]=#00 through #FF and CA=#FF at a right end. In this case, when 4 bytes of data items shown by arrows in the figure are accessed using the byte boundary functions, the 4 bytes of data can be outputted in the up mode when SB=0, but when SB=1, 2 and 3 the byte data at a left end are accessed after turning at the right end of the page area. Specifically, in this example, the access is performed again within the same page area without performing new active operation. In the case of the down mode, on the other hand, it is necessary to turn at the left end to move to the right end (Wrap) when SB=0, 1 and 2, turning does not need to be performed only when SB=3.

If the abovementioned access is made, unnecessary data is outputted. In order to make an access to an adjacent page area from the end of the above page area, it is necessary to issue a new active command to perform active operation on the adjacent page area.

FIG. 46 shows another example of the memory operation performed when an access made by the byte boundary functions reaches the end of a page area. In this example, the burst length BL is set to 8. When BL=8 is established, a burst counter within each bank repeatedly counts internal column addresses by means of the counter width of BL=8. Specifically, in the example shown in FIG. 46, the internal column addresses that are generated by the burst counter are constituted by a width 8 of CA=#k8 through #kF (16-bit notation). Even in the case of a memory in which the access area is divided by such counter into rectangular areas that use the burst length BL as the base, when, as with FIG. 45, the byte boundary functions are used at the right end where the burst length area CA=#k8 through #kF, the same problem as FIG. 45 is generated. In the example shown in FIG. 46, wrapping occurs at SB=1, 2 and 3 at the time of the up mode, and wrapping occurs at SB=0, 1 and 2 at the time of the down-mode. Accordingly, unnecessary data is outputted.

Figure 47:
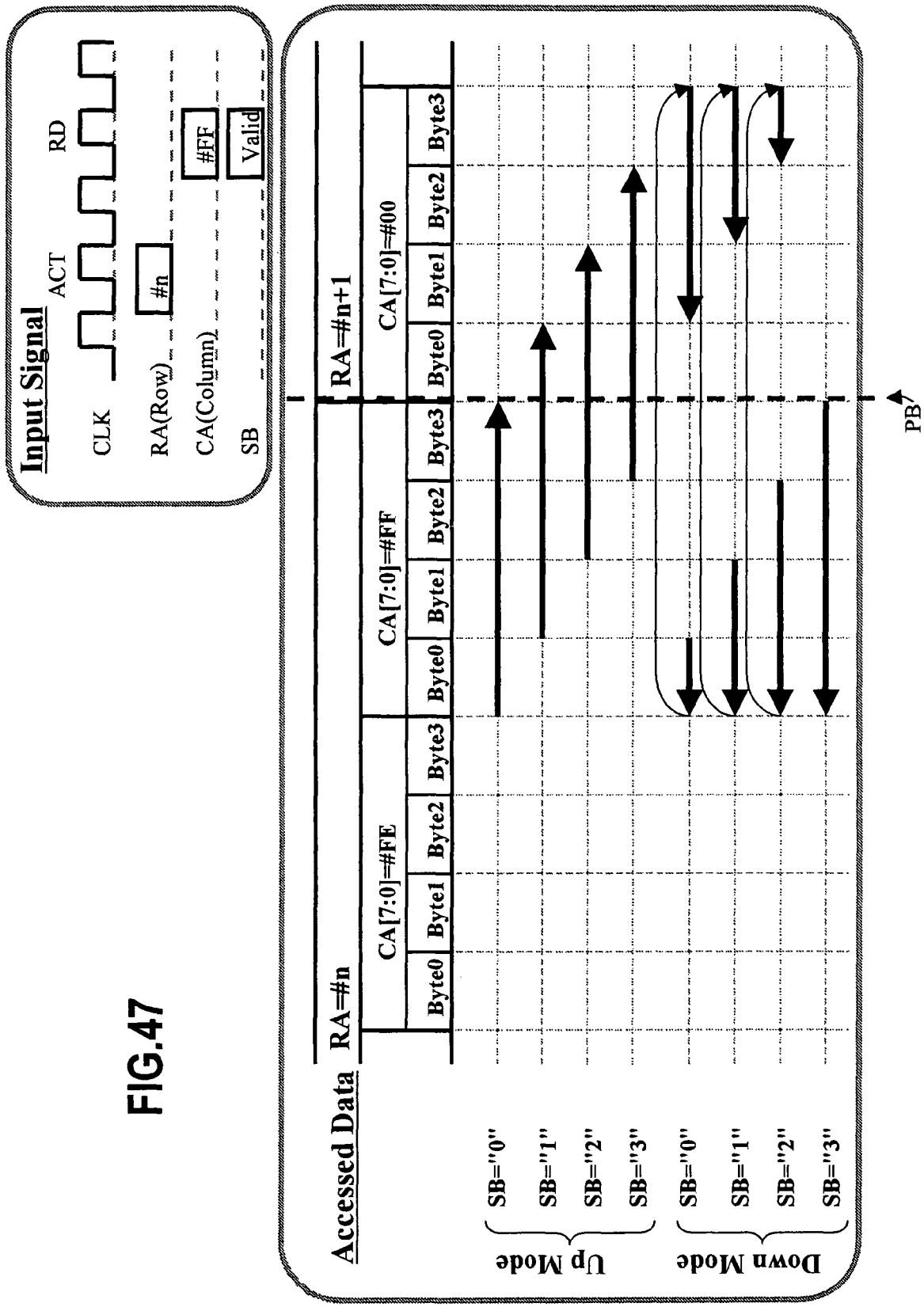
FIG. 47 is a figure showing yet another example of the memory operation performed when an access made by byte the boundary functions reaches the end of a page area.

FIG. 47 shows yet another example of the memory operation performed when an access made by the byte boundary functions reaches the end of a page area. In this example, the byte boundary functions are realized using the multi-bank access function in the rectangular access described with reference to FIG. 7. Specifically, the row address RA=#n is specified by the active command ACT. If the column address CA as the base point is CA=#FF at the right end of the page area when the read command RD is issued, an access is made beyond a boundary PB of the page area as shown by the arrows.

Specifically, in the up mode, when SB=1, 2 and 3, an access is made to the byte data of CA=#FF within the page area where RA=#n and to the byte data of CA=#00 within the page area where RA=#n+1. In the down mode, when SB=0, 1 and 2, an access is made to the byte data of CA=#FF within the page area where RA=#n and to the byte data of CA=#00 within the page area where RA#n+1. In this case, an access needs to be made to adjacent page areas, thus the page area with the row address RA=#n that is provided along with the active command ACT is activated, and, in response to the column address CA=#FF and start byte signal SB=2 that are supplied along with the read command RD, the page area with the adjacent row address RA=#n+1 is activated. Thus, word lines within a plurality of banks are activated in response to one active command ACT.

When control is performed such that the plurality of banks are activated simultaneously, data of required areas can be inputted/outputted economically, even if the byte boundary functions are requested at the end of the page area.

[Other Application of Byte Boundary Functions]

The byte boundary functions can input/output data efficiently when storing the image data to the memory and accessing the data corresponding to an arbitrary pixel. The byte boundary functions have the same benefits in an application other than the image memory.

Figure 49:
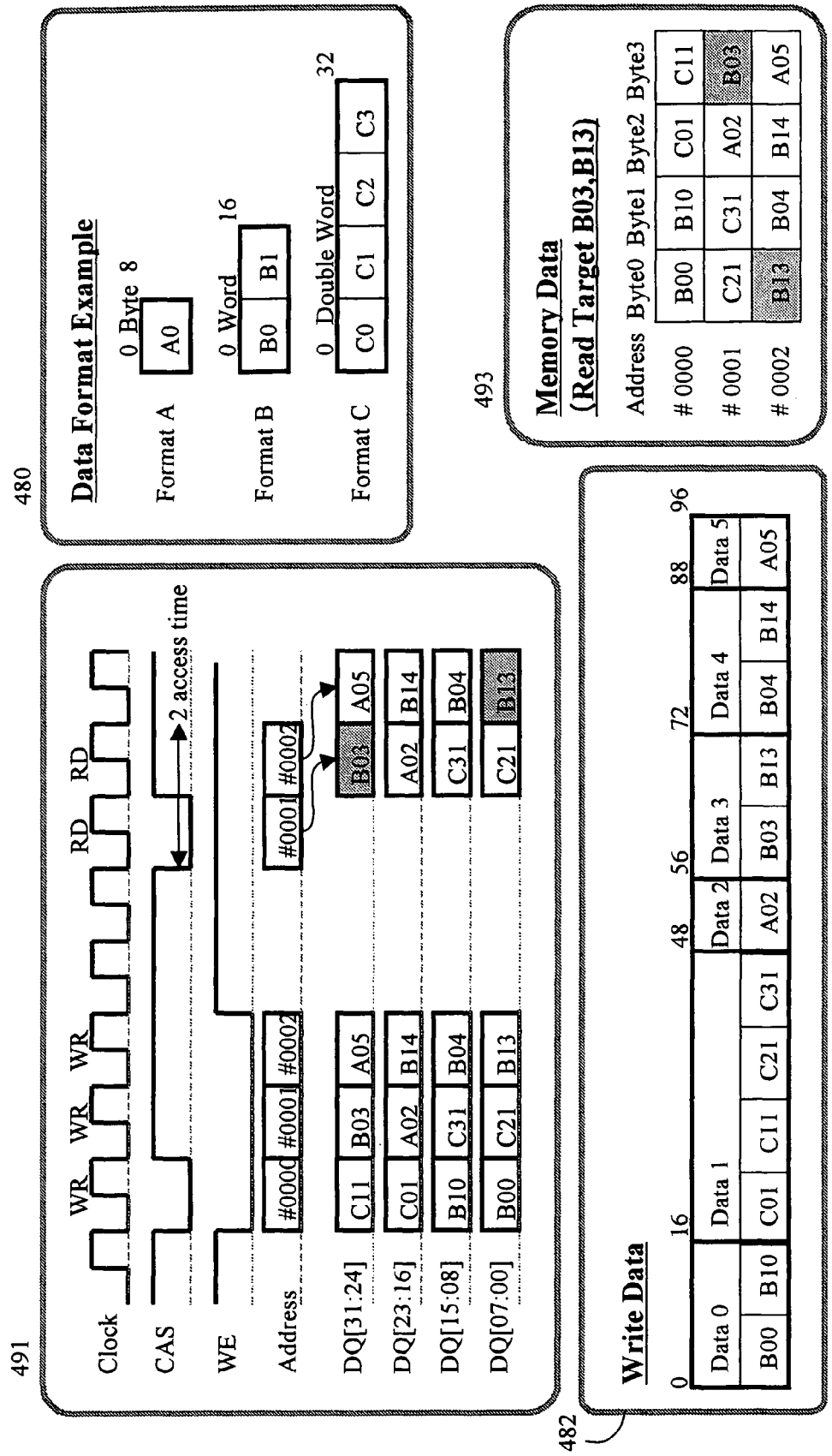
FIG. 49 is a figure for explaining other application of the byte boundary functions.

FIG. 48 through FIG. 50 are figures for explaining other application of the byte boundary functions. FIGS. 48 and 49 correspond to a conventional example, and FIG. 50 corresponds to the present embodiment. According to the configuration of the memory, a plurality of byte areas are allocated to the same column address CA, and an access is made to a plurality of byte data items that are allocated to the same column address CA at one access. In such structure, the memory can be accessed efficiently when processing data of fixed byte size (word configuration) allocated to the same column address CA.

However, there is a case where the size of data to be processed by the system is less than that of the word configuration of the memory. As a countermeasure for such a case, there is a method padding so that the data of the word configuration size or smaller does not extend across a plurality of column address CA areas. In the example shown in FIG. 48, the word configuration of the memory is set to 4 bytes (see 483 in the figure), and the units of the size of the data to be processed may be 1 byte (format A of 280 in the figure), 2 bytes (format B of same), or 4 bytes (format C of same). Therefore, the data of 4 bytes is prevented from extending across the column addresses CA by storing the data in the position where Byte 0 is the base point. The data of 2 bytes is stored in the positions where Byte 0 and Byte 2 are the base points. The data of 1 byte can be stored in the positions where any of Byte 0, Byte 1, Byte 2 and Byte 3 is the base point.

Suppose that there is a case where data 0 through 5 of the sizes, 2 Byte, 4 Byte, 1 Byte, 2 Byte, 2 Byte and 1 Byte, are continuously stored in the memory, as with the write data 482 shown in the figure. In this case, by performing the write operation as in 481 in the figure, padding is performed in several byte areas within the memory as shown in 483 in the figure, and a total of 4 bytes of areas are not used effectively for storing the data. In this case, the amount of memory is not used effectively. However, by outputting data in a unit of 4 bytes by the column address CA, each data item can be read at one column address access, thus reading speed increases.

However, in order to eliminate the abovementioned redundant storage capacity, the data items may be stored continuously in to the byte areas of the memory without performing padding. For example, the data is written in three cycles by means of a write command WR as shown in 491 in FIG. 49, and then the data can be stored in the byte areas within the memory as shown in 493 in the figure.

By writing the data in the manner shown in FIG. 49, the storage capacity of the memory can be utilized effectively. However, in the case where the data is stored across different column address areas, such as 2-byte data items B03 and B13 in data 3 or 4-byte data items C 01 through 31 in data 1, reading and writing cannot be performed at one access in a conventional memory, thus access needs to be made twice. As shown in 491 in the figure, the read command RD needs to be issued twice to read data 4, deteriorating the access efficiency.

Therefore, as shown in 500 in FIG. 50, by issuing the read command RD once and specifying the start byte signal SB=3 by means of the byte boundary functions, data 3 (B03 and B 13) extending across the different column addresses can be accessed. Therefore, the memory having the byte boundary functions can realize the improvement of the memory availability without reducing the access performance.

[Memory Controller for Byte Boundary Functions]

Next, the memory controller for the byte boundary functions is described. The image processing system is described with reference to FIG. 8, wherein the image processing controller 81 and the memory controlling section (memory controller) 82 are included in the image processing chip 80 within the image processing system.

Figure 51:
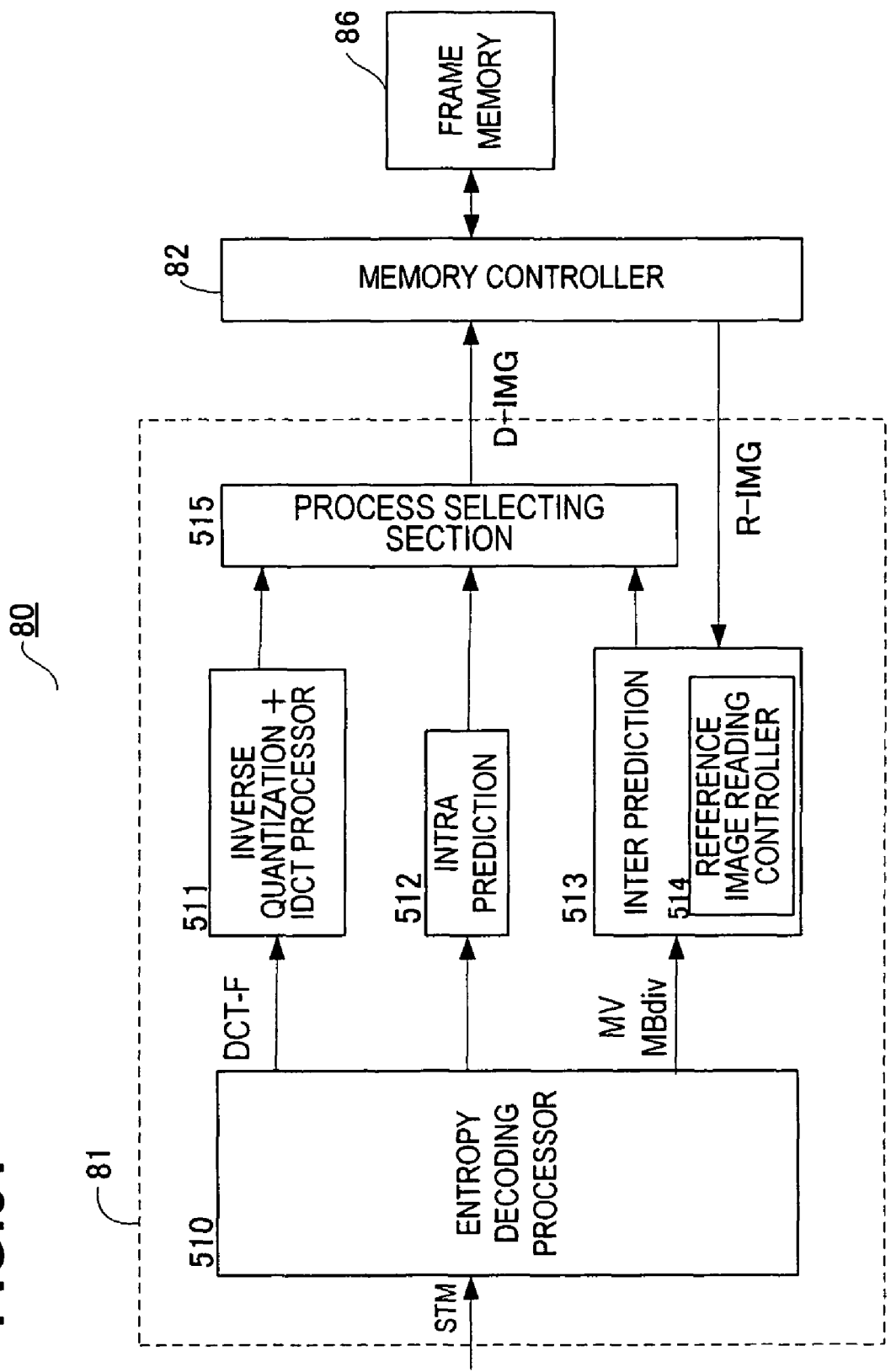
FIG. 51 is a configuration diagram of the image processing system.

FIG. 51 is a configuration diagram of the image processing system. As with FIG. 8, the image processing system is constituted by the image processing controller 81, memory controller 82, and image memory 86. The image processing controller 81 is configured so as to perform, for example, MPEG decoding processing. The image processing section 81 has an entropy decoding processor 510 to which a coded and compressed stream data STM is inputted, an inverse quantization and inverse DCT processor 511 for performing data processing on the basis of a DCT coefficient DCT-F, an intra prediction section 512, an inter prediction section 513 for having the memory controller 82 read a reference image on the basis of a motion vector MV and a micro-block division information MBdiv, and a process selecting section 515. The memory controller 82 performs memory control including issuance of commands and addresses between the image processing controller 81 and the image memory 86. Decoded image data D-IMG that is outputted from the process selecting section 515 is stored into the image memory 86 by the memory controller 82. Also, the a reference image read controller 514 of the inter prediction section 513 acquires data of a reference image R-IMG from the image memory 86 via the memory controller 82, and sends the data of the reference image to the process selecting section 515.

An MPEG decoder decodes current image data on the basis of the reference image R-IMG within a past image or future image that is read from the memory on the basis of the motion vector, and on the basis of differential data between the reference image and the current image data. Therefore, an operation is frequently performed in which a rectangular reference image located in the position of the motion vector is read out from the image that is temporarily stored in the image memory 86. In this rectangular access control, the access efficiency can be improved by using the image memory 86 having the byte boundary functions and the memory controller 82 corresponding to the byte boundary functions.

Figure 52:
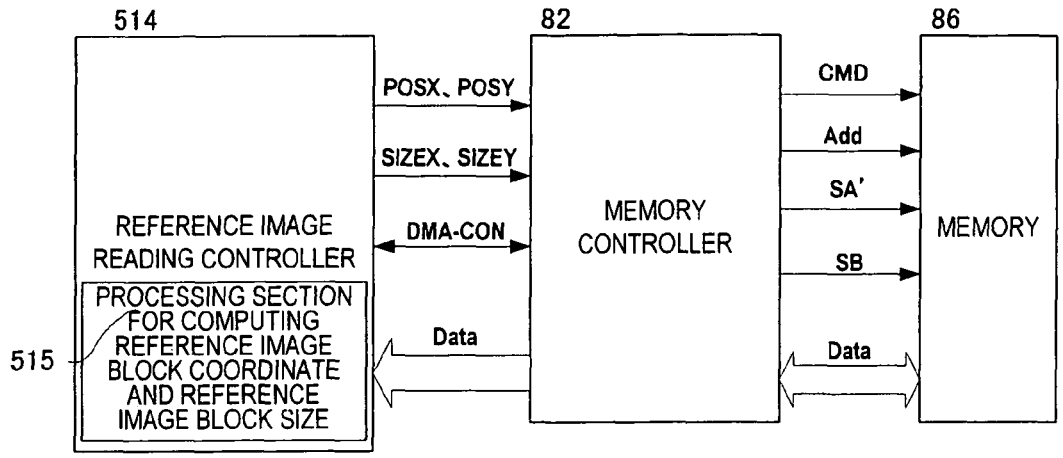
FIG. 52 is a figure showing input and output signals of a memory controlling section (memory controller).
Figure 53:
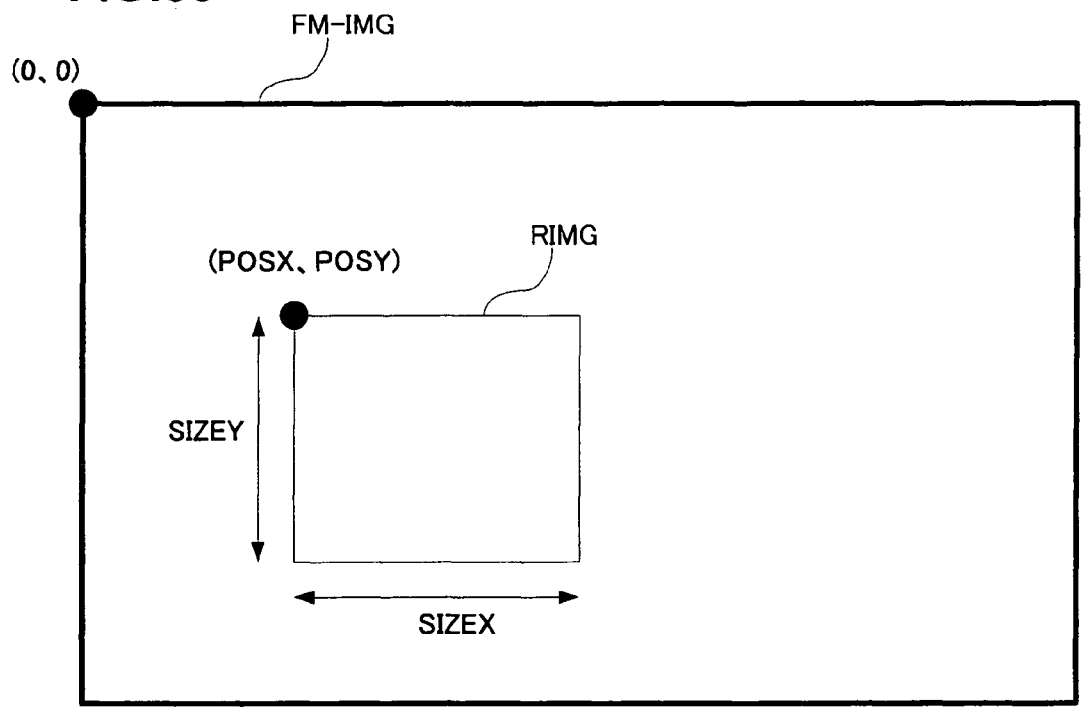
FIG. 53 is a figure for explaining a reference image area, which is a target of reading within a frame image.

FIG. 52 shows input and output signals of the memory controlling section (memory controller). FIG. 53 is a figure for explaining a reference image area, which is a target of reading within a frame image. In a frame image FM-IMG, the upper left indicates the origin (0, 0) of a pixel coordinate. In order to specify an area for the rectangular reference image RIMG, a coordinate (POSX, POSY) at the upper left of the rectangle and the size in length and width, i.e., SIZEY and SIZEX, are required. Therefore, the reference image reading controller 514 within the image processing section supplies the above information items (POSX, POSY), SIZEY and SIZEX specifying the area of the reference image RIMG, to the memory controller 82. Moreover, a direct memory access control signal DMA-CON is inputted/outputted between the reference image reading controller 514 and the memory controller 82.

On the other hand, the memory controller 82 computes addresses Add within the memory space (bank address, row address, column address) on the basis of the information items (POSX, POSY), SIZEY and SIZEX specifying the reference image area, and supplies the command CMD, addresses Add, multi-bank access information SA', start byte signal SB, write data Data and the like to the memory 86. Also, the memory controller 82 receives the read data Data read from the memory 86.

Figure 54:
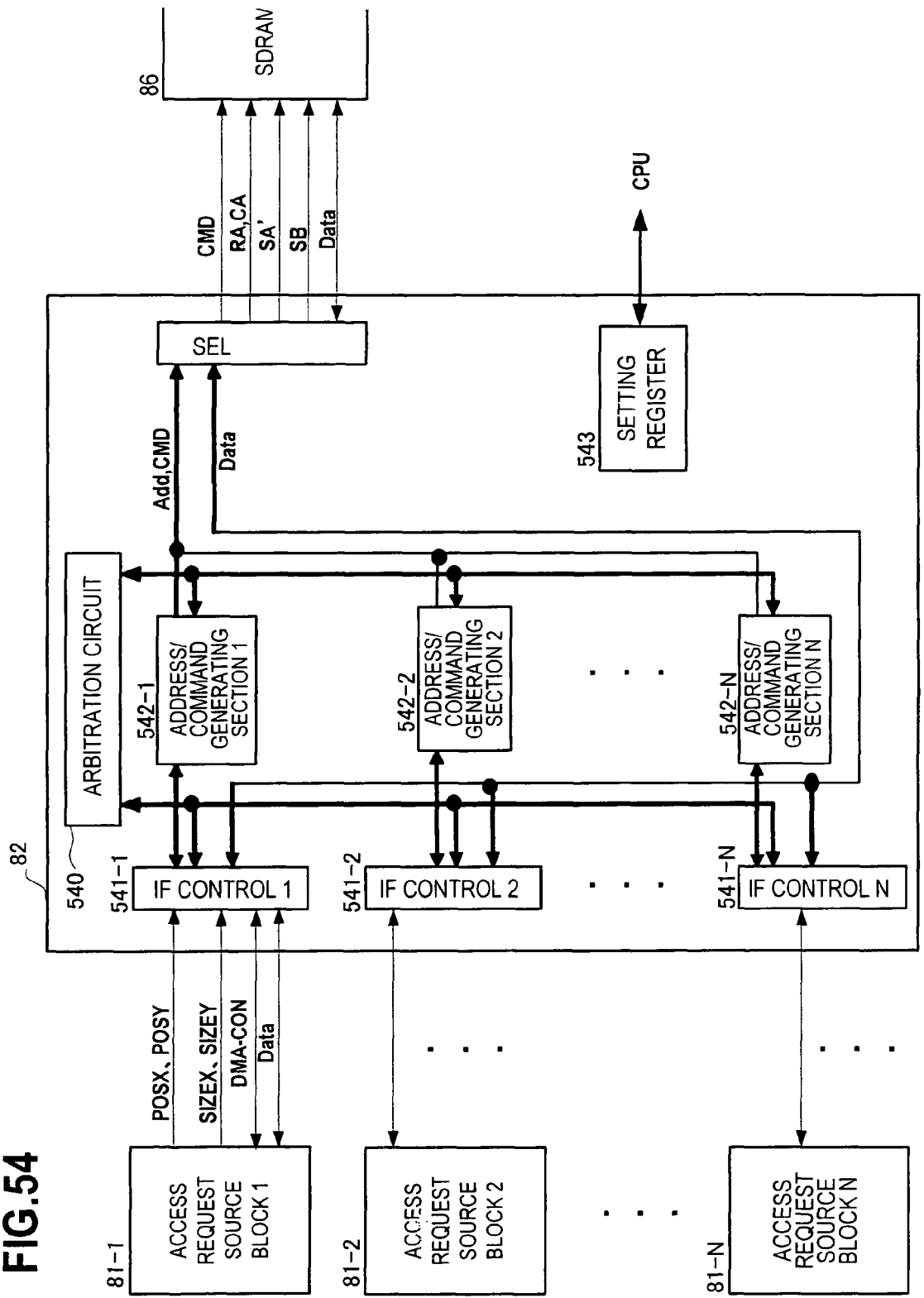
FIG. 54 is a detailed configuration diagram of the memory controller.

FIG. 54 is a detailed configuration diagram of the memory controller. The memory controller 82 has interface controllers 541-1 through N that receive the information items POSX, POSY, SIZEX and SIZEY for an image area to be accessed, and the write data Data from access request source blocks 81-1 through 81-N that requests an access to the memory as in the abovementioned image processing controller, and address/command generating sections 542-1 through N that receive the abovementioned reference image information items via these interface sections and generate addresses and commands. These interface controllers and the address/command generating sections should be activated or arbitrated by an arbitration circuit 540. The address/command generating sections 542 that are selected and activated by the arbitration circuit 540 issue the command CMD, addresses Add (bank address, row address, column address), multi-bank access information SA', start byte signal SB and the like to the memory 86 via a selector SEL. Accordingly, for the access request source blocks that are selected by the arbitration, the memory controller 82 controls an access made to the memory 86 and writes or reads the data. Also, the memory controller 82 makes a refresh request to the memory with required frequency.

The command CMD issued by the memory controller 82 includes, for example, the mode register set command, active command, read command, write command, precharge command, refresh command, and other commands required in normal SDRAM. Furthermore, in a setting register 543 within the memory controller 82, the address of an upper-left pixel of the frame image FM-IMG, the memory mapping information, and information on the functions provided in the memory 86 are set. The functions provided in the memory are the multi-bank access function, the function of switching around the arrangements of the data corresponding to the endians, and other functions. The presence of the functions provided in the memory, the target of control, is set in the setting register 543.

Figure 55:
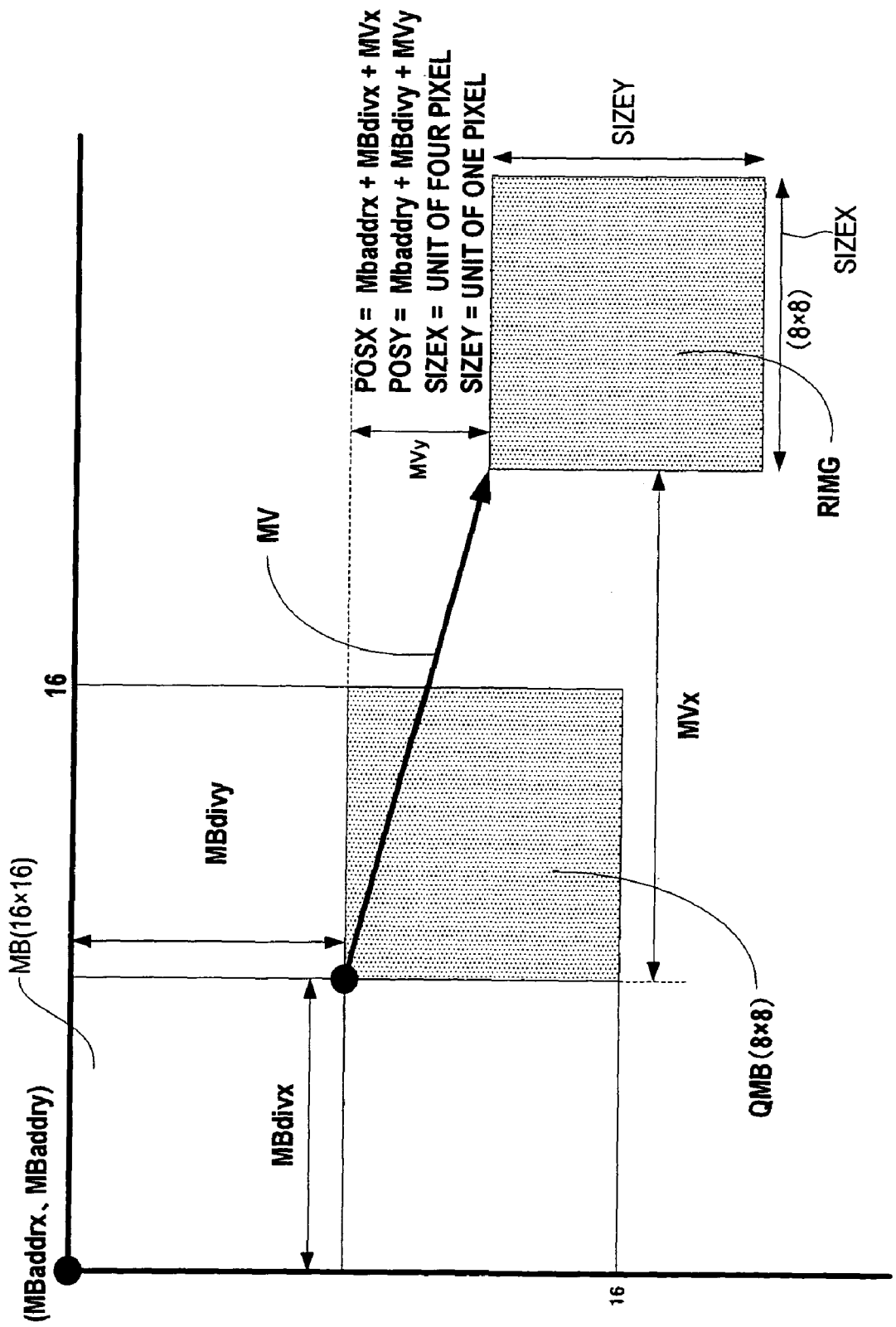
FIG. 55 is a figure for explaining computation performed by the inter prediction section 513 in the reference image reading controller 514.

FIG. 55 is a figure for explaining computation performed by the inter prediction section 513 in the reference image reading controller 514. In the case of an MPEG image, macro block MB is the unit for processing. The macro block MB is constituted by luminance data of 16×16 pixels, and a color difference (Cb, Cr) data of 8×8 pixels (Y:U:V=4:2:0). 1/4 macro block QMB, which includes luminance data of 8×8 pixels obtained by dividing the macro block MB into four, is the unit for processing the motion vector MV and the reference image RIMG. When an upper-left coordinate of the macro block MB, that is being processed currently, is (MBaddrx, MBaddry) macro block division information thereof is Mbdivx, Mbdivy and the motion vector is MV=(MVx, MVy), a computation processor 515 uses an computing equation shown in the figure to obtain the upper-left coordinate (POSX, POSY), width SIZEX, and height SIZEY of the reference image RIMG. This width SIZEX is set as a multiple number of the number of bytes inputted/outputted at one access to the memory, and the height SIZEY is set as the number of pixels in the vertical direction.

The reference image specifying information (POSX, POSY), SIZEY, and SIZEX that are computed in the manner described above are outputted from the reference image controller 514 to the memory controller 82, and, on the basis of the reference image specifying information, memory mapping information, and upper-left addresses in the frame area that are set in the setting register 543, the command/address generating sections 542 within the memory controller 82 generates an address of the memory space required in rectangular access.

Figure 56:
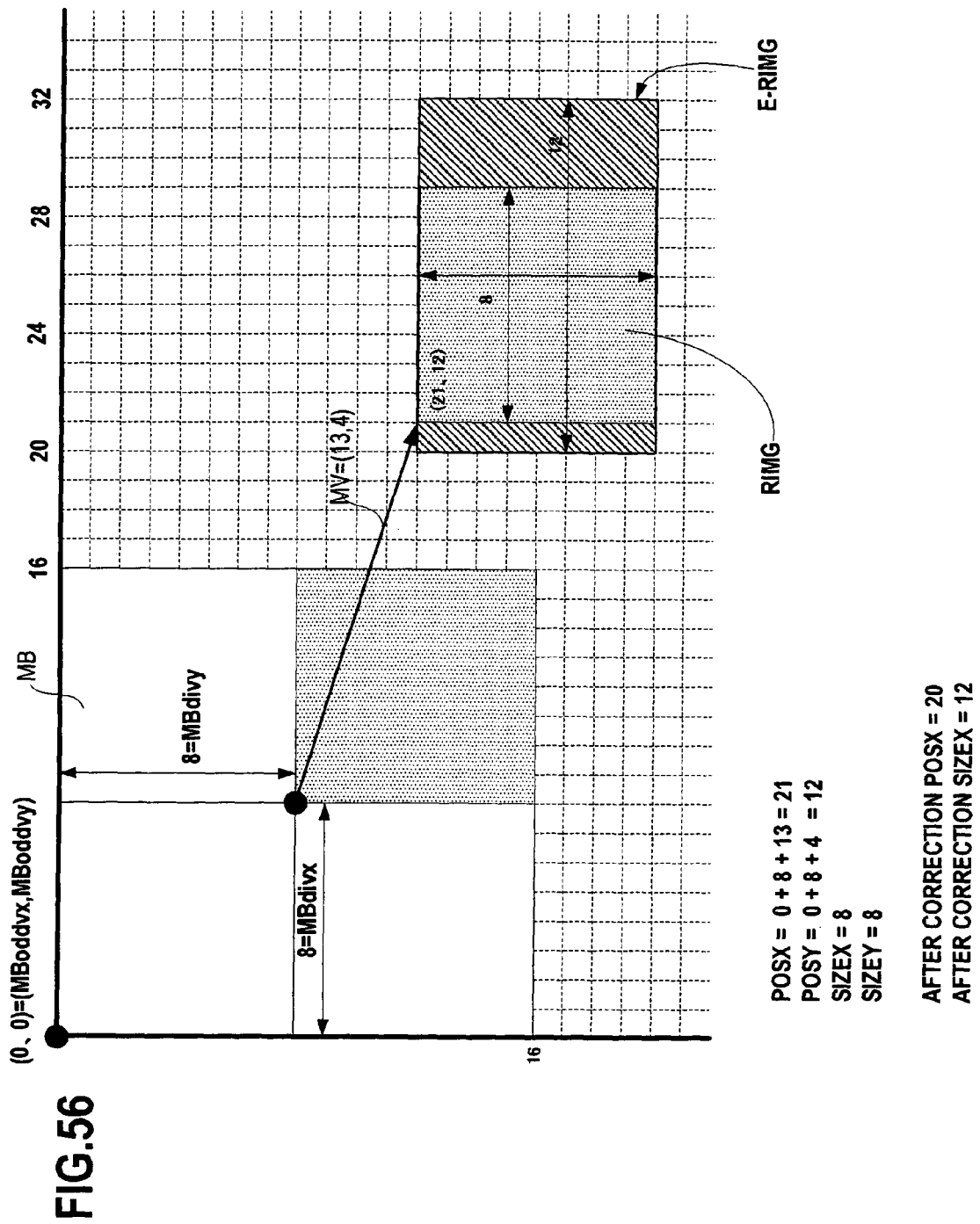
FIG. 56 is a figure showing an example of computation performed by the inter prediction section 513 in the reference image reading controller 514.

FIG. 56 shows an example of computation performed by the inter prediction section 513 in the reference image reading controller 514. This is a specific example of FIG. 55. First, the upper-left coordinate of the macro block MB is (MBaddrx, MBaddry)=(0 and 0), macro block division information is Mbdivx, Mbdivy=8, and motion vector MV=(MVx, Mvy)=(13 and 4), thus the upper-left coordinate of the reference image RIMG (POSX, POSY), width SIZEX, and height SIZEY are obtained in the following computation:

$POSX=0+8+13=21$ $POSY=0+8+4=12$

SIZEX=8, SIZEY=8

The rectangular area of the reference image RIMG does not conform to the unit of a 4-byte area selected by a column address. In order to conform the rectangular area to the unit of the 4-byte area, an access needs to be made to the area with the upper-left coordinate (20 and 12), width 12 and height 8, such as an enlarged area E-RIMG in FIG. 56. However, by using the byte boundary functions, an access with byte unit can be made across the boundary of the 4-byte unit. In this manner, when making an access to reference image data such as an MPEG image, the byte boundary functions contribute to improving the access efficiency.

Figure 57:
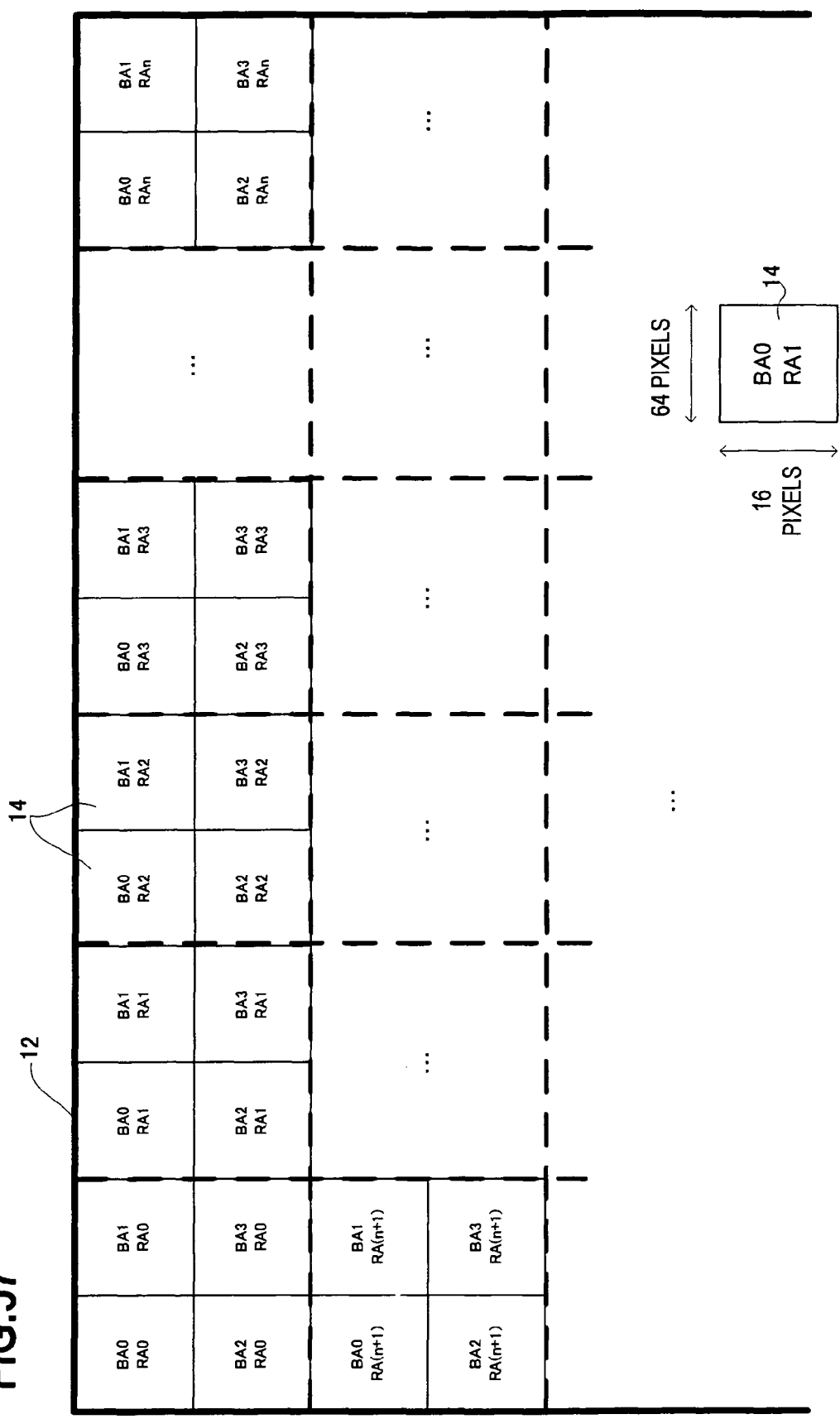
FIG. 57 is a figure showing an example of memory mapping.

FIG. 57 shows an example of memory mapping. As with the memory mapping 12 shown in FIG. 1, a pixel of the image and the page area 14 within the memory space are associated with each other as in the memory mapping 12, and adjacent page areas are disposed so as to have different bank addresses BA. The page area 14 is an area selected by a bank address BA and a row address RA, and each page area 14 is constituted by a plurality of memory unit areas (4-byte areas) selected by column addresses respectively. In the example shown in FIG. 57, each page area 14 is a unit for storing image data of 64 pixels×16 pixels.

Figure 58:
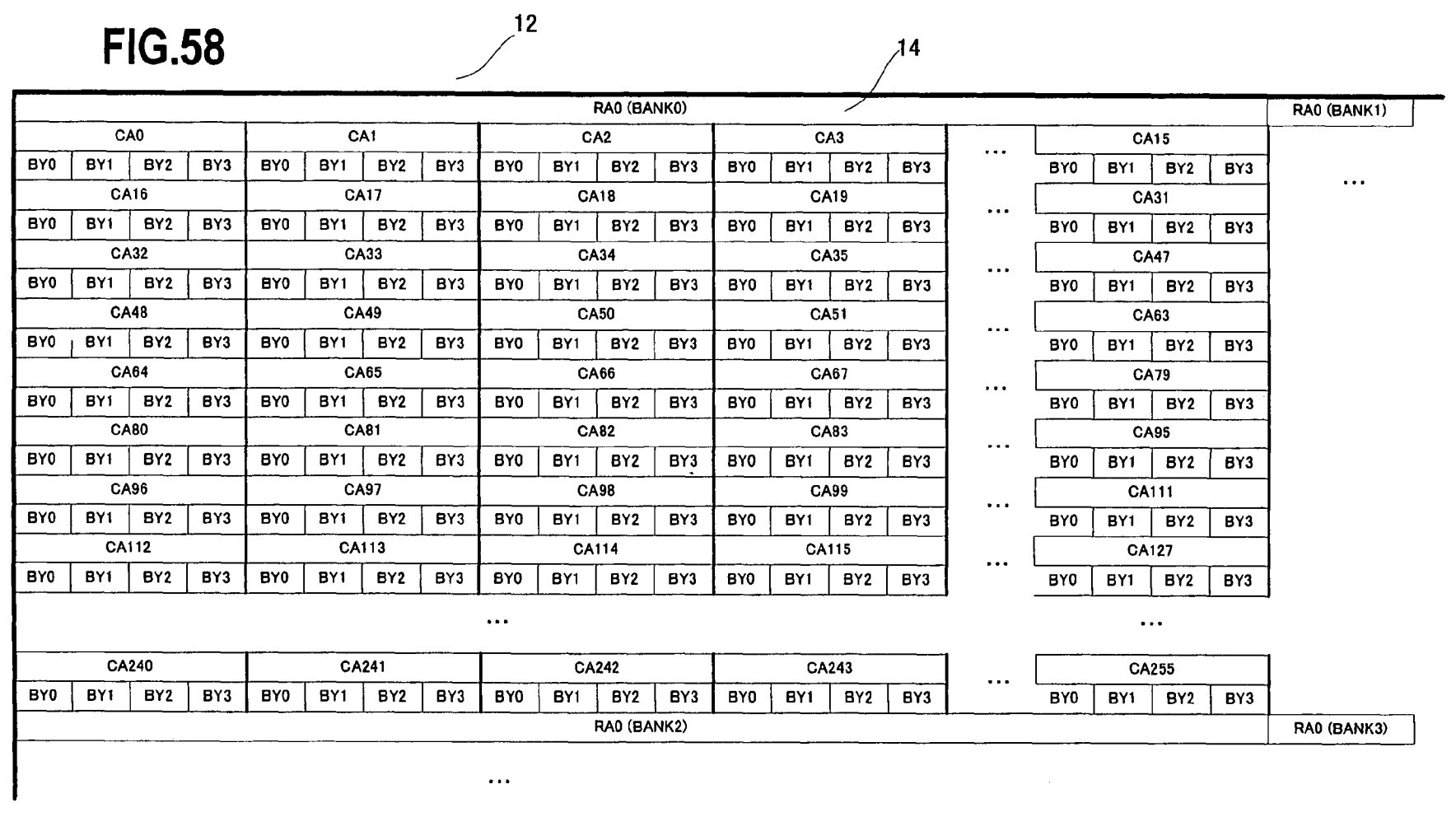

FIG. 58 shows the configuration of the page area 14 in the memory mapping 12. The page area 14 that is specified by a row address RA 0 within a bank BANK0 has memory unit areas indicated by column addresses CA 0 through 255. 4 bytes are selected by each column address, and a wrap width (step width) of each column address CA is 16. Therefore, the page area 14 has a width of 64 (=4×16) bytes and a height of 16 (=256/16) bytes.

Figure 59:
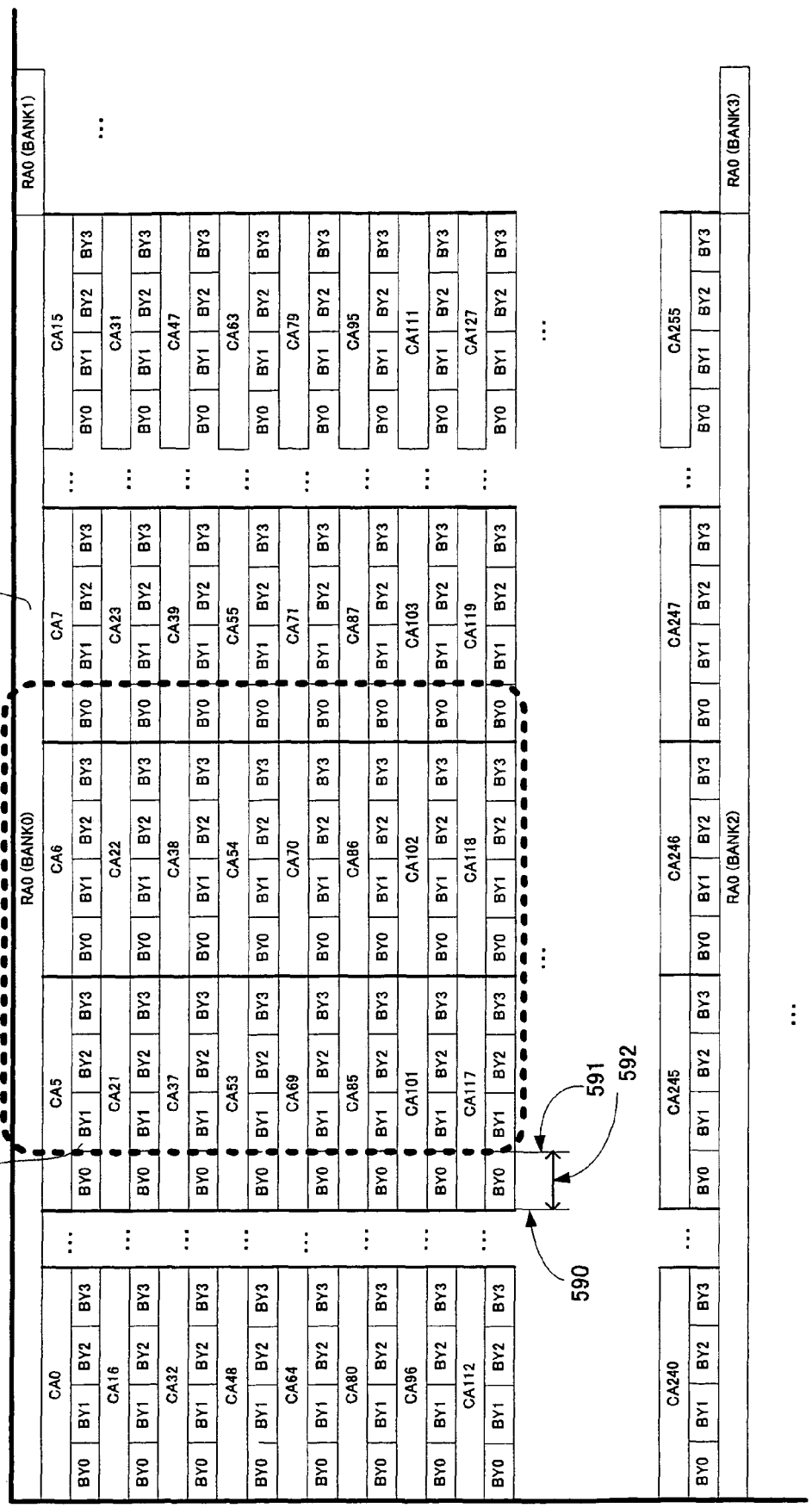
FIG. 59 is a figure showing an arrangement of the reference image areas on the memory map, the reference image areas being shown in FIG. 56.

FIG. 59 shows an arrangement of the reference image area being shown in FIG. 56 on the memory map. As shown in FIG. 59, the reference image area RIMG has the upper-left coordinate (21 and 12), a width of 8 and a height of 8, and thus corresponds to a memory area with a width of 8 bytes and a height of 8 bytes, the memory area being formed starting from a byte BY 1 in a leading address of a column address CA 5. Specifically, a left end 591 in a rectangular access area is shifted by 1 byte (592 in the figure) from a boundary 590 obtained from a column address CA. Therefore, a bank address BA 0 and a row address RA 0 is issued along with the active command ACT to the memory having the above-described byte boundary functions, and the starting column address CA 5, CA 6 through 117, and CA 118 and the start byte signal SB=1 is continuously issued along with the read command RD (or write command WR). Also, for the memory having the automatic internal column address generating functions shown in FIGS. 42 through 44, the column address wrap width CAWrap=16 is set, and the starting column address CA 5, start byte signal SB=1, rectangular width Rwidth=2, and burst length BL=16 are issued along with the read command RD (or write command WR).

Figure 60:
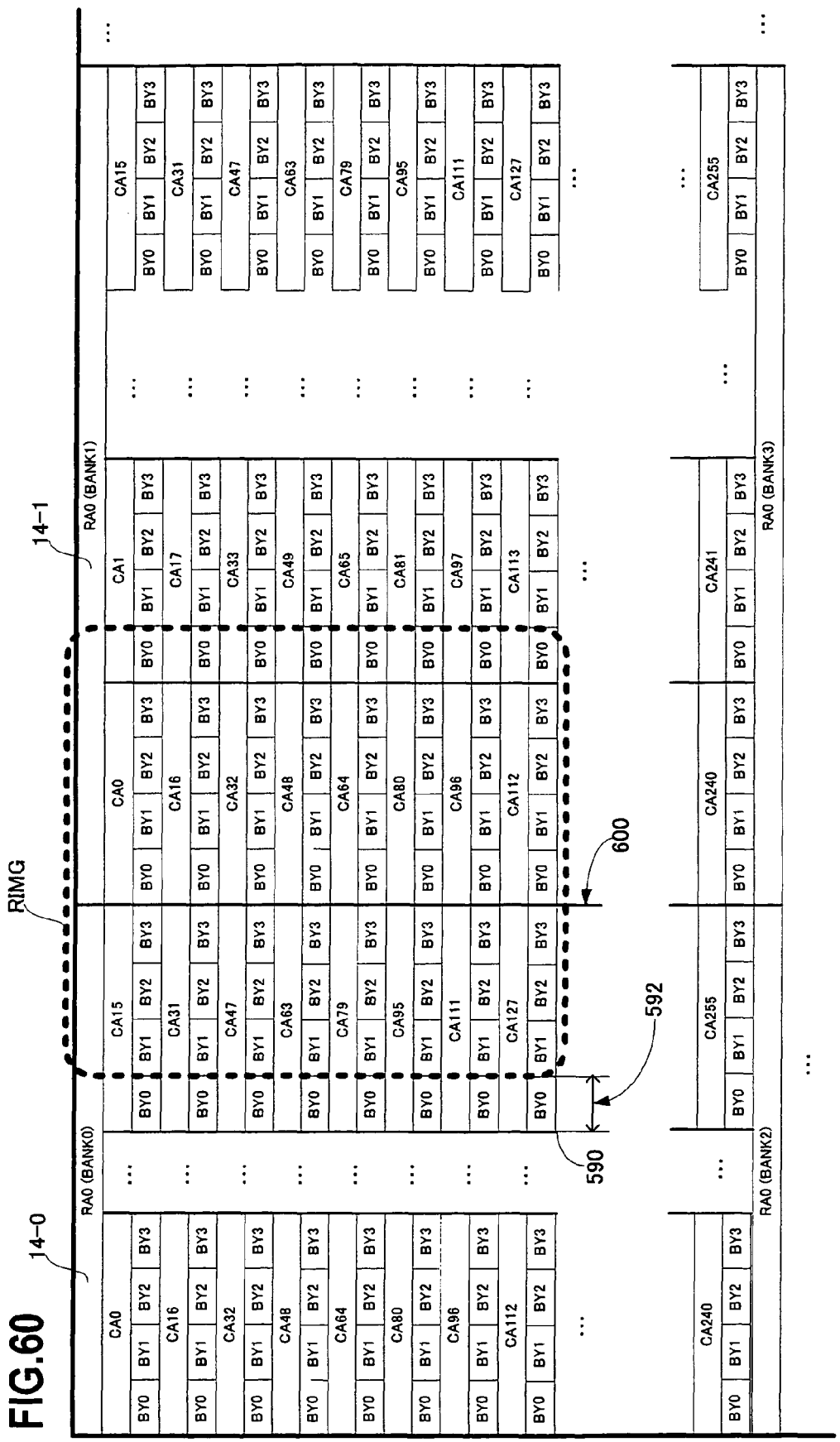
FIG. 60 is a figure showing an example of another arrangement of the reference image areas on the memory map.

FIG. 60 shows an example of another arrangement of the reference image areas on the memory map. In this figure, the reference image area RIMG extends across adjacent page areas 14-0 and 14-1. Specifically, the reference image area RIMG exceeds a boundary 600 of the page area. In this case, if the memory has the multi-bank access function described in FIG. 7, by issuing the multi-bank access information SA', an access can be made using the active command once. In the case where the memory does not have the multi-bank access function, the active command needs to be issued a number of times to the banks BANK 0 and 1 to make an access. Therefore, the memory controller previously needs to set, in the register, whether the image memory to be controlled has the multi-bank access function or not, and then the access control to the image memory needs to be changed in response to this set information.

Figure 61:
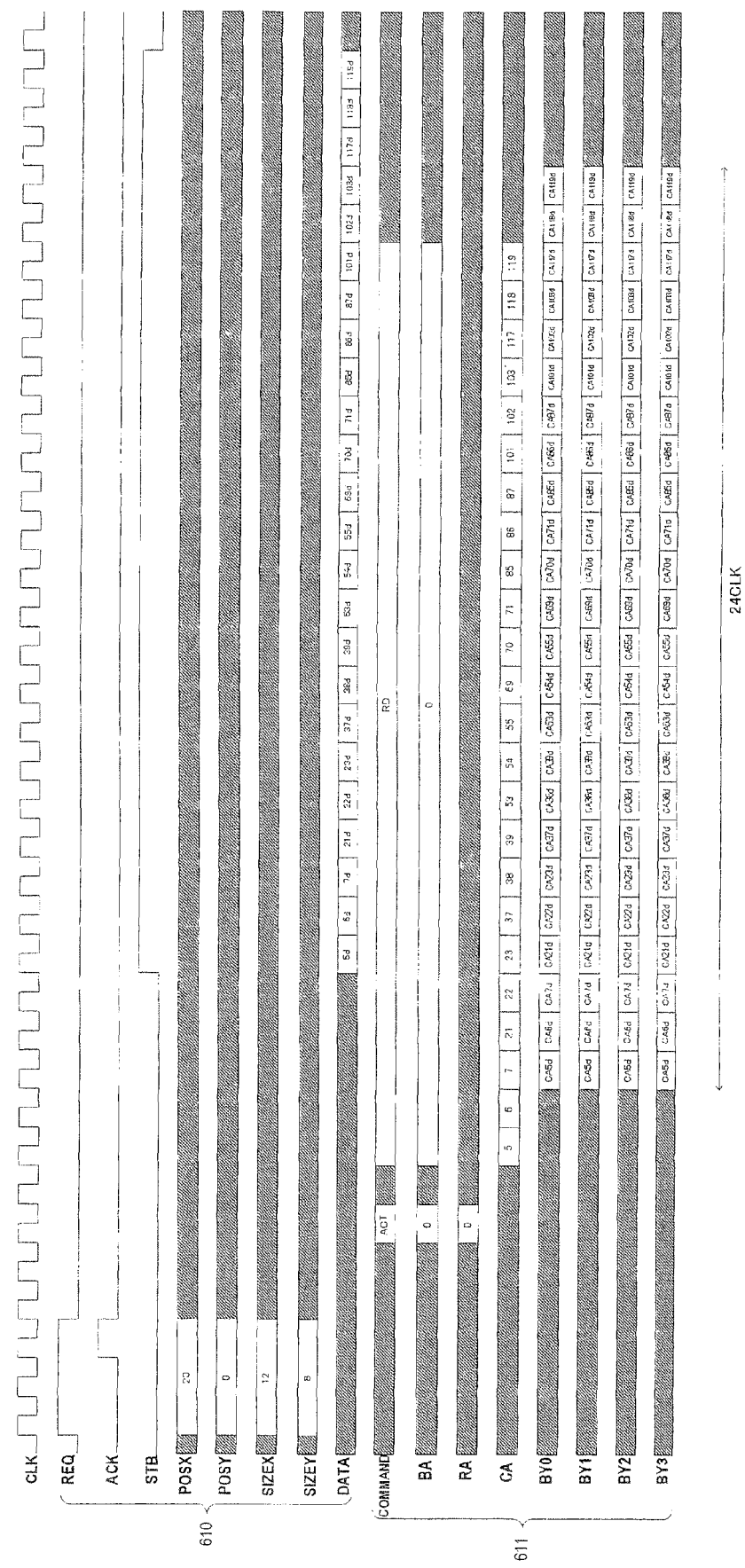
FIG. 61 is a timing chart of the memory controller with respect to the memory without the byte boundary functions.

FIG. 61 is a timing chart of the memory controller with respect to the memory without the byte boundary functions. This is an example of access to the reference image RIMG shown in FIG. 59. A conventional SDRAM is not provided with the byte boundary functions. In this case, the memory controller has to perform control shown in FIG. 61.

In FIG. 61, there are shown signals 610 exchanged between the reference image reading controller and the memory controller, and signals 611 exchanged between the memory controller and the image memory. As described above, the reference image reading controller 514 sends to the memory controller the information on the upper-left coordinate POSX, POSY, width SIZEX and height SIZEY along with an access request REQ to the memory, and the memory controller then returns an acknowledge signal ACK in response to the sent information. It is assumed that the memory mapping information and the address of the upper-left origin of the frame image are set in the setting register beforehand.

In response to this access request REQ, the memory controller issues an active command ACT, bank address BA=0, and row address RA=0 to the image memory, and causes the memory to perform active operation. Thereafter, the memory controller issues an read command RD, bank address BA=0, and column address CA=5, 6, 7 through 117, 118, 119 (24 times) in synchronization with a clock CLK, and receives 4-byte data twenty-four times. Then, the memory controller changes the level of a strobe signal STB to H level, and sends the received data to the reading controller.

Figure 62:
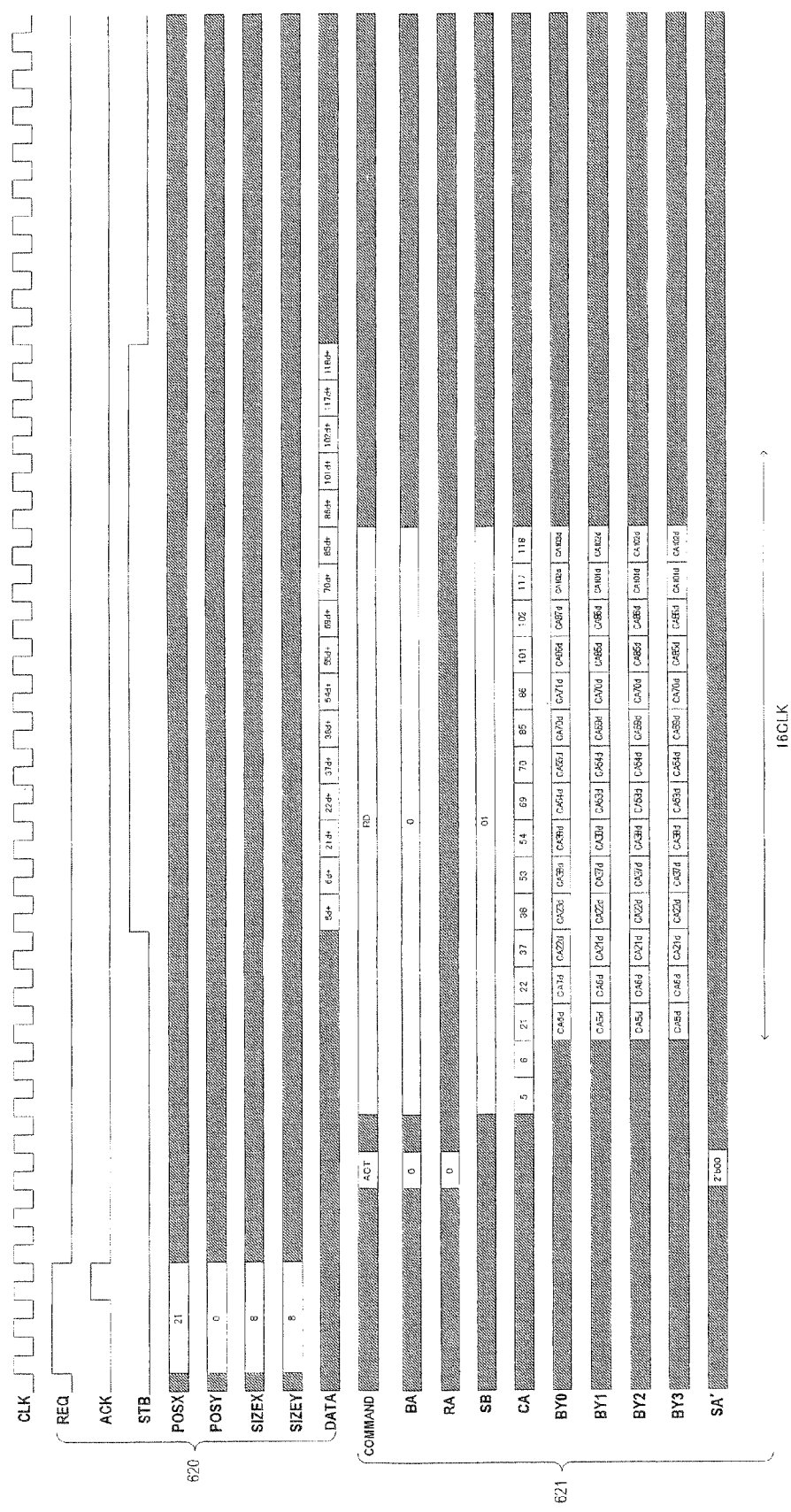
FIG. 62 is a timing chart of the memory controller with respect to the memory having the byte boundary functions.

FIG. 62 is a timing chart of the memory controller with respect to the memory having the byte boundary functions. This figure shows an example of access to the reference image RIMG shown in FIG. 59, and is a control performed when the memory has the byte boundary functions. In the figure, there are shown signals 620 exchanged between the reference image reading controller and the memory controller, and signals 621 exchanged between the memory controller and the image memory.

In this case, the same signal as the one shown in FIG. 61 is sent from the reference image reading controller to the memory controller. The memory controller issues an active command ACT, bank address BA=0, and row address RA=0 to the image memory, and causes the memory to perform active operation. Thereafter, the memory controller issues an read command RD, bank address BA=0, column address CA=5, 6 through 117, 118 (16 times), and start byte signal SB=01, and receives 4-byte data sixteen times. Furthermore, the memory controller changes the level of a strobe signal STB to H level, and sends the received 64-byte data to the reading controller. Since the memory has the byte boundary functions, the read command may be issued only sixteen times, improving the access efficiency.

Also, although not shown, in the memory having the automatic internal column address generating function shown in FIGS. 42 through 44, the column address wrap width CAWrap=16 may be set beforehand, and the starting column address CA 5, start byte signal SB=01, rectangular width Rwidth=2, and burst length BL=16 may be issued along with a read command RD. In response to this issuance, the image memory internally generates column address automatically, and outputs 4-byte data of the rectangular area in 16 cycles. The memory controller receives the 4-byte data sixteen times continuously.

Figure 63:
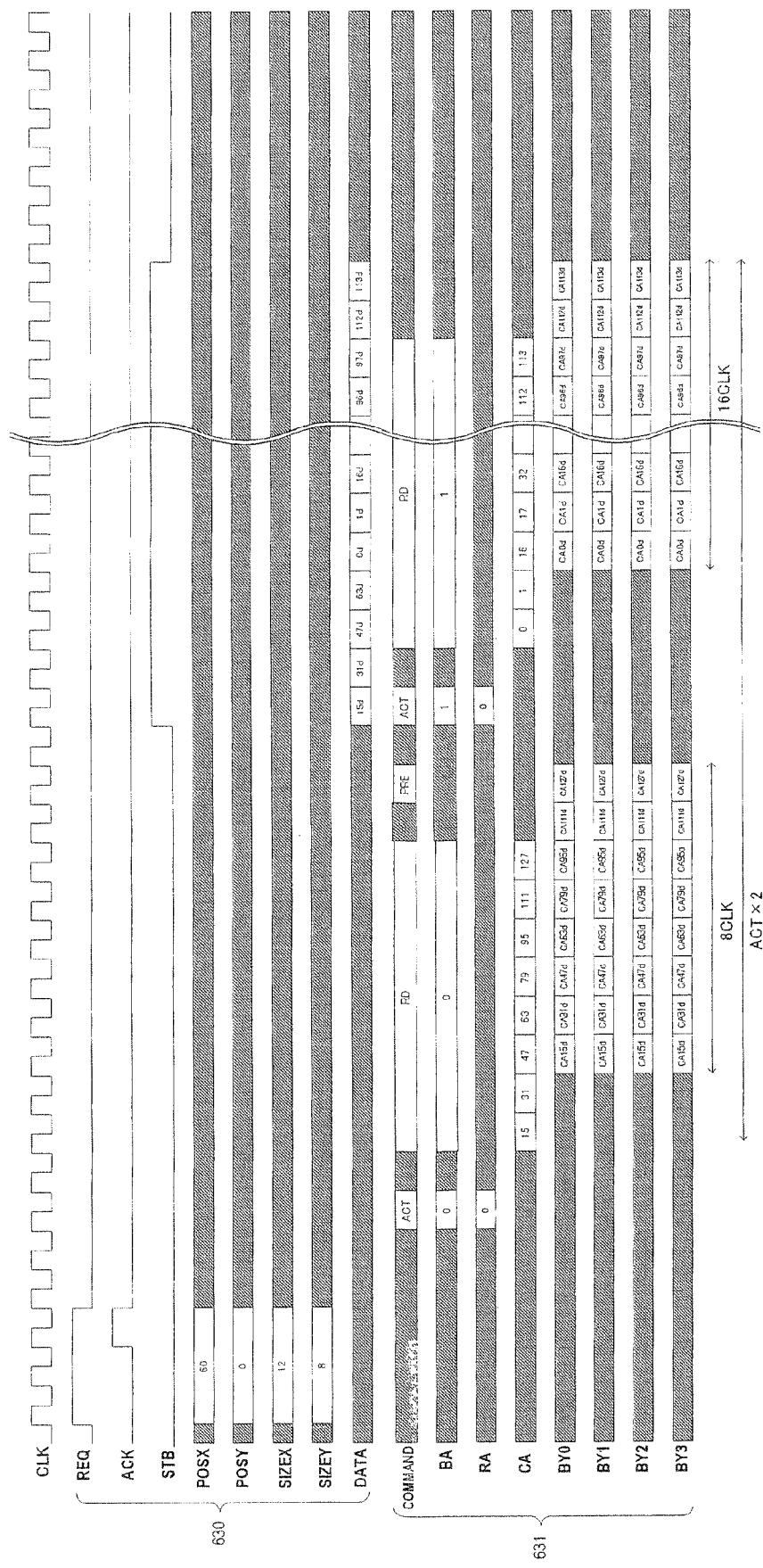
FIG. 63 is a timing chart of the memory controller with respect to the memory without the byte boundary functions and the multi-bank access function.

FIG. 63 is a timing chart of the memory controller with respect to the memory without the byte boundary functions and the multi-bank access function. This example is an example in which the reference image RIMG shown in FIG. 60 is accessed, and shows a control performed on the image memory that does not have the multi-bank access function. In the figure, there are shown signals 630 exchanged between the reference image reading controller and the memory controller, and signals 631 exchanged between the memory controller and the image memory.

As shown in FIG. 45, the memory without the multi-bank function cannot access an area across a bank boundary. In this case, therefore, the memory controller issues an active command ACT, BA=0 and RA=0, to have the page area 14-0 perform active operation, further issues a read command RD, bank address BA=0, and column addresses CA=15 through 127, and receives 8 bytes of data. Moreover, the memory controller issues an active command ACT, BA=1, and RA=0, to have the page area 14-1 perform active operation, further issues a read command RD, bank address BA=1, and column addresses CA=0, 1 through 112 and 113, and receives 16 bytes of data. The memory controller then sends the receive 24-byte data to the reference image reading controller.

Figure 64:
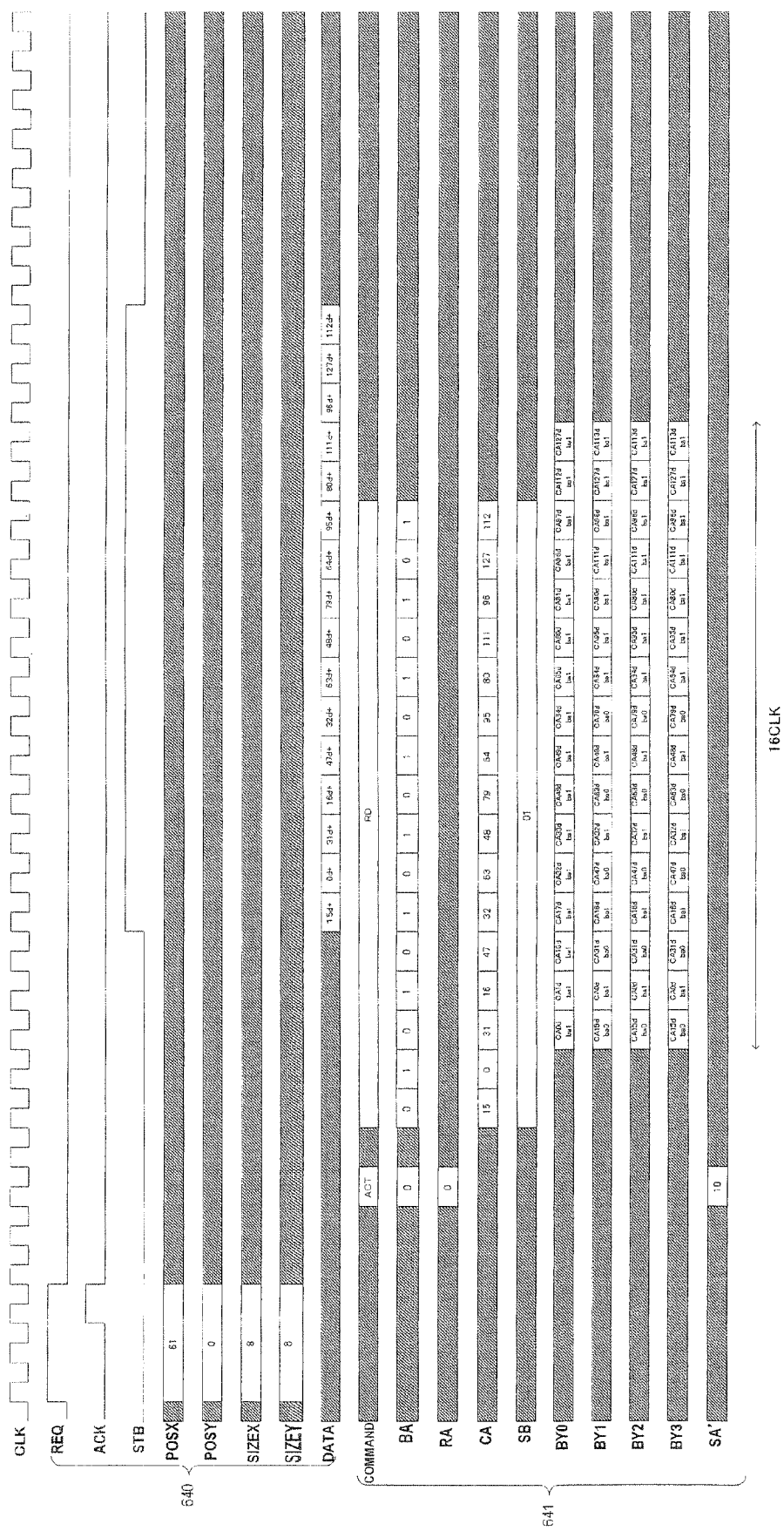
FIG. 64 is a timing chart of the memory controller with respect to the memory having the multi-bank access function and the byte boundary functions.

FIG. 64 is a timing chart of the memory controller with respect to the memory having the multi-bank access function and the byte boundary functions. This figure is also an example in which the reference image RIMG shown in FIG. 60 is accessed. In the figure, there are shown signals 640 exchanged between the reference image reading controller and the memory controller, and signals 641 exchanged between the memory controller and the image memory.

The memory controller issues a bank address BA=0, row address RA=0, and multi-bank access information SA'=10 (showing an access to two adjacent banks in a lateral direction) along with an active command ACT. In response to this issuance, the image memory performs active operation on the bank BA=0. The memory controller then issues start byte signal SB=01, bank address BA, and column address CA sequentially along with a read command RD. In response to this column address CA=15, the image memory performs active operation on the bank of BA=1. The memory controller receives 16 bytes of data in response to the read command RD issued 16 times. Moreover, the memory controller sends the received 16-byte data to the reference image reading controller.

In this manner, the memory controller may issue the active command once to the memory having the multi-bank access function, even in the case of data across a different bank boundary.

Figure 65:
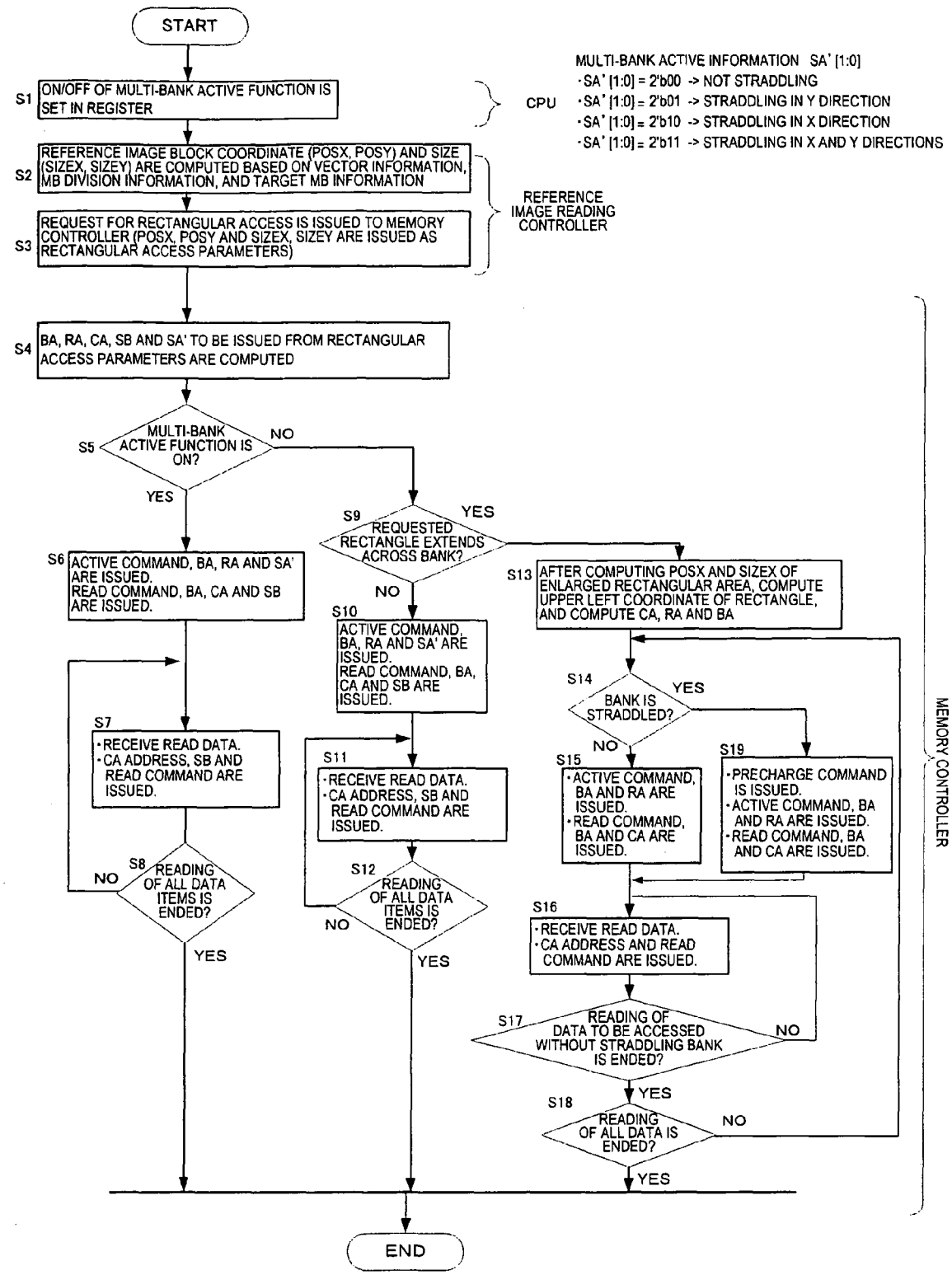
FIG. 65 is a flowchart of the control operation of the memory controller.

FIG. 65 is a flowchart of the control operation of the memory controller. First, a host CPU sets ON/OFF of the multi-bank active function in the setting register within the memory controller (S1). The reference image reading controller computes the coordinate of a reference image block (POSX, POSY) and the size (SIZEX, SIZEY) on the basis of the motion vector information, macro block division information, and target macro block information (S2), and issues a rectangular access request to the memory controller along with the rectangular access parameters for the rectangular access (S3).

The memory controller computes BA, RA, CA, SB and SA' to be issued when making the rectangular access, on the basis of these rectangular parameters (POSX, POSY) (SIZEX, SIZEY), and the memory map information and information on the frame image address that are set in the setting register (S4). When the multi-bank active function is ON (YES in S5), the memory controller receives read data while issuing the BA, RA, and SA' along with an active command ACT and further issuing the BA, CA, and SB along with a read command RD (S6, S7 and S8). In the case of the write operation, the memory controller outputs write data while sequentially issuing the BA, CA and SB along with a write command WR instead of a read command.

Moreover, when the multi-bank active function is OFF (NO in S5), the memory controller checks whether or not the requested rectangle extends across the page area, i.e., bank (S9). If the rectangle does not extend across the bank (NO in S9), the memory controller receive the read data while issuing BA and RA along with the active command ACT and further issuing BA, CA and SB along with the read command RD sequentially (10, 11 and 12). In the case of the write operation, the memory controller outputs write data while sequentially issuing the BA, CA and SB along with a write command WR instead of a read command.

Furthermore, if the rectangle extends across the bank (YES in S9), the byte boundary functions cannot be used, hence the memory controller computes the coordinate POSX and the width SIZEX of the enlarged rectangular area E-RIMG shown in FIG. 56, and computes addresses BA, RA and CA of the upper-left coordinate corresponding to the computed coordinate and width (S13). Then, the memory controller receives the read data while issuing BA and RA along with the active command ACT and further issuing BA and CA along with the read command RD to the enlarged rectangular area (S15, 16 and 17). Then, once reading of the upper-left coordinate within the bank is completed (YES in S17 and YES in S14), a precharge command is generated once. Thereafter an active command is generated to the next bank, and the read data is received while issuing BA and CA along with the read command RD sequentially (S19, S16 and 17). Once all data items within the bank are received (YES in S17) and reading of all data items is finished (S18), the memory control is ended.

It should be noted that when the byte boundary functions are set to OFF in the setting register of the memory controller, the memory controller issues the active command, read command, and required addresses by performing the configurations S13 through S18 of FIG. 65, as in FIG. 61.

In this manner, the memory controller can set ON and OFF of the byte boundary functions and ON and OFF of the multi-bank active functions into the built-in setting register, and appropriately issues required commands and addresses, as well as the multi-bank information, start byte information, and byte combination information such as the up mode, down mode and alternative, in accordance with the functions of the image memory to be controlled.

Figure 66:
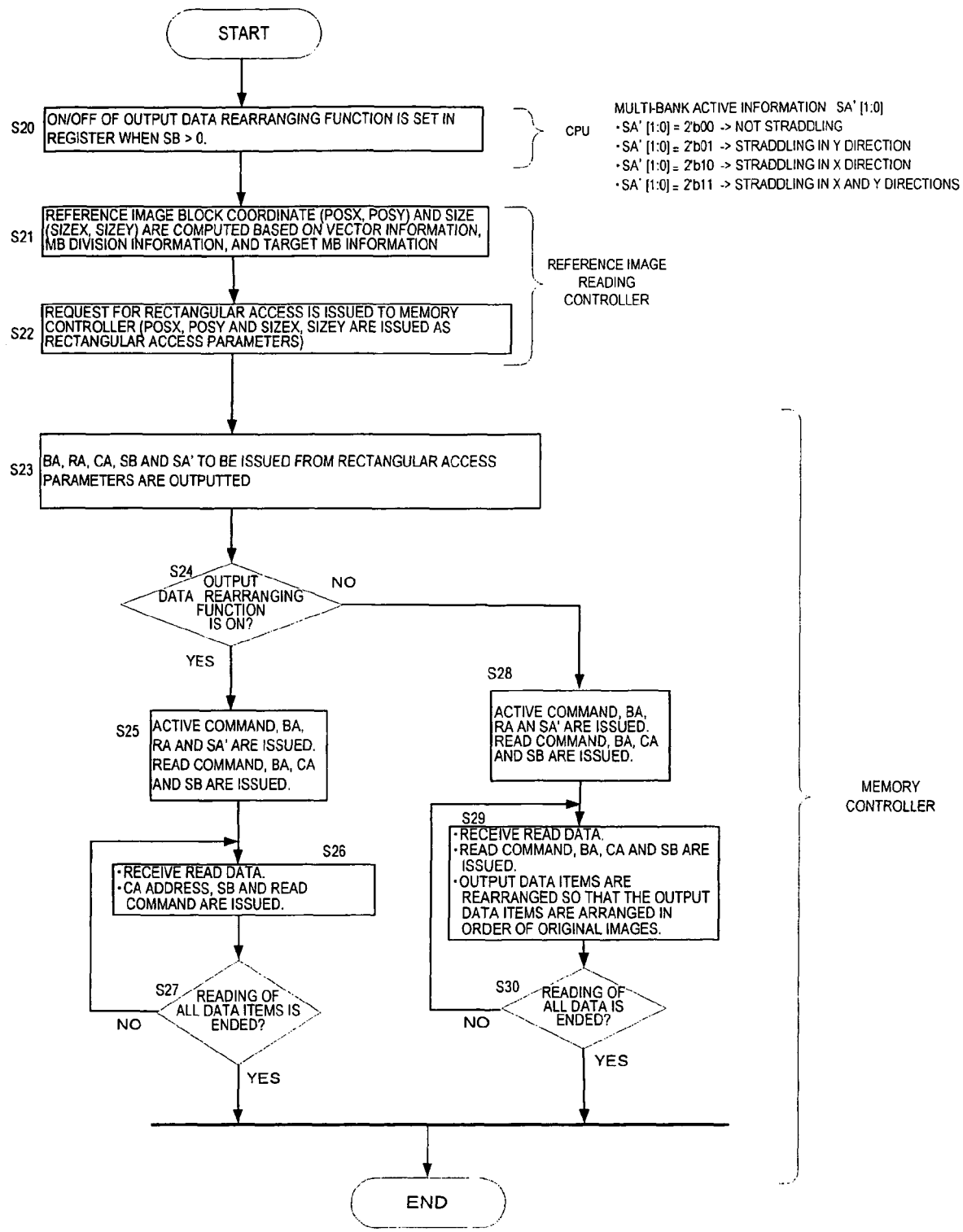
FIG. 66 is a flowchart of the control operation of the memory controller.

FIG. 66 is a flowchart of the control operation of the memory controller. In this example, the memory controller can set whether or not the image memory to be controlled has a function of switching the input/output data in accordance with the endians shown in FIGS. 35 and 36. First, into the setting register of the memory controller, the host CPU sets the presence of an output data rearranging function within the image memory (S20). The reference image reading controller then computes the coordinate of the reference image block (POSX and POSY) and the size (SIZEX and SIZEY) on the basis of the motion vector information, macro block division information, and target macro block information (S21), and issues a rectangular access request to the memory controller along with the rectangular access parameters for the rectangular access (S22).

Next, the memory controller computes BA, RA, CA, SB and SA' to be issued when making the rectangular access, on the basis of these rectangular parameters (POSX and POSY) (SIZEX and SIZEY), and the memory map information and information on the frame image address that are set in the setting register (S23). Then, when the output data rearranging function is set to ON (YES in S24), the memory controller issues the bank address BA, row address RA and multi-bank information SA' along with the active command, and further issues the bank address BA, column address CA, and start byte information SB along with the read command (S25). Thereafter, the memory controller repeatedly issues the read command, BA, CA, and SB until reading of all data items is finished (S26 and S27).

On the other hand, when the output data rearranging function is set to OFF (NO in S24), the memory controller issues the bank address BA, row address RA, and multi-bank information SA' along with the active command, and further issues the bank address BA, column address CA, and start byte information SB along with the read command (S25). Thereafter, the memory controller repeatedly issues the read command, BA, CA, and SB until reading of all data items is finished, and rearranges the data items so that the received data items are arranged in order of the original image data items (S28, S29 and S30).

FIGS. 65 and 66 described above can be combined appropriately in accordance with the set items in the setting register.

It should be noted that the present embodiment explains an example of the image memory that stores digital image data in which image data items of a plurality of pixels are arranged two-dimensionally. However, the present invention can be applied to not only the image memory for storing image data, but also a memory device that stores two-dimensionally arranged data, other than image data, on the basis of a predetermined mapping rule. When the stored data items are arranged two-dimensionally, in the case where an arbitrary rectangular area within the two-dimensionally arranged data is accessed, sometimes the data extending across a plurality of memory unit areas needs to be accessed. In this case as well, the present invention can be applied.

The following additional notes summarize the embodiments described above.

What is claimed is:

1. A semiconductor integrated circuit in which circuits are integrated on a single semiconductor substrate, the semiconductor integrated circuit comprising:
a memory array in which memory cells connected to word lines and bit lines and storing data are arranged in the form of a matrix, and the memory array being sectioned into a plurality of bit groups, each of the plurality of bit groups having Nb number of memory cells, and each of the bit group storing Nb bits;
a controller that selects a plurality of bit groups on the basis of an address signal including a row address signal and a column address signal, and further selects a bit group as a starting point among the selected plurality of bit groups, on the basis of a first combination information indicating a start position in the selected plurality of bit groups; and
Nb×N number of output terminals,
wherein the controller outputting, from the Nb×N number of output terminals in parallel, on the basis of a second combination information, data items that are stored in the memory cells contained in N number of bit groups including the bit group at the starting point.

2. The semiconductor integrated circuit according to claim 1, wherein the memory array has a first memory unit area that is selected by a first address signal and a second memory unit area that is selected by a second address signal,
the first memory unit area and the second memory unit area each have the N number of bit groups, and the Nb×N number of data outputted from the output terminals have data that are outputted from the first memory unit area and data that are outputted from the second memory unit area.

3. The semiconductor integrated circuit according to claim 2, wherein the first address signal and the second address signal correspond to a first column address signal and a second column address signal respectively.

4. The semiconductor storage device according to claim 1, wherein the second combination information includes information relating to continuous bit number being accessed simultaneously with the bit group at the starting point.

* * * * *